(12) United States Patent
Choi et al.

(10) Patent No.: US 11,315,499 B1
(45) Date of Patent: Apr. 26, 2022

(54) DISPLAY DEVICE

(71) Applicant: Samsung Display Co., Ltd., Yongin-Si (KR)

(72) Inventors: Jonghyun Choi, Seoul (KR); Hoongi Lee, Suwon-si (KR)

(73) Assignee: Samsung Display Co., Ltd.

( * ) Notice: Subject to any disclaimer, the term of this patent is extended or adjusted under 35 U.S.C. 154(b) by 0 days.

(21) Appl. No.: 17/316,992

(22) Filed: May 11, 2021

(30) Foreign Application Priority Data

Oct. 19, 2020 (KR) ........................ 10-2020-0135464

(51) Int. Cl.
*G09G 3/3291* (2016.01)
*G09G 3/3258* (2016.01)
*H01L 27/32* (2006.01)

(52) U.S. Cl.
CPC ......... *G09G 3/3291* (2013.01); *G09G 3/3258* (2013.01); *H01L 27/3276* (2013.01); *G09G 2300/0426* (2013.01)

(58) Field of Classification Search
CPC .............. G09G 3/3291; G09G 3/3258; G09G 2300/0426; H01L 27/3276
See application file for complete search history.

(56) References Cited

U.S. PATENT DOCUMENTS

2019/0278145 A1   9/2019   Tanaka et al.

*Primary Examiner* — Sardis F Azongha
(74) *Attorney, Agent, or Firm* — Innovation Counsel LLP

(57) ABSTRACT

A display device comprises a first pattern disposed on a substrate and receiving a driving voltage, a second pattern disposed on the first pattern and receiving the driving voltage, an intermediate pattern disposed on the first pattern and receiving the driving voltage, a first source pattern disposed on the intermediate pattern and contacting the first pattern, the second pattern, and the intermediate pattern, a second source pattern disposed in the same layer as the first source pattern and contacting the intermediate pattern, and a third source pattern disposed on the second source pattern and contacting the second source pattern.

20 Claims, 42 Drawing Sheets

DISPLAY DEVICE

CROSS-REFERENCE TO RELATED APPLICATION

This application claims priority from and the benefit of Korean Patent Application No. 10-2020-0135464, filed on Oct. 19, 2020, which is hereby incorporated by reference for all purposes as if fully set forth herein.

BACKGROUND

Field

The present disclosure generally relates to a display device. More particularly, relates to a display device including a structure of a pixel circuit part capable of securing a degree of freedom in designing the conductive patterns.

Discussion of the Background

The display device includes a plurality of pixels, and each of the pixels includes a pixel circuit part and a display element electrically connected to the pixel circuit part. The pixel circuit part has a structure in which a plurality of conductive patterns are vertically stacked, and the conductive patterns are connected to each other through contact holes. In recent years, in order to improve the display quality of the display device, the conductive patterns included in the pixel circuit part have been densely formed. Accordingly, it is impossible to freely design the shapes of the conductive patterns. Therefore, a structure of a pixel circuit part capable of securing a degree of freedom in designing the conductive patterns should be developed.

The above information disclosed in this Background section is only for understanding of the background of the present disclosure, and, therefore, it may contain information that does not constitute prior art.

SUMMARY

Some example embodiments provide a display device.

Additional features of the present disclosure will be set forth in the description which follows, and in part will be apparent from the description, or may be learned by practice of the present disclosure.

A display device according to an embodiment may include a first pattern disposed on a substrate and configured to receive a driving voltage, a second pattern disposed on the first pattern and configured to receive the driving voltage, an intermediate pattern disposed on the first pattern and configured to receive the driving voltage, a first source pattern disposed on the intermediate pattern and in direct contact with the first pattern, the second pattern, and the intermediate pattern, a second source pattern disposed in a same layer as the first source pattern and in direct contact with the intermediate pattern, and a third source pattern disposed on the second source pattern and in direct contact with the second source pattern.

According to an embodiment, the display device may further include an insulating layer disposed between the second source pattern and the third source pattern and formed of an organic insulating material.

According to an embodiment, each of the first source pattern and the second source pattern may be arranged in an island shape.

According to an embodiment, the intermediate pattern may be arranged in an island shape.

According to an embodiment, the display device may further include a second active pattern disposed on the second pattern and including an oxide semiconductor, the first pattern may be a first active pattern including a silicon semiconductor, and the intermediate pattern may be disposed between the second active pattern and the first source pattern.

According to an embodiment, the third source pattern may contact the second source pattern through a first contact hole, the second source pattern may contact the intermediate pattern through a second contact hole, the first source pattern may contact the intermediate pattern through a third contact hole, contacts the second pattern through a fourth contact hole, and contacts the first pattern through a fifth contact hole, and the third, fourth, and fifth contact holes may be spaced apart from each other.

According to an embodiment, each of plane areas of the second, third, fourth and fifth contact holes may be smaller than a plane area of the first contact hole.

According to an embodiment, the display device may further include a gate electrode disposed between the first pattern and the second pattern and arranged in an island shape and a node pattern disposed in a same layer as the second source pattern and in direct contact with the gate electrode and the second active pattern. The intermediate pattern may be disposed to surround at least a portion of the node pattern on a plane.

According to an embodiment, the display device may further include a first gate line disposed between the first pattern and the intermediate pattern and a second active pattern disposed on the intermediate pattern and including an oxide semiconductor. The first pattern may be a first active pattern including a silicon semiconductor, and the second pattern may be disposed on the second active pattern.

According to an embodiment, the third source pattern may contact the second source pattern through a first contact hole, the second source pattern may contact the intermediate pattern through a second contact hole, the first source pattern may contact the second pattern through a third contact hole, may contact the intermediate pattern through a fourth contact hole, and may contact the first pattern through a fifth contact hole, and the third, fourth, and fifth contact holes may be spaced apart from each other.

According to an embodiment, each of plane areas of the second, third, fourth, and fifth contact holes may be smaller than a plane area of the first contact hole.

According to an embodiment, the display device may further include a gate electrode disposed in a same layer as the first gate line and arranged in an island shape and a node pattern disposed in a same layer as the second source pattern and in direct contact with the gate electrode and the second active pattern. The second pattern may be disposed to be adjacent to the node pattern.

According to an embodiment, the display device may further include a first gate line disposed between the first pattern and the intermediate pattern and a second active pattern disposed on the intermediate pattern and including an oxide semiconductor. The first pattern may be a first active pattern including a silicon semiconductor, and the second pattern may be disposed in a same layer as the second active pattern.

According to an embodiment, the third source pattern may contact the second source pattern through a first contact hole, the second source pattern may contact the intermediate pattern through a second contact hole, the first source pattern may contact the second pattern through a third contact hole, may contact the intermediate pattern through a fourth contact hole, and may contact the first pattern through a fifth contact hole, and the third, fourth, and fifth contact holes may be spaced apart from each other.

According to an embodiment, the display device may further include a gate electrode disposed in a same layer as the first gate line and arranged in an island shape and a node pattern disposed in a same layer as the second source pattern and contacting the gate electrode and the second active pattern. The second pattern may be disposed to be adjacent to the node pattern.

According to an embodiment, the display device may further include a first gate line disposed between the first pattern and the second pattern and a second active pattern disposed on the second pattern and including an oxide semiconductor. The first pattern may be a first active pattern including a silicon semiconductor, and the intermediate pattern may be disposed in a same layer as the second active pattern.

According to an embodiment, the third source pattern may contact the second source pattern through a first contact hole, the second source pattern may contact the intermediate pattern through a second contact hole, the first source pattern may contact the intermediate pattern through a third contact hole, may contact the second pattern through a fourth contact hole, and may contact the first pattern through a fifth contact hole, and the third, fourth, and fifth contact holes may be spaced apart from each other.

According to an embodiment, the driving voltage may be transferred in an order of the third source pattern, the second source pattern, the intermediate pattern, and the first source pattern, and the first source pattern may transfer the driving voltage to the first pattern and the second pattern.

A display device according to another embodiment may include an active pattern disposed on a substrate and configured to receive a driving voltage, a storage capacitor electrode disposed on the active pattern and configured to receive the driving voltage, a first source pattern disposed on the storage capacitor pattern and in direct contact with the active pattern and the storage capacitor pattern, a second source pattern disposed in a same layer as the first source pattern and in direct contact with the storage capacitor pattern, and a third source pattern disposed on the second source pattern and in direct contact with the second source pattern.

According to an embodiment, the driving voltage may be transferred in an order of the third source pattern, the second source pattern, the storage capacitor electrode, and the first source pattern, and the first source pattern transfers the driving voltage to the active pattern.

Therefore, the display device may include the first source pattern, the second source pattern, and the intermediate pattern that transfer the driving voltage. Accordingly, additional contact holes for electrically connecting the third source pattern to the first pattern and the second pattern may not be added in the via insulating layer. In other words, the driving voltage may be transferred to the first pattern and the second pattern through one contact hole connecting the third source pattern and the second source pattern. Accordingly, the number of contact holes may be relatively small, and the shape of the third source pattern may be designed relatively freely.

It is to be understood that both the foregoing general description and the following detailed description provide examples, are explanatory, and are intended to provide further explanation of the present disclosure as claimed.

BRIEF DESCRIPTION OF THE DRAWINGS

The accompanying drawings, which are included to provide a further understanding of the present disclosure and are incorporated in and constitute a part of this specification, illustrate embodiments of the present disclosure, and together with the description serve to explain the present disclosure.

DETAILED DESCRIPTION

Figure 1:
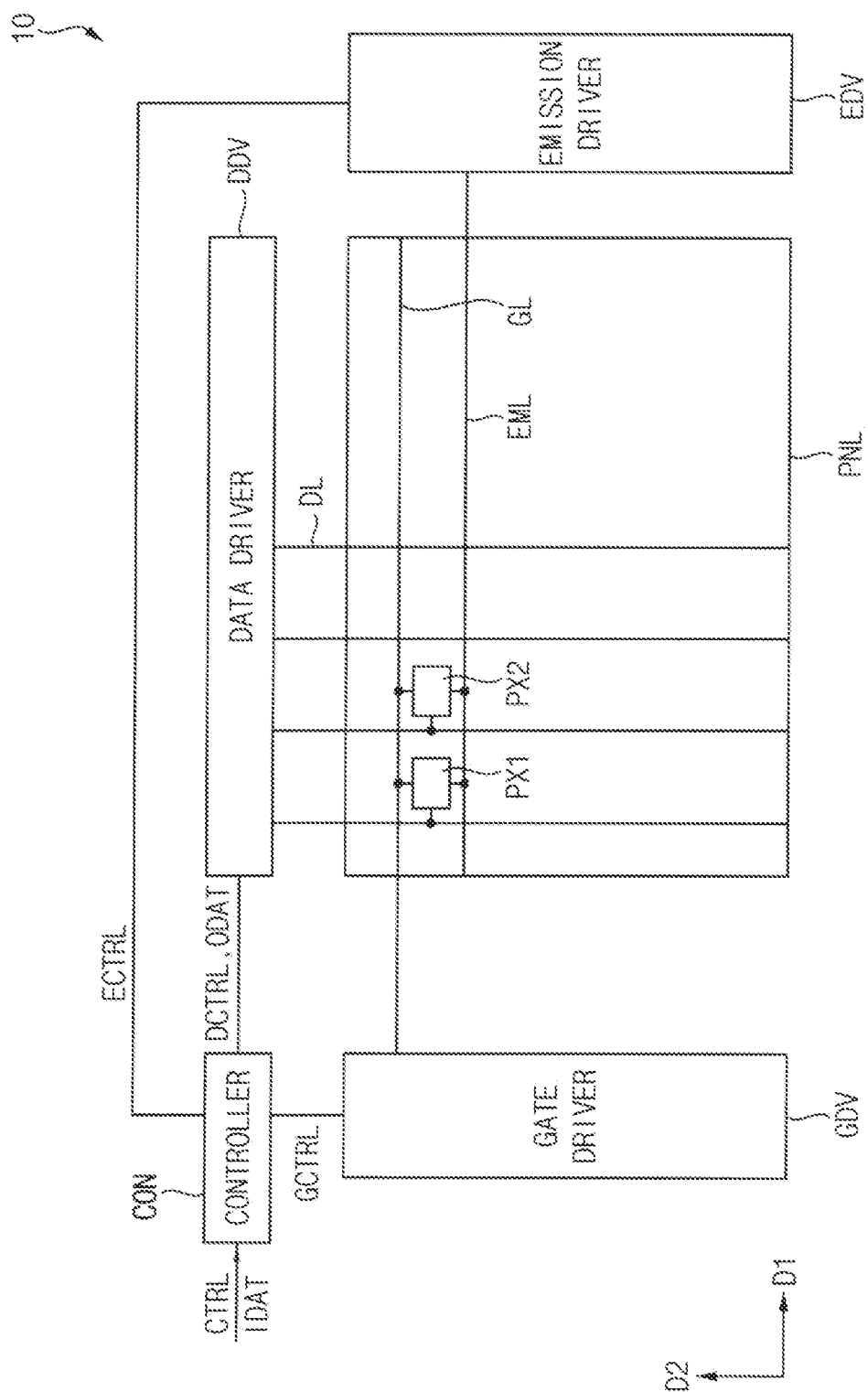
FIG. 1 is a block diagram illustrating a display device according to embodiments.

In the following description, for the purposes of explanation, numerous specific details are set forth in order to provide a thorough understanding of various embodiments or implementations of the present disclosure. As used herein "embodiments" and "implementations" are interchangeable words that are non-limiting examples of devices or methods employing one or more of the present disclosure disclosed herein. It is apparent, however, that various embodiments may be practiced without these specific details or with one or more equivalent arrangements. In other instances, well-known structures and devices are illustrated in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the present disclosure.

Unless otherwise specified, the illustrated embodiments are to be understood as providing features of varying detail of some ways in which the present disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the present disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Illustrative, non-limiting example embodiments will be more clearly understood from the following detailed description in conjunction with the accompanying drawings.

Figure 2:
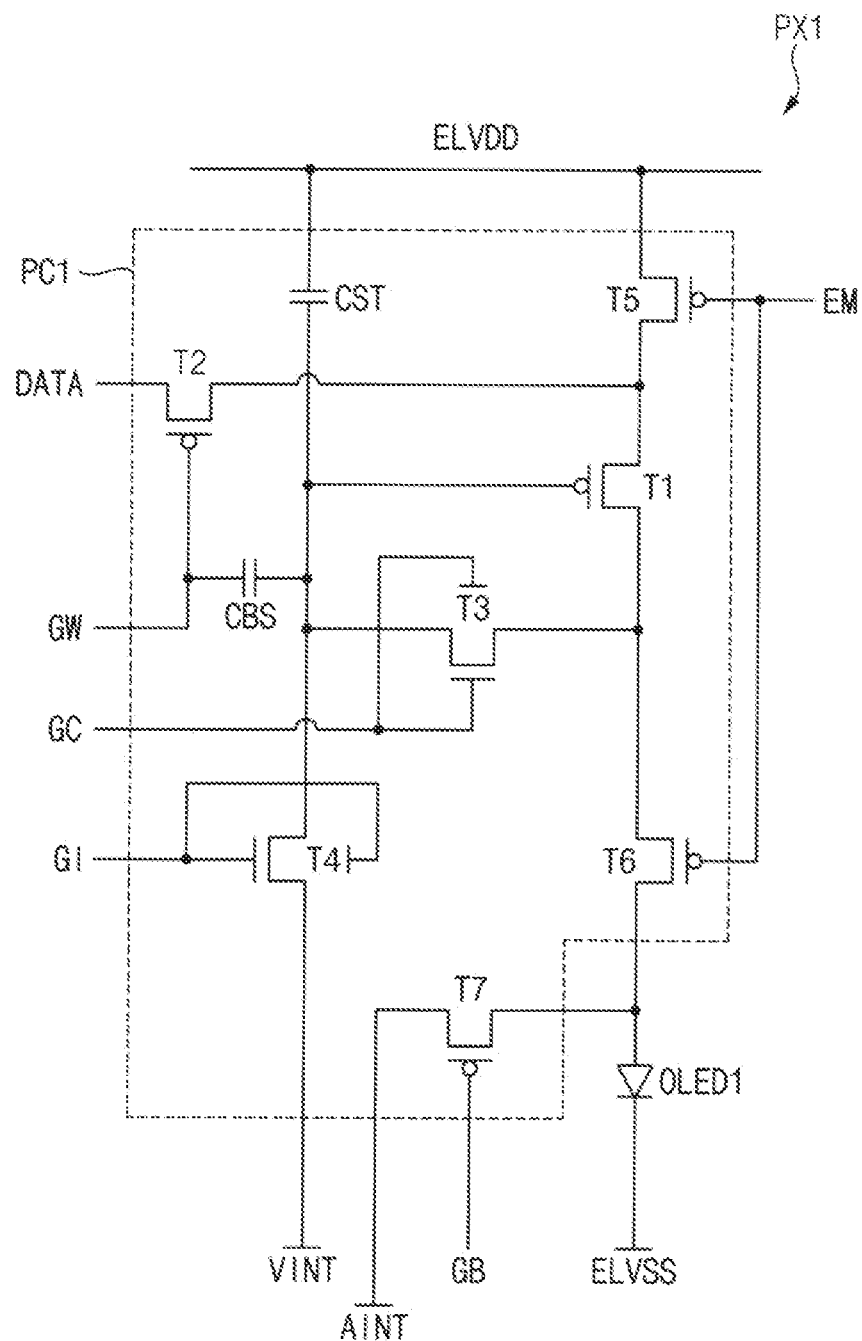
FIG. 2 is an equivalent circuit diagram illustrating of a first pixel included in the display device of FIG. 1.

FIG. 1 is a block diagram illustrating a display device according to embodiments. FIG. 2 is an equivalent circuit diagram illustrating of a first pixel included in the display device of FIG. 1.

Referring to FIGS. 1 and 2, a display device 10 according to embodiments of the present disclosure may include a display panel PNL, a data driver DDV, a gate driver GDV, a emission driver EDV, and a controller CON.

As depicted in FIG. 1, the display panel PNL may include a plurality of pixels. For example, the display panel PNL may include a first pixel PX1 and a second pixel PX2. Each of the first and second pixels PX1 and PX2 may receive a data voltage DATA, a gate signal GS, an emission control signal EM, a driving voltage ELVDD, a common voltage ELVSS, a gate initialization voltage VINT, and an anode initialization voltage AINT.

The data driver DDV may generate the data voltage DATA based on an output image data ODAT and a data control signal DCTRL. For example, the data driver DDV may generate the data voltage DATA corresponding to the output image data ODAT, and may output the data voltage DATA in response to the data control signal DCTRL. The data control signal DCTRL may include an output data enable signal, a horizontal start signal, and a load signal.

The gate driver GDV may generate the gate signal GS based on a gate control signal GCTRL. For example, the gate signal GS may include a gate-on voltage for turning on a transistor and a gate-off voltage for turning off the transistor. The gate control signal GCTRL may include a vertical start signal, a clock signal, and the like.

The emission driver EDV may generate the emission control signal EM based on an emission driving signal ECTRL. For example, the emission driving signal ECTRL may include a vertical start signal and a clock signal, and the emission control signal EM may include a gate-on voltage for turning on a transistor and a gate-off voltage for turning off the transistor.

The controller CON (e.g., timing controller T-CON) may receive an input image data IDAT and a control signal CTRL from an external host processor (e.g., GPU). For example, the input image data IDAT may be RGB data including red image data, green image data, and blue image data. The control signal CTRL may include a vertical synchronization signal, a horizontal synchronization signal, an input data enable signal, a master clock signal, and the like. The controller CON may generate the gate control signal GCTRL, the emission driving signal ECTRL, the data control signal DCTRL, and the output image data ODAT, based on the input image data IDAT and the control signal CTRL.

As depicted in FIG. 2, the first pixel PX1 may include a first pixel circuit PC1 and a first organic light emitting diode OLED1. The first pixel circuit PC1 may provide a driving current to the first organic light emitting diode OLED1, and the first organic light emitting diode OLED1 may generate light based on the driving current. A second pixel circuit of the second pixel PX2 may have the substantially equal structure to the first pixel circuit PC1.

The first pixel circuit PC1 may include a first transistor T1, a second transistor T2, a third transistor T3, a fourth transistor T4, a fifth transistor T5, and a sixth transistor T6, a seventh transistor T7, a storage capacitor CST, and a boosting capacitor CBS.

The first organic light emitting diode OLED1 may include a first terminal (e.g., an anode terminal) and a second terminal (e.g., a cathode terminal), the first terminal of the first organic light emitting diode OLED1 may be connected to the sixth transistor T6 and the seventh transistor T7, and the second terminal may receive the common voltage ELVSS. The first organic light emitting diode OLED1 may generate light having a luminance corresponding to the driving current.

The storage capacitor CST may include a first terminal and a second terminal. The first terminal of the storage capacitor CST may be connected to the first transistor T1, and the second terminal of the storage capacitor CST may receive the driving voltage ELVDD. The storage capacitor CST may maintain the voltage level of a gate terminal of the first transistor T1 during an inactive period of the first gate signal GW.

The boosting capacitor CBS may include a first terminal and a second terminal. The first terminal of the boosting capacitor CBS may be connected to the gate terminal of the first transistor T1, and the second terminal of the boosting capacitor CBS may receive a first gate signal GW. The boosting capacitor CBS may compensate for the voltage drop of the gate terminal of the first transistor T1 by increasing the voltage of the gate terminal when the provision of the first gate signal GW is stopped.

The first transistor T1 may include the gate terminal, a first terminal (e.g., a source terminal), and a second terminal (e.g., a drain terminal). The gate terminal of the first transistor T1 may be connected to the first terminal of the storage capacitor CST. The first terminal of the first transistor T1 may be connected to the second transistor T2 and may receive the data voltage DATA. The second terminal of the first transistor T1 may be connected to the sixth transistor T6. The first transistor T1 may generate the driving current based on a voltage difference between the gate terminal and the first terminal. For example, the first transistor T1 may be referred to as a driving transistor.

The second transistor T2 may include a gate terminal, a first terminal (e.g., a source terminal), and a second terminal (e.g., a drain terminal). The gate terminal of the second transistor T2 may receive the first gate signal GW through the gate line GL.

The second transistor T2 may be turned on or off in response to the first gate signal GW. For example, when the second transistor T2 is a PMOS transistor, the second transistor T2 may be turned off when the first gate signal GW has a positive voltage level, and may be turned on when the first gate signal GW has a negative voltage level. The first terminal of the second transistor T2 may receive the data voltage DATA through a data line DL. The second terminal of the second transistor T2 may provide the data voltage DATA to the first terminal of the first transistor T1 while the second transistor T2 is turned on. For example, the second transistor T2 may be referred to as a switching transistor.

The third transistor T3 may include a gate terminal, a lower gate terminal, a first terminal (e.g., a source terminal), and a second terminal (e.g., a drain terminal). The gate terminal and the lower gate terminal of the third transistor T3 may receive a second gate signal GC. The first terminal of the third transistor T3 may be connected to the second terminal of the first transistor T1. The second terminal of the third transistor T3 may be connected to the gate terminal of the first transistor T1.

The third transistor T3 may be turned on or off in response to the second gate signal GC. For example, when the third transistor T3 is an NMOS transistor, the third transistor T3 may be turned on when the second gate signal GC has a positive voltage level, and may be turned off when the second gate signal GC has a negative voltage level.

During a period in which the third transistor T3 is turned on in response to the second gate signal GC, the third transistor T3 may diode-connect the first transistor T1. Accordingly, the third transistor T3 may compensate for the threshold voltage of the first transistor T1. For example, the third transistor T3 may be referred to as a compensation transistor.

The fourth transistor T4 may include a gate terminal, a lower gate terminal, a first terminal (e.g., a source terminal), and a second terminal (e.g., a drain terminal). The gate terminal and the lower gate terminal of the fourth transistor T4 may receive a third gate signal GI. The first terminal of the fourth transistor T4 may be connected to the gate terminal of the first transistor T1. The second terminal of the fourth transistor T4 may receive the gate initialization voltage VINT.

The fourth transistor T4 may be turned on or off in response to the third gate signal GI. For example, when the fourth transistor T4 is an NMOS transistor, the fourth transistor T4 may be turned on when the third gate signal GI has a positive voltage level, and may be turned off when the third gate signal GI has a negative voltage level.

While the fourth transistor T4 is turned on to the third gate signal GI, the gate initialization voltage VINT may be provided to the gate terminal of the first transistor T1. Accordingly, the fourth transistor T4 may initialize the gate terminal of the first transistor T1 to the gate initialization voltage VINT. For example, the fourth transistor T4 may be referred to as a gate initialization transistor.

The fifth transistor T5 may include a gate terminal, a first terminal (e.g., a source terminal), and a second terminal (e.g., a drain terminal). The gate terminal of the fifth transistor T5 may receive the emission control signal EM. The first terminal of the fifth transistor T5 may receive the driving voltage ELVDD. The second terminal of the fifth transistor T5 may be connected to the first transistor T1. When the fifth transistor T5 is turned on in response to the emission control signal EM, the fifth transistor T5 may provide the driving voltage ELVDD to the first transistor T1.

The sixth transistor T6 may include a gate terminal, a first terminal (e.g., a source terminal), and a second terminal (e.g., a drain terminal). The gate terminal of the sixth transistor T6 may receive the emission control signal EM. The first terminal of the sixth transistor T6 may be connected to the first transistor T1. The second terminal of the sixth transistor T6 may be connected to the first organic light emitting diode OLED1. When the sixth transistor T6 is turned on in response to the emission control signal EM, the sixth transistor T6 may provide the driving current to the first organic light emitting diode OLED1.

The seventh transistor T7 may include a gate terminal, a first terminal (e.g., a source terminal), and a second terminal (e.g., a drain terminal). The gate terminal of the seventh transistor T7 may receive a fourth gate signal GB. The first terminal of the seventh transistor T7 may be connected to the first organic light emitting diode OLED1. The second terminal of the seventh transistor T7 may receive the anode initialization voltage AINT.

When the seventh transistor T7 is turned on in response to the fourth gate signal GB, the seventh transistor T7 may provide the anode initialization voltage AINT to the first organic light emitting diode OLED1. Accordingly, the seventh transistor T7 may initialize the first terminal of the first organic light emitting diode OLED1 to the anode initialization voltage AINT. For example, the seventh transistor T7 may be referred to as an anode initialization transistor.

In an embodiment, the first, second, fifth, sixth, and seventh transistors T1, T2, T5, T6, T7 may be PMOS transistors, and the third and fourth transistors T3 and T4 may be NMOS transistors. Accordingly, a first active pattern of the PMOS transistors may include a silicon semiconductor doped with positive ions, and a second active pattern of the NMOS transistors may include an oxide semiconductor. In addition, the first gate signal GW, the emission control signal EM, and the fourth gate signal GB for respectively turning on the second, fifth, sixth, and seventh transistors T2, T5, T6, and T7 may have a negative voltage level and the second gate signal GC and the third gate signal GI for respectively turning on the third and fifth transistors T3 and T4 may have a positive voltage level.

The circuit structure of the first pixel circuit PC1 illustrated in FIG. 2 is an example and may be variously changed.

Figure 3:
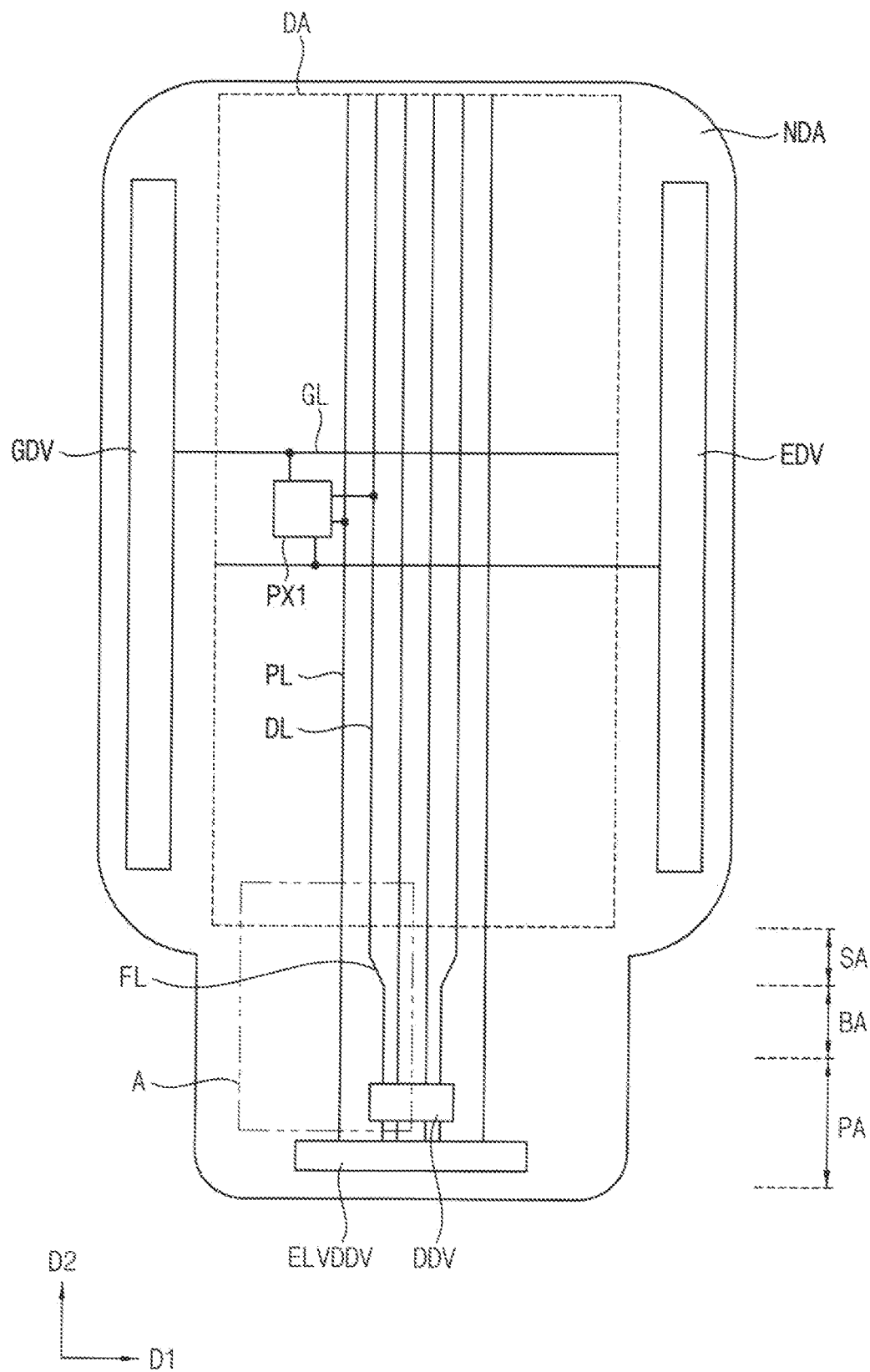
FIG. 3 is a plan view illustrating the display device of FIG. 1.
Figure 4:
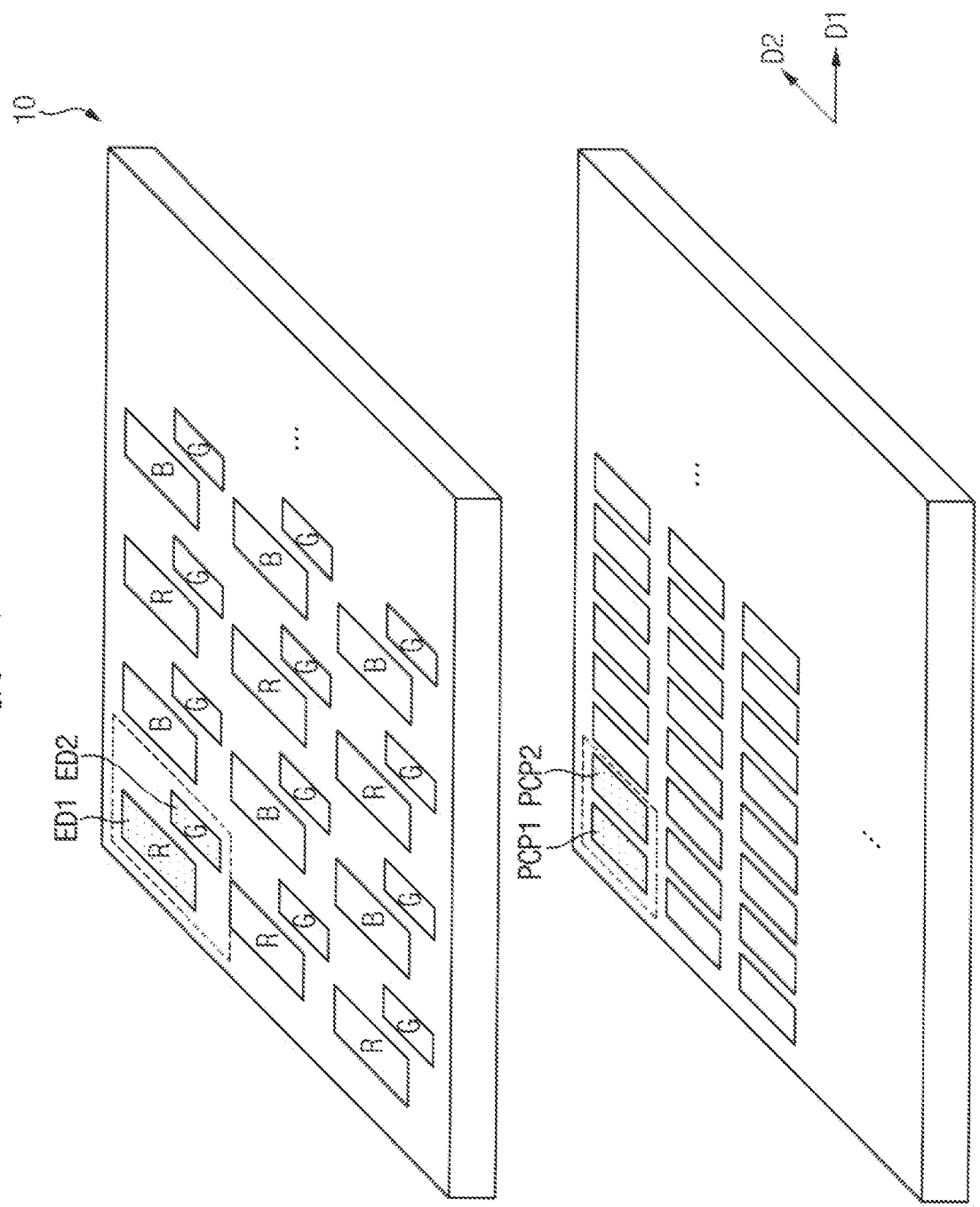
FIG. 4 is a perspective view illustrating the display device of FIG. 1.
Figure 5:
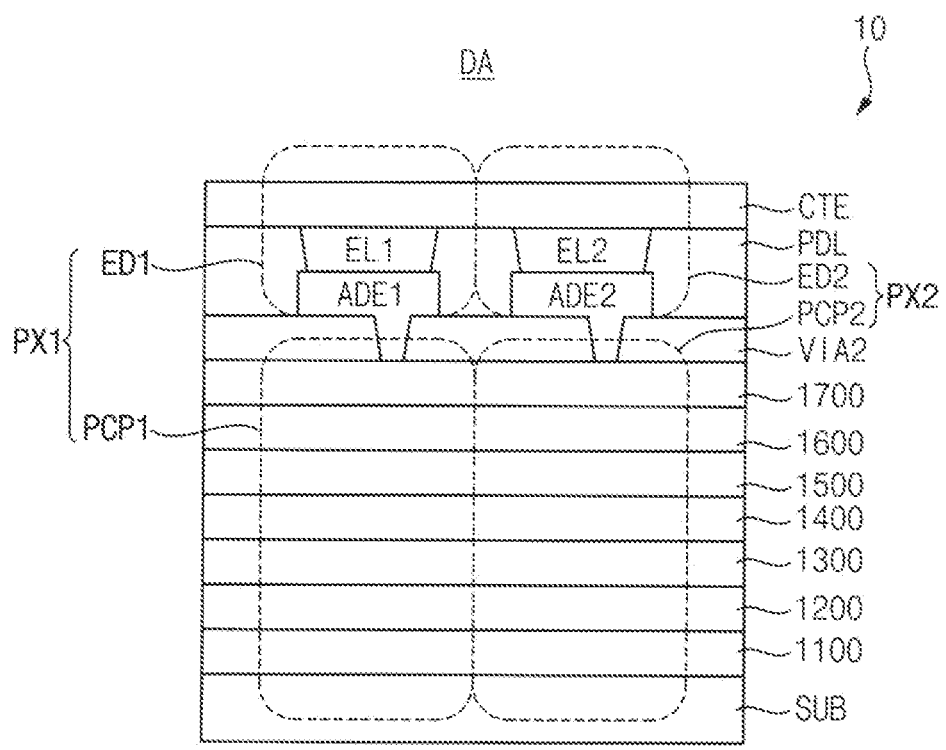
FIG. 5 is a cross-sectional view illustrating the display device of FIG. 1.
Figure 6:
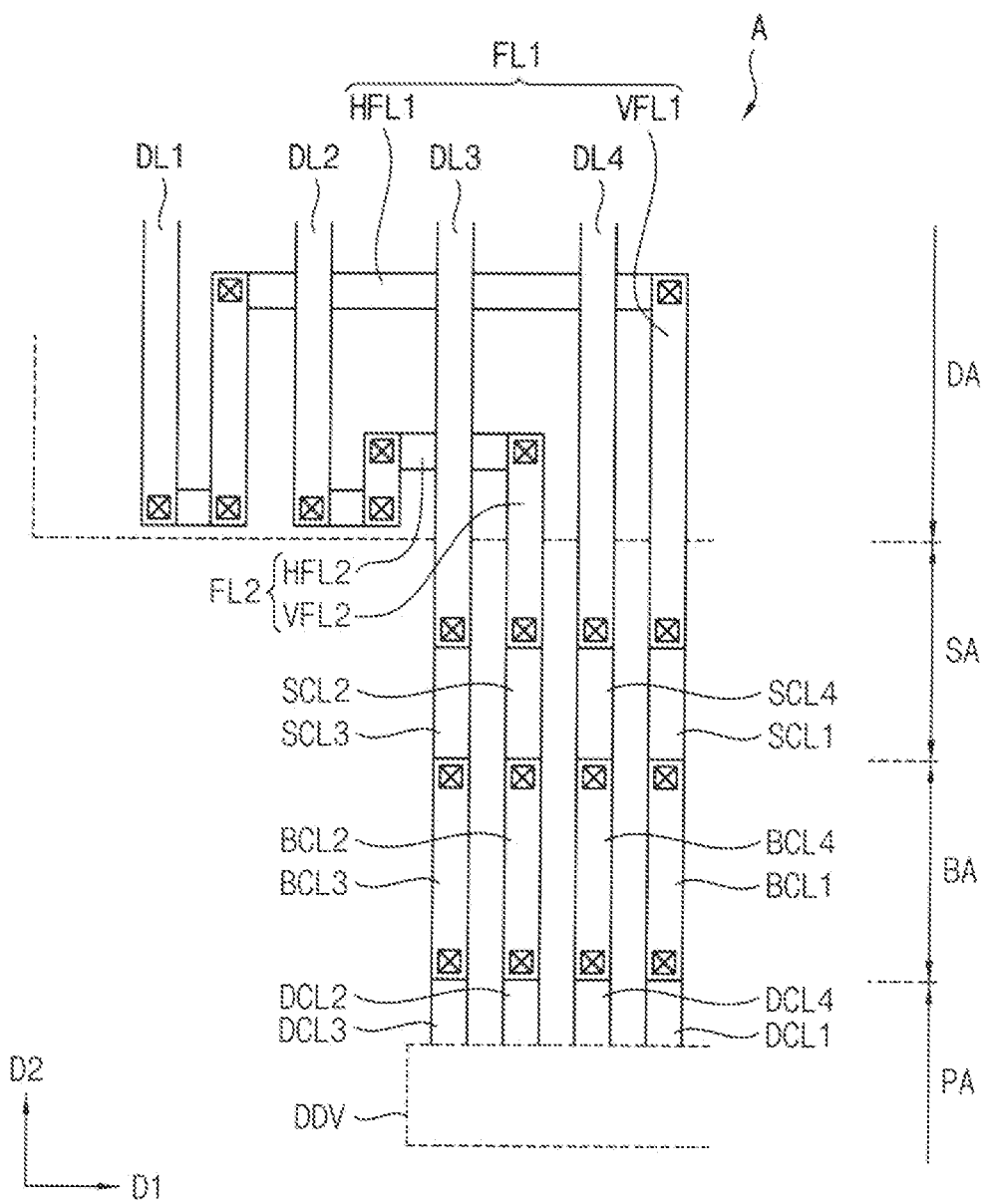
FIG. 6 is an enlarged view of an enlarged area A of FIG. 3.

FIG. 3 is a plan view illustrating the display device of FIG. 1. FIG. 4 is a perspective view illustrating the display device of FIG. 1. FIG. 5 is a cross-sectional view illustrating the display device of FIG. 1. FIG. 6 is an enlarged view of an enlarged area A of FIG. 3.

Referring to FIG. 3, the display device 10 may include a display area DA, a non-display area NDA surrounding the display area DA, a bending area BA configured to be bended, a peripheral area SA between the display area DA and the bending area BA, and pad area PA.

For example, the plurality of pixels may be disposed in the display area DA, and a driver for driving the pixels may be disposed in the non-display area NDA. A driving voltage part ELVDDV and the data driver DDV may be disposed in the pad area PA, and the bending area BA may be bent based on a virtual bending axis. The driving voltage part ELVDDV may provide the driving voltage ELVDD to a driving voltage line PL of the display device 10.

Referring to FIGS. 4 and 5, a first pixel circuit part PCP1 and a first display element ED1 may constitute the first pixel PX1. For example, the first pixel circuit part PCP1 may correspond to the first pixel circuit PC1, and the first display element ED 1 may correspond to the first organic light emitting diode OLED1. In other words, the transistors may be formed in the first pixel circuit part PCP1, and the first pixel circuit part PCP1 may provide the driving current to the first display element ED 1. In addition, the second pixel circuit part PCP2 and the second display element ED2 may constitute the second pixel PX2.

The first display element ED1 may include a first pixel electrode ADE1, a first emission layer ELL and a common electrode CTE. For example, the first emission layer EL1 may generate red light. The second display element ED2 may include a second pixel electrode ADE2, a second emission layer EL2, and the common electrode CTE. For example, the second emission layer EL2 may generate green light.

The first pixel circuit part PCP1 may include a substrate SUB, a first active pattern 1100, a first conductive pattern 1200, a second conductive pattern 1300, a second active pattern 1400, a third conductive pattern 1500, a fourth conductive pattern 1600, and a fifth conductive pattern 1700. Insulation layers may be disposed between the first active pattern 1100 to the fifth conductive pattern 1700. For example, an insulation layer may be disposed between the first active pattern 1100 and the first conductive pattern 1200. Another insulation layer may be disposed between the first conductive pattern 1200 and the second conductive pattern 1300. Another insulation layer may be disposed between the second conductive pattern 1300 and the second active pattern 1400. Another insulation layer may be disposed between the second active pattern 1400 and the third conductive pattern 1500. Another insulation layer may be disposed between the third conductive pattern 1500 and the fourth conductive pattern 1600. Another insulation layer may be disposed between the fourth conductive pattern 1600 and the fifth conductive pattern 1700. In addition, a second via insulating layer VIA2 may be disposed on the fifth conductive pattern 1700, and the first and second pixel electrodes ADE1 and ADE2 may contact the fifth conductive pattern 1700 through contact holes passing through the second via insulating layer VIA2.

Referring to FIGS. 3, 4, 5, and 6, the data line DL may be electrically connected to the data driver DDV and may extend along a second direction D2. The gate line GL may be connected to the gate driver GDV and may extend along a first direction D1 crossing the second direction D2. The driving voltage line PL may be connected to the driving voltage part ELVDDV and may extend along the second direction D2.

Data transfer lines FL1 and FL2 may be electrically connected to the data driver DDV and the data line DL. The data transfer lines FL1 and FL2 may be connected to the data driver DDV and the data line DL respectively.

In an embodiment, as shown in FIG. 6, first to fourth data lines DL1, DL2, DL3, and DL4, a first data transfer line FL1, and a second data line FL2 may be disposed in the display device 10. For example, the first and second data transfer lines FL1 and FL2 may be fan-out lines electrically connected to the data driver DDV and the data line DL respectively.

In an embodiment, the first data transfer line FL1 may include a first vertical line VFL1 and a first horizontal line HFL1, and the second data transfer line FL2 may include a second vertical line VFL2 and a second horizontal line HFL2. For example, the first and second vertical lines VFL1 and VFL2 may extend in the second direction D2, and the first and second horizontal lines HFL1 and HFL2 may extend in the first direction D1.

One end of the first data transfer line FL1 may be electrically connected to the data driver DDV, and the other end of the first data transfer line FL1 may be connected to the first data line DL1. For example, a first data voltage may be provided to the first pixel PX1 through the first data transfer line FL1 and the first data line DL1.

In detail, the first vertical line VFL1 may be connected to a first connection line SCL1, the first connection line SCL1 may be connected to a first bending connection line BCL1, and the first bending connection line BCL1 may be connected to a first data connection line DCL1.

For example, the first vertical line VFL1 may extend from the peripheral area SA to the display area DA, and may be formed in the same layer as the fifth conductive pattern 1700. The first connection line SCL1 may be disposed in the peripheral area SA, and may be formed under the first vertical line VFL1. The first bending connection line BCL1 may be disposed in the bending area BA and may be formed in the same layer as the first vertical line VFL1. The first data connection line DCL1 may be disposed in the pad area PA and may receive the first data voltage from the data driver DDV.

The second data transfer line FL2 may electrically connect the data driver DDV and the second data line DL2. For example, the second data voltage may be provided to the second pixel PX2 through the second data transfer line FL2 and the second data line DL2.

In detail, the second vertical line VFL2 may be connected to a second connection line SCL2, the second connection line SCL2 may be connected to a second bending connection line BCL2, and the second bending connection line BCL2 may be connected to a second data connection line DCL2. However, the structure of the second vertical line VFL2, the second connection line SCL2, the second bending connection line BCL2, and the second data connection line DCL2 may be substantially equal to the first data transfer vertical line VFL1, the first connection line SCL1, the first bending connection line BCL1, and the first data connection line DCL1, and thus detailed description thereof will be omitted.

The third data line DL3 may be connected to the data driver DDV. For example, the third data voltage may be provided to the third pixel through the third data line DL3.

In detail, the third data line DL3 may be connected to a third connection line SCL3, the third connection line SCL3 may be connected to a third bending connection line BCL3, the third bending connection line BCL3 may be connected to a third data connection line DCL3, and finally the third data connection line DCL3 may be connected to the data driver DDV.

For example, the third data line DL3 may extend from the peripheral area SA to the display area DA, and may be formed in the same layer as the first vertical line VFL1. The third connection line SCL3 may be disposed in the peripheral area SA and may be formed under the third data line DL3. The third bending connection line BCL3 may be disposed in the bending area BA and may be formed in the same layer as the first vertical line VFL1. The third data connection line DCL3 may be disposed in the pad area PA and may receive the third data voltage from the data driver DDV.

The fourth data line DL4 may be connected to the data driver DDV. For example, the fourth data voltage may be provided to the fourth pixel through the fourth data line DL4.

In detail, the fourth data line DL4 may be connected to a fourth connection line SCL4, the fourth connection line SCL4 may be connected to a fourth bending connection line BCL4, the fourth bending connection line BCL4 may be connected to a fourth data connection line DCL4, and fourth data connection line DCL4 may be connected to the data driver DDV. However, the structure of the fourth data line DL4, the fourth connection line SCL4, the fourth bending connection line BCL4, and the fourth data connection line DCL4 may be substantially the same as the third data transfer vertical line VFL3, the third connection line SCL3, the third bending connection line BCL3, and the third data connection line DCL3, and thus detailed description thereof will be omitted.

FIGS. 7, 8, 9, 10, 11, 12, and 13 are layout diagrams illustrating an embodiment of the display device of FIG. 1.

Figure 7:
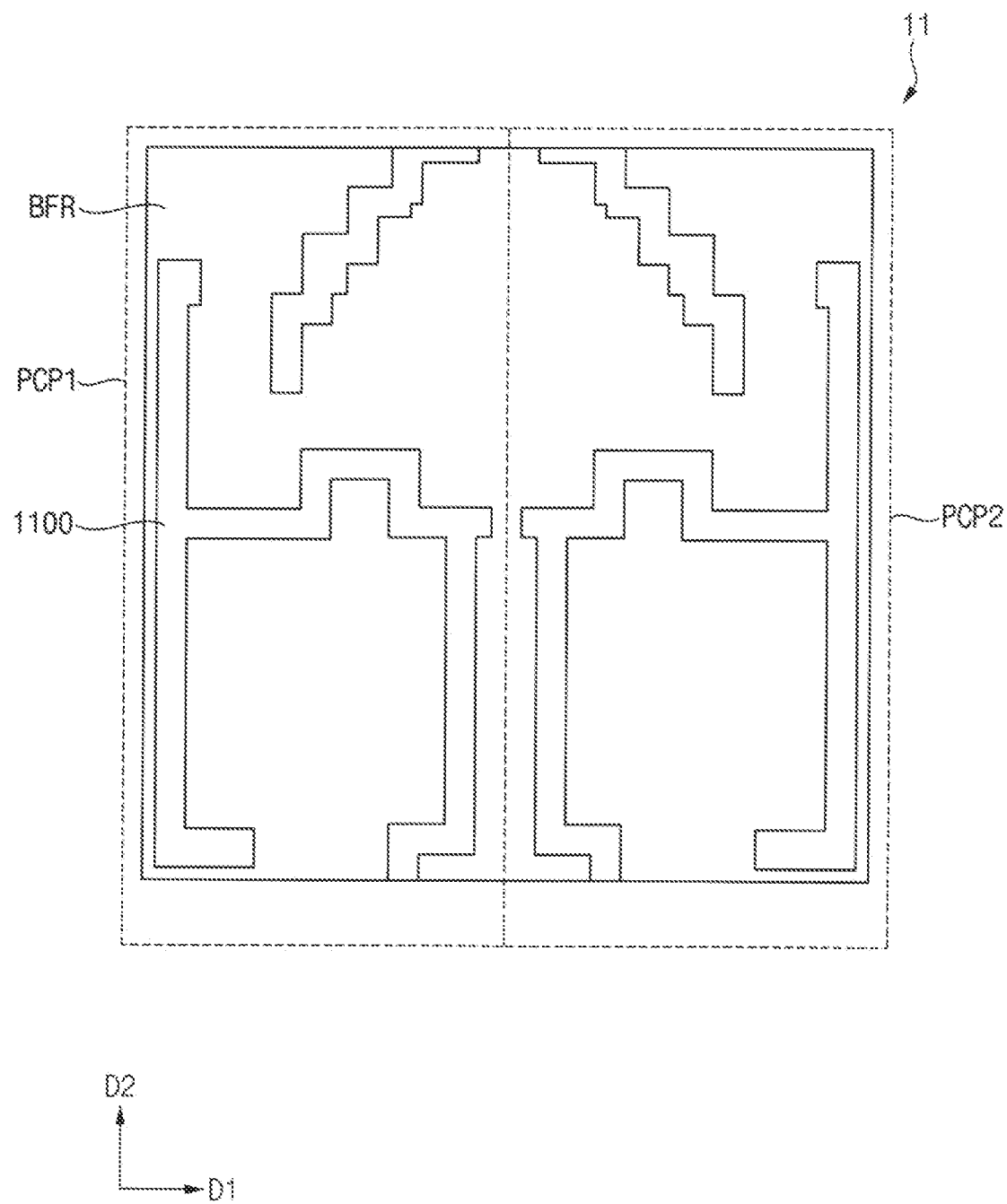
FIGS. 7, 8, 9, 10, 11, 12 and 13 are layout diagrams illustrating an embodiment of the display device of FIG. 1.
Figure 14:
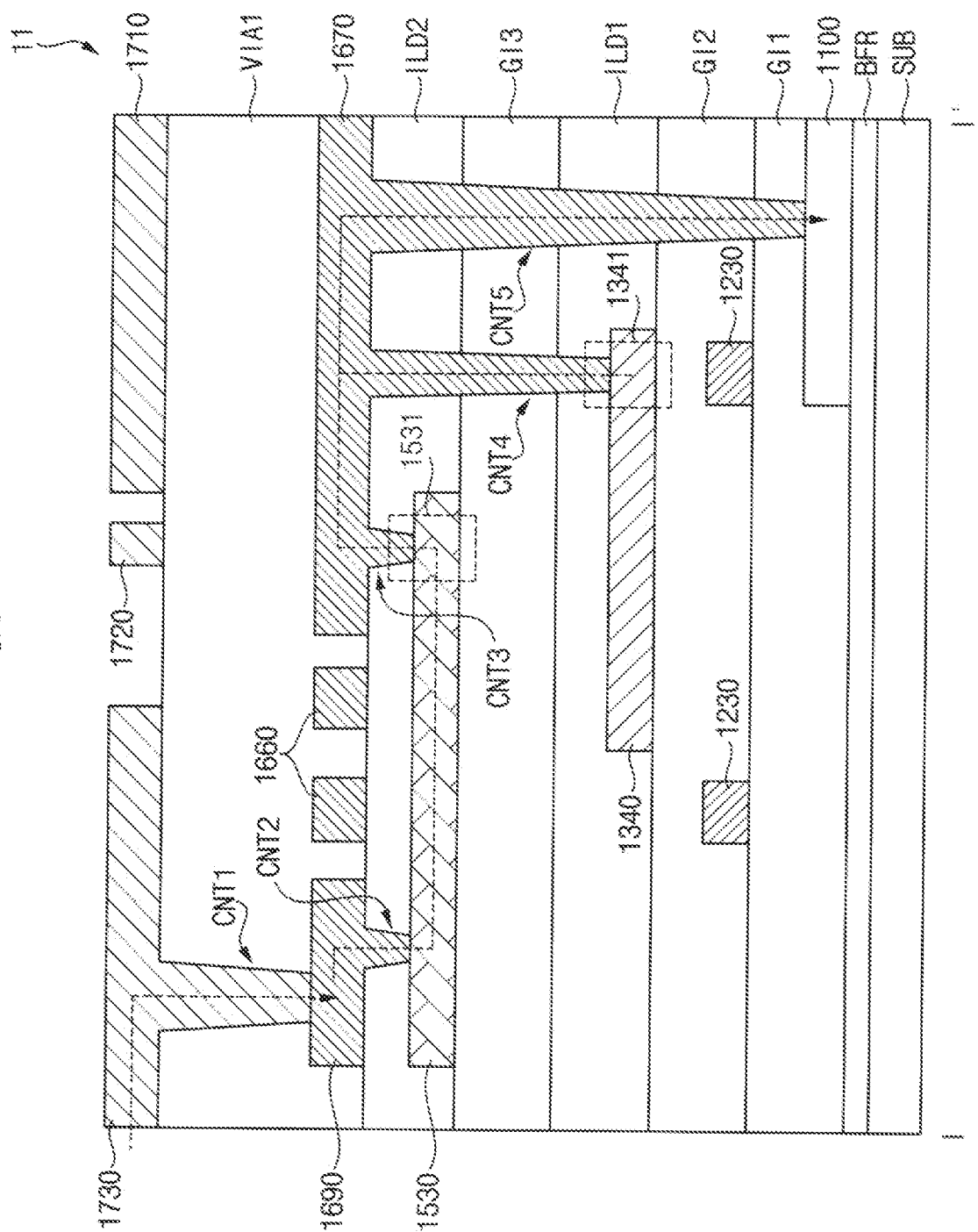
FIG. 14 is a cross-sectional view taken along line I-I' of FIG. 13.

Referring to FIGS. 7 and 14, a display device 11 according to an embodiment may include the first and second pixel circuit parts PCP1 and PCP2 arranged in the first direction D1. In an embodiment, the second pixel circuit part PCP2 may have a shape symmetrical to a shape of the first pixel circuit part PCP1. Hereinafter, the structure of the first pixel circuit part PCP1 will be described in detail.

A substrate SUB may include glass, quartz, plastic, or the like. In an embodiment, the substrate SUB may include plastic, and the display device 11 may have a flexible characteristic. In this case, the substrate SUB may have a structure in which at least one organic film layer and at least one barrier layer are alternately stacked. For example, the organic film layer may be formed using an organic material such as polyimide, and the barrier layer may be formed using an inorganic material.

A buffer layer BFR may be disposed on the substrate SUB. The buffer layer BFR may prevent diffusion of metal atoms or impurities from the substrate SUB into the first active pattern 1100. In addition, the buffer layer BFR may control a rate of providing heat during a crystallization process for forming the first active pattern 1100.

The first active pattern 1100 may be disposed on the buffer layer BFR. In an embodiment, the first active pattern 1100 may include a silicon semiconductor. For example, the silicon semiconductor may include amorphous silicon, polycrystalline silicon, or the like. For example, the first active pattern 1100 may include the polycrystalline silicon formed by crystallizing the amorphous silicon.

In an embodiment, the first active pattern 1100 may be a first pattern receiving the driving voltage ELVDD. In other words, the driving voltage ELVDD may be provided in the first pattern.

A first gate insulating layer GI1 may cover the first active pattern 1100 and may be disposed on the substrate SUB. The first gate insulating layer GI1 may include an inorganic insulating material. For example, the first gate insulating layer GI1 may include silicon oxide, silicon nitride, silicon oxynitride, or the like.

Figure 8:
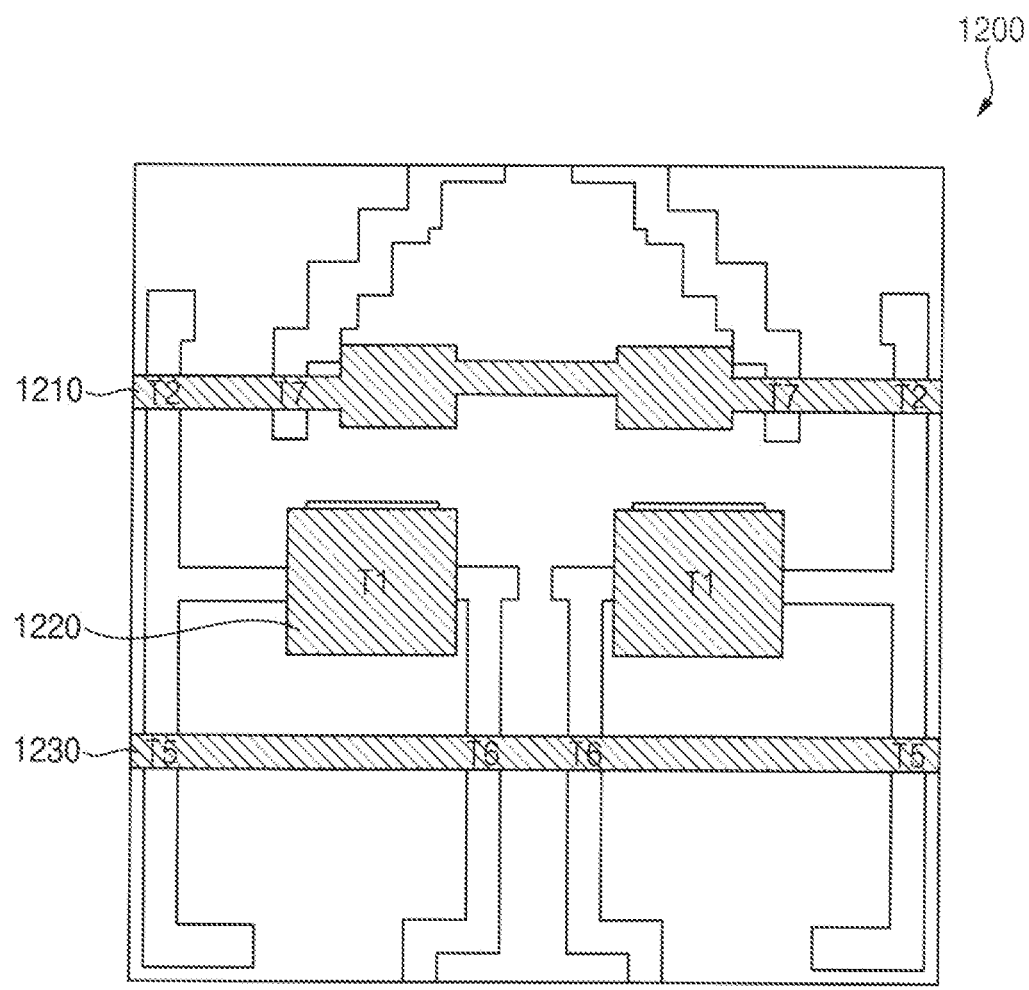

Referring to FIGS. 8 and 14, the first conductive pattern 1200 may be disposed on the first gate insulating layer GI1. The first conductive pattern 1200 may include a second gate wiring 1210, a gate electrode 1220, and a first gate wiring 1230.

The second gate line 1210 may extend in the first direction D1. The second gate line 1210 may form the second transistor T2 together with the first active pattern 1100. For example, the first gate signal GW may be provided to the second gate line 1210. In addition, the second gate line 1210 may constitute the seventh transistor T7 together with the first active pattern 1100. For example, the fourth gate signal GB may be provided to the second gate line 1210. The first gate signal GW and the fourth gate signal GB may have substantially equal waveform with a time difference.

The gate electrode 1220 may be arranged in an island shape. The gate electrode 1220 may form the first transistor T1 together with the first active pattern 1100.

The first gate line 1230 may extend in the first direction D1. The first gate line 1230 may constitute the fifth and sixth transistors T5 and T6 together with the first active pattern 1100. For example, the emission control signal EM may be provided to the first gate line 1230. The first gate line 1230 may be referred to as an emission control line.

For example, the first conductive pattern 1200 may include a metal, an alloy, a conductive metal oxide, a transparent conductive material, and the like. For example, the first conductive pattern 1200 may include silver ("Ag"), an alloy containing silver, molybdenum ("Mo"), an alloy containing molybdenum, aluminum ("Al"), an alloy containing aluminum, aluminum nitride ("AlN"), tungsten ("W"), tungsten nitride ("WN"), copper ("Cu"), nickel ("Ni"), chromium ("Cr"), chromium nitride ("CrN"), titanium ("T1"), tantalum ("Ta"), platinum ("Pt"), scandium ("Sc"), indium tin oxide ("ITO"), indium zinc oxide ("IZO"), and the like.

A second gate insulating layer GI2 may cover the first conductive pattern 1200 and may be disposed on the first gate insulating layer GI1. The second gate insulating layer GI2 may include an inorganic insulating material.

Figure 9:
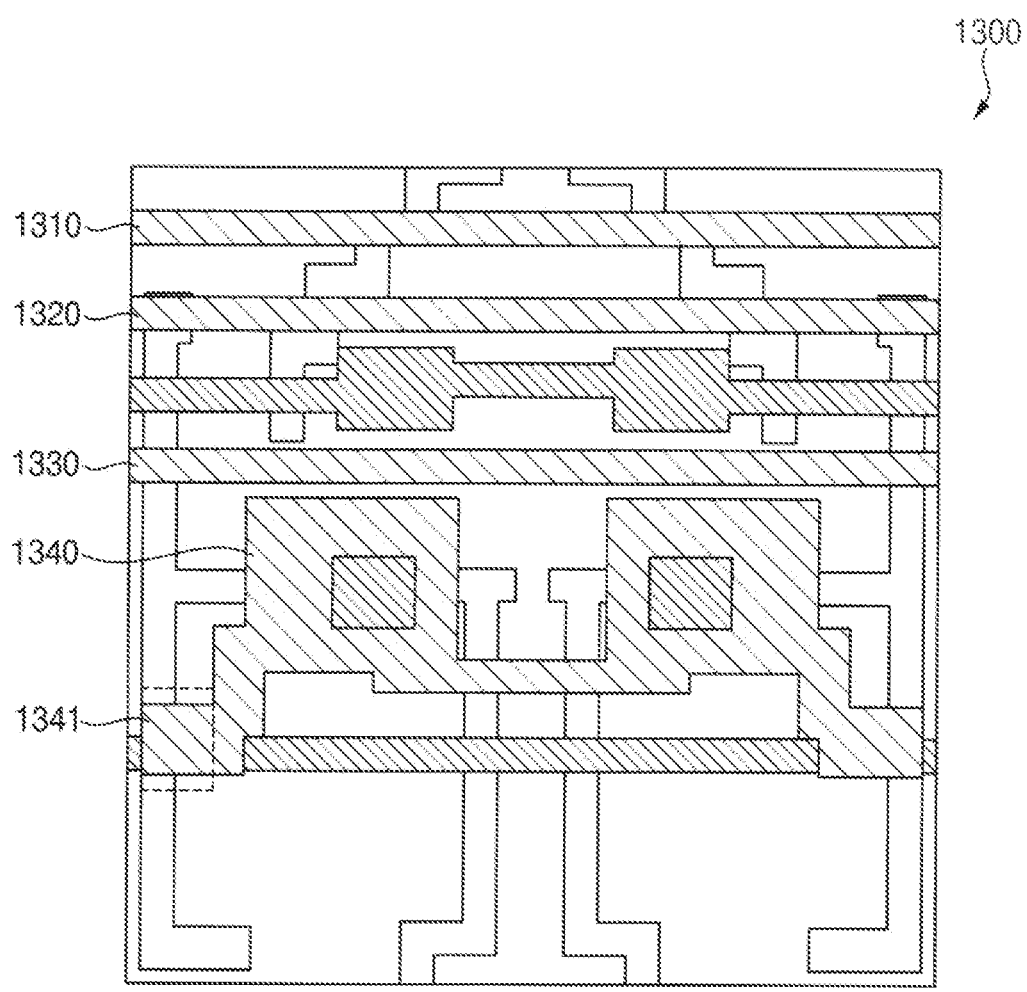

Referring to FIGS. 9 and 14, the second conductive pattern 1300 may be disposed on the second gate insulating layer GI2. The second conductive pattern 1300 may include a gate initialization voltage line 1310, a third gate line 1320, a fourth gate line 1330, and a storage capacitor electrode 1340.

The gate initialization voltage line 1310 may extend in the first direction D1. For example, the gate initialization voltage line 1310 may be spaced apart from the second gate line 1210 on a plane. The gate initialization voltage VINT may be provided to the gate initialization voltage line 1310.

The third gate line 1320 may extend in the first direction D1. For example, the third gate line 1320 may be spaced apart from the second gate line 1210 on a plane. The third gate signal GI may be provided to the third gate line 1320.

The fourth gate line 1330 may extend in the first direction D1. For example, the fourth gate line 1330 may be spaced apart from the second gate line 1210 and the third gate line 1320 on a plane. The second gate signal GC may be provided to the fourth gate line 1330.

The storage capacitor electrode 1340 may overlap the first gate electrode 1220 and may extend in the first direction D1. For example, the storage capacitor electrode 1340 may form the storage capacitor CST together with the first gate electrode 1220. In addition, a hole penetrating through the storage capacitor electrode 1340 may be formed in the storage capacitor electrode 1340, and the first gate electrode 1220 may be exposed through the hole.

In an embodiment, the storage capacitor electrode 1340 may be a second pattern receiving the driving voltage ELVDD. In other words, the driving voltage ELVDD may be provided in the second pattern. For example, the second pattern may include a first exposed portion 1341 exposed by a fourth contact hole CNT4. The first exposed portion 1341 may overlap the first gate line 1230. The second pattern may contact a first source pattern 1670 in the first exposed portion 1341.

For example, the second conductive pattern 1300 may include a metal, an alloy, a conductive metal oxide, a transparent conductive material, and the like.

A first interlayer insulating layer ILD1 may cover the second conductive pattern 1300 and may be disposed on the second gate insulating layer GI2. The first interlayer insulating layer ILD1 may include an inorganic insulating material. For example, the first interlayer insulating layer ILD1 may include silicon oxide, silicon nitride, silicon oxynitride, or the like.

Figure 10:
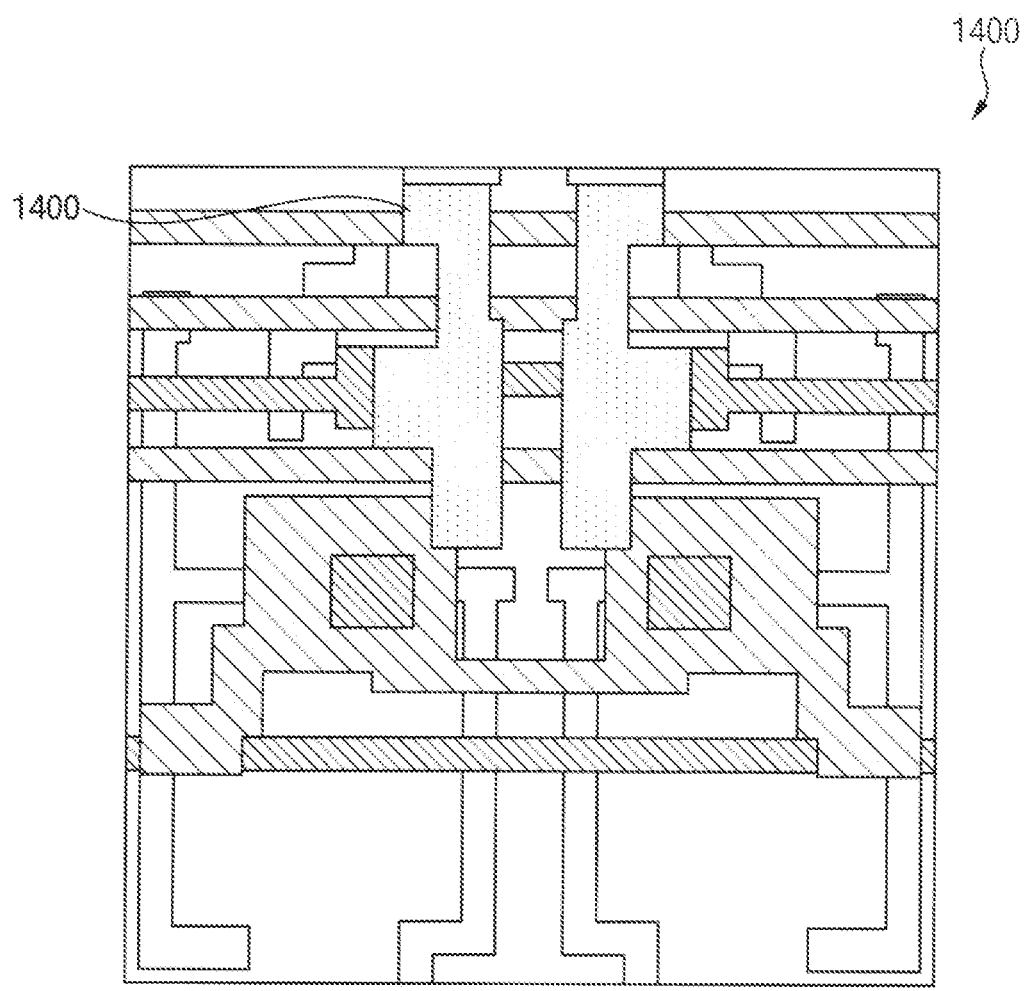

Referring to FIGS. 10 and 14, the second active pattern 1400 may be disposed on the first interlayer insulating layer ILD1. For example, the second active pattern 1400 may overlap the third gate line 1320 and the fourth gate line 1330.

The second active pattern 1400 may include an oxide semiconductor. In an embodiment, the second active pattern 1400 may be disposed on a different layer from the first active pattern 1100 and may not overlap the first active pattern 1100. In other words, the second active pattern 1400 may be formed separately from the first active pattern 1100.

A third gate insulating layer GI3 may cover the second active pattern 1400 and may be disposed on the first interlayer insulating layer ILD1. The third gate insulating layer GI3 may include an inorganic insulating material.

Figure 11:
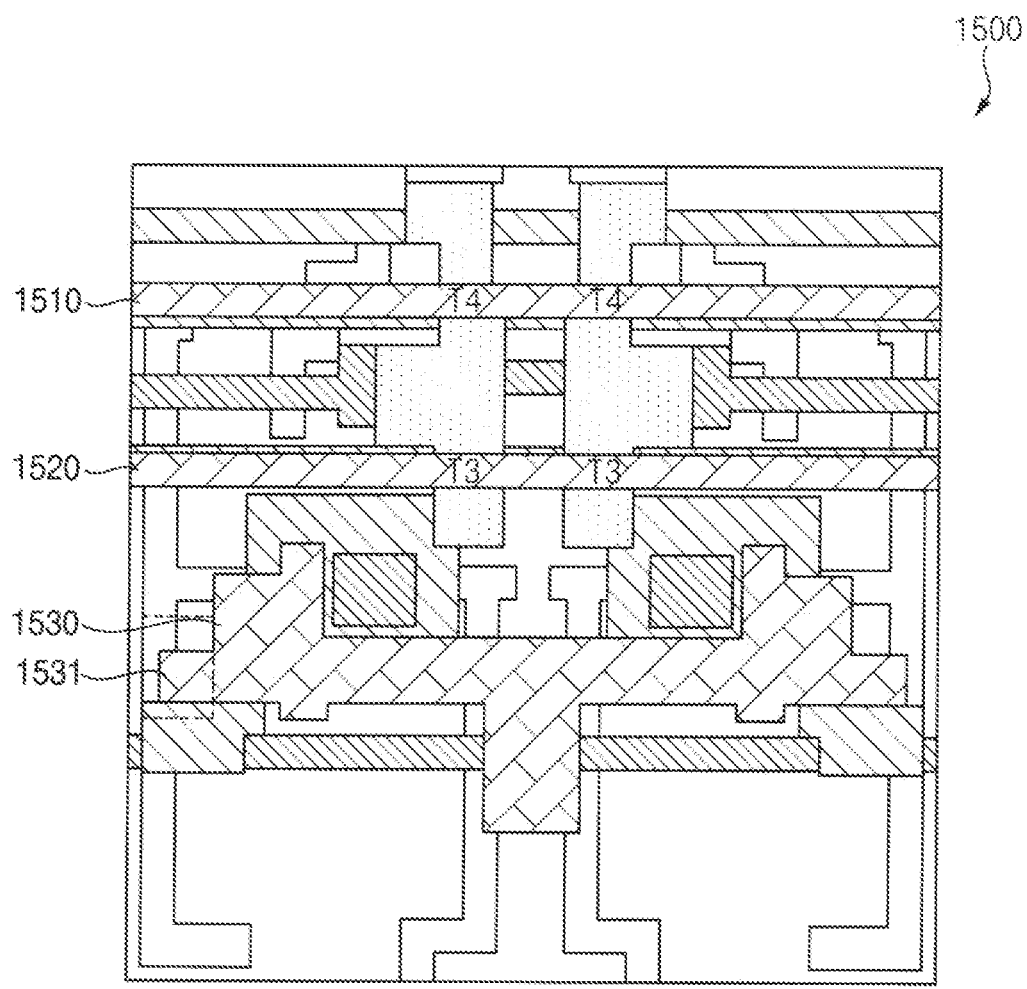

Referring to FIGS. 11 and 14, the third conductive pattern 1500 may be disposed on the third gate insulating layer GI3. The third conductive pattern 1500 may include a fifth gate line 1510, a sixth gate line 1520, and an intermediate pattern 1530.

The fifth gate line 1510 may extend in the first direction D1. For example, the fifth gate line 1510 may overlap the third gate line 1320 and the second active pattern 1400. The fifth gate line 1510 may constitute the fourth transistor T4 together with the third gate line 1320 and the second active pattern 1400. For example, the third gate signal GI may be provided to the fifth gate line 1510.

The sixth gate line 1520 may extend in the first direction D1. For example, the sixth gate line 1520 may overlap the fourth gate line 1330 and the second active pattern 1400. The sixth gate line 1520 may constitute the third transistor T3 together with the fourth gate line 1330 and the second active pattern 1400. For example, the second gate signal GC may be provided to the sixth gate line 1520.

In an embodiment, the intermediate pattern 1530 may be arranged in an island shape and may be provided with the driving voltage ELVDD. In other words, the driving voltage EVLDD may be provided to the intermediate pattern 1530. For example, the intermediate pattern 1530 may include a second exposed portion 1531 exposed through the third contact hole CNT3. The second exposed portion 1531 may be adjacent to the first exposed portion 1341 of the second pattern, and may be spaced apart from the first exposed portion 1341 on a plane. The intermediate pattern 1530 may contact the first source pattern 1670 in the second exposed portion 1531.

For example, the third conductive pattern 1500 may include a metal, an alloy, a conductive metal oxide, a transparent conductive material, and the like.

A second interlayer insulating layer ILD2 may cover the third conductive pattern 1500 and may be disposed on the third gate insulating layer GI3. The second interlayer insulating layer ILD2 may include an inorganic insulating material.

Figure 12:
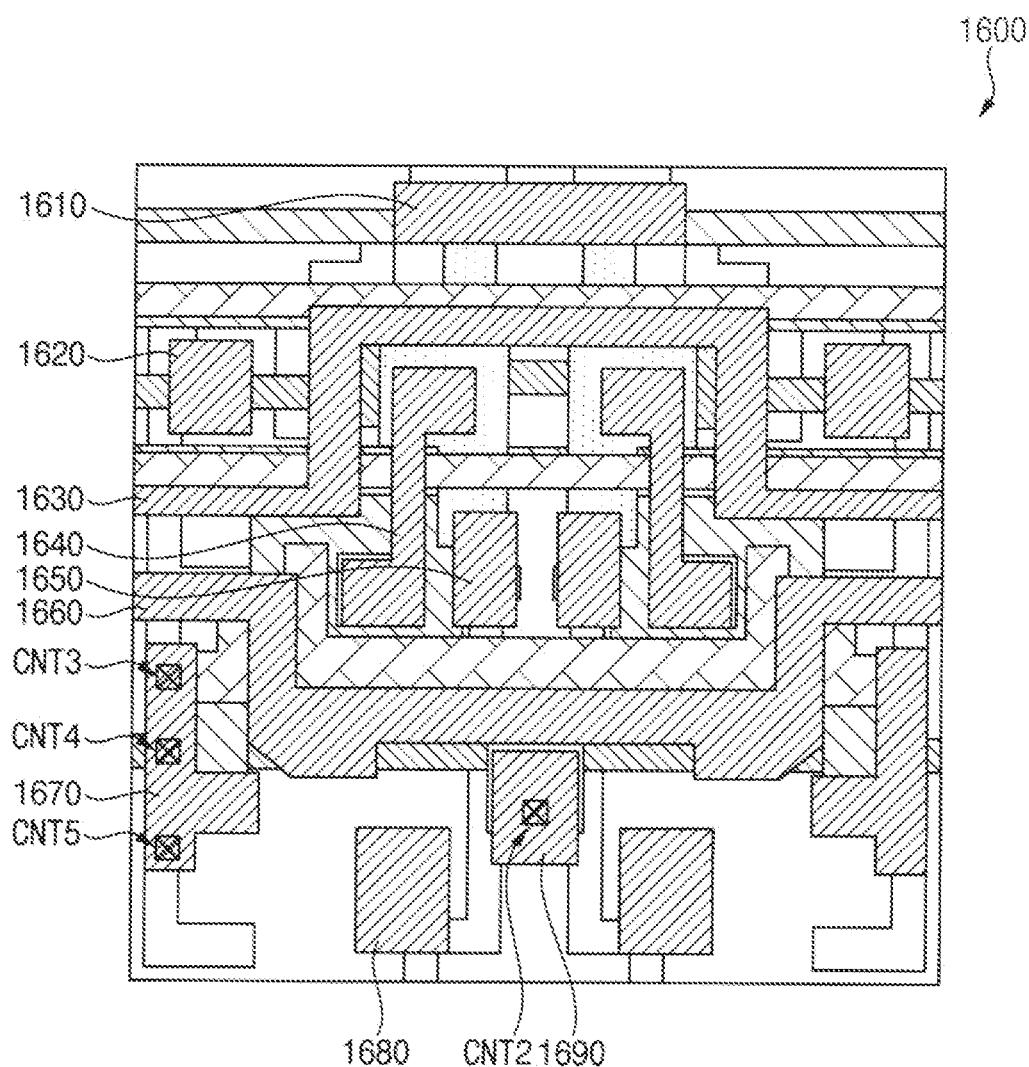

Referring to FIGS. 12 and 14, the fourth conductive pattern 1600 may be disposed on the second interlayer insulating layer ILD2. The fourth conductive pattern 1600 may include a first transfer pattern 1610, a second transfer pattern 1620, an anode initialization voltage line 1630, a node pattern 1640, a third transfer pattern 1650, a first horizontal line 1660, a first source pattern 1670, a fourth transfer pattern 1680, and a second source pattern 1690.

The first transfer pattern 1610 may be arranged in an island shape. The first transfer pattern 1610 may contact the gate initialization voltage line 1310 and the second active pattern 1400, and may transfer the gate initialization voltage VINT to the second active pattern 1400.

The second transfer pattern 1620 may be arranged in an island shape. The second transfer pattern 1620 may contact the first active pattern 1100 and may transfer the data voltage DATA to the first active pattern 1100.

The anode initialization voltage line 1630 may extend in the first direction D1. The anode initialization voltage line 1630 may contact the first active pattern 1100. The anode initialization voltage AINT may be provided to the first active pattern 1100 through the anode initialization voltage line 1630.

The node pattern 1640 may be arranged in an island shape. The node pattern 1640 may contact the gate electrode 1220 and the second active pattern 1400. For example, the node pattern 1640 may electrically connect the gate terminal of the first transistor T1 and the drain terminal of the third transistor T3.

In addition, in an embodiment, the intermediate pattern 1530 may be disposed to surround at least a portion of the node pattern 1640 on a plane.

The third transfer pattern 1650 may be arranged in an island shape. The third transfer pattern 1650 may contact the first active pattern 1100 and the second active pattern 1400. For example, the third transfer pattern 1650 may electrically connect the drain terminal of the first transistor T1 and the source terminal of the third transistor T3.

The first horizontal line 1660 may extend in the first direction D1. In an embodiment, the data voltage DATA may be transmitted through the first horizontal line 1660. For example, the first horizontal line 1660 may correspond to any one of the first horizontal line HFL1 and the second horizontal line HFL2 described with reference to FIG. 6.

The first source pattern 1670 may be arranged in an island shape. For example, the first source pattern 1670 may receive the driving voltage ELVDD from the intermediate pattern 1530, and may provide the driving voltage ELVDD to the first active pattern 1100 and the storage capacitor electrode 1340.

In an embodiment, the first source pattern 1670 may contact the first active pattern 1100, the storage capacitor electrode 1340, and the intermediate pattern 1530. For example, the first source pattern 1670 may contact the first active pattern 1100 through a fifth contact hole CNT5, may contact the storage capacitor electrode 1340 through the fourth contact hole CNT4, and may contact the intermediate pattern 1530 through the third contact hole CNT3. In an embodiment, the third, fourth, and fifth contact holes CNT3, CNT4, and CNT5 may be spaced apart from each other.

The fourth transfer pattern 1680 may be arranged in an island shape. The fourth transfer pattern 1680 may contact the first active pattern 1100. The fourth transfer pattern 1680 may receive the driving current and/or the anode initialization voltage AINT from the first active pattern 1100.

The second source pattern 1690 may be arranged in an island shape. For example, the second source pattern 1690 may receive the driving voltage ELVDD from the third source pattern 1730 and the driving voltage ELVDD to the intermediate pattern 1530.

In an embodiment, the second source pattern 1690 may contact the intermediate pattern 1530 and the third source pattern 1730. For example, the second source pattern 1690 may contact the third source pattern 1730 through a first contact hole CNT1, and may contact the intermediate pattern 1530 through a second contact hole CNT2.

A first via insulating layer VIA1 may cover the fourth conductive pattern 1600 and may be disposed on the second interlayer insulating layer ILD2. The first via insulating layer VIA1 may include an organic insulating material. For example, the first via insulating layer VIA1 may include a photoresist, a polyacrylic resin, a polyimide resin, an acrylic resin, or the like.

Figure 13:
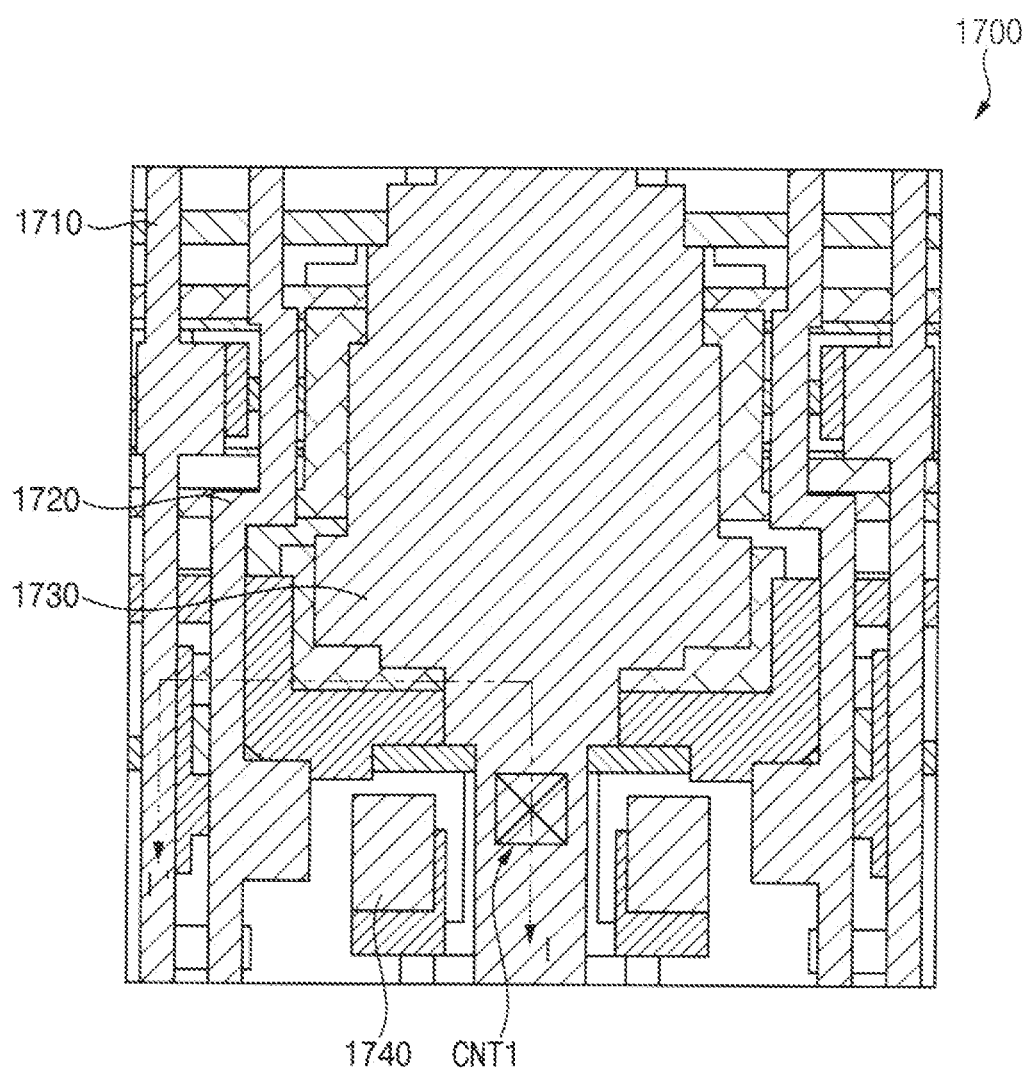

Referring to FIGS. 13 and 14, a fifth conductive pattern 1700 may be disposed on the first via insulating layer VIA1. The fifth conductive pattern 1700 may include a data line 1710, a first vertical line 1720, a third source pattern 1730, and a fifth transfer pattern 1740.

The data line 1710 may extend in the second direction D2. The data line 1710 may contact the first active pattern 1100. In an embodiment, the data voltage DATA may be provided to the first active pattern 1100 through the data line 1710. For example, the data line 1710 may correspond to any one of the first to fourth data lines DL1, DL2, DL3, and DL4 described with reference to FIG. 6.

The first vertical line 1720 may extend in the second direction D2. In an embodiment, the data voltage DATA may be transmitted through the first vertical line 1720. For example, the first vertical line 1720 may correspond to one of the first vertical line VFL1 and the second vertical line VFL2 described with reference to FIG. 6.

The third source pattern 1730 may extend in the second direction D2. In an embodiment, the driving voltage ELVDD may be transmitted through the third source pattern 1730. For example, the third source pattern 1730 may correspond to the driving voltage line PL described with reference to FIG. 6.

In an embodiment, the third source pattern 1730 may contact the second source pattern 1690 through the first contact hole CNT1.

In an embodiment, the first contact hole CNT1 may be formed through the first via insulating layer VIA1, the second contact hole CNT2 and the third contact hole CNT3 may be formed through the second interlayer insulation ILD2, the fourth contact hole CNT4 may be formed through the second interlayer insulating layer ILD2, the third gate insulating layer GI3, and the first interlayer insulating layer ILD1, and the fifth contact hole CNT5 may be formed through the second interlayer insulating layer ILD2, the third gate insulating layer GI3, the first interlayer insulating layer ILD1, the second gate insulating layer GI2, and the first gate insulating layer GI1. In other words, the first contact hole CNT1 may pass through the layer made of an organic insulating material, and the second, third, fourth, and fifth contact holes CNT2, CNT3, CNT4, and CNT5 may pass through the layers made of an inorganic insulating material. Accordingly, each of the plane areas of the second, third, fourth, and fifth contact holes CNT2, CNT3, CNT4, and CNT5 may be smaller than the plane area of the first contact hole CNT1.

The fifth transfer pattern 1740 may be arranged in an island shape. The fifth transfer pattern 1740 may contact the fourth transfer pattern 1680. The fifth transfer pattern 1740 may receive the driving current and/or the anode initialization voltage AINT from the fourth transfer pattern 1680, and may transfer the driving current and/or the anode initialization voltage AINT to the first pixel electrode ADE1.

In an embodiment, as shown in FIG. 14, the third source pattern 1730 may contact the second source pattern 1690 through the first contact hole CNT1, the second source pattern 1690 may contact the intermediate pattern 1530 through the second contact hole CNT2, and the intermediate pattern 1530 may contact the first source pattern 1670 through the third contact hole CNT3. Accordingly, the driving voltage ELVDD may be transmitted to the third source pattern 1730, the second source pattern 1690, the intermediate pattern 1530, and the first source pattern 1670. In addition, the first source pattern 1670 may contact the storage capacitor electrode 1340 through the fourth contact hole CNT4 and may contact the first active pattern 1100 through the fifth contact hole CNT5. Accordingly, the first source pattern 1670 may transfer the driving voltage ELVDD to the first active pattern 1100 and the storage capacitor electrode 1340.

The display device 11 may include the first source pattern 1670 and the intermediate pattern 1530 that transfer the driving voltage ELVDD. Accordingly, additional contact holes for electrically connecting the third source pattern 1730 to the first active pattern 1100 and the storage capacitor electrode 1340 may not be added in the first via insulating layer VIA1. In other words, the driving voltage ELVDD may be transferred to the first active pattern 1100 and the storage capacitor electrode 1340 through the first contact hole CNT1 formed in the first via insulating layer VIA1. Accordingly, the number of contact holes passing through the layer made of the organic insulating material may be relatively small. Therefore, the shape of the third source pattern 1730 may be designed relatively freely.

In addition, the intermediate pattern 1530 may be disposed to surround at least the portion of the node pattern 1640 on a plane, and the driving voltage ELVDD may be transmitted to the intermediate pattern 1530. Accordingly, the intermediate pattern 1530 may shield the node pattern 1640 from the first horizontal line 1660, the data line 1710, and the first vertical line 1720.

FIGS. 15, 16, 17, 18, 19, and 20 are layout diagrams illustrating another embodiment of the display device of FIG. 1. FIG. 21 is a cross-sectional view taken along line II-II' of FIG. 20.

Figure 15:
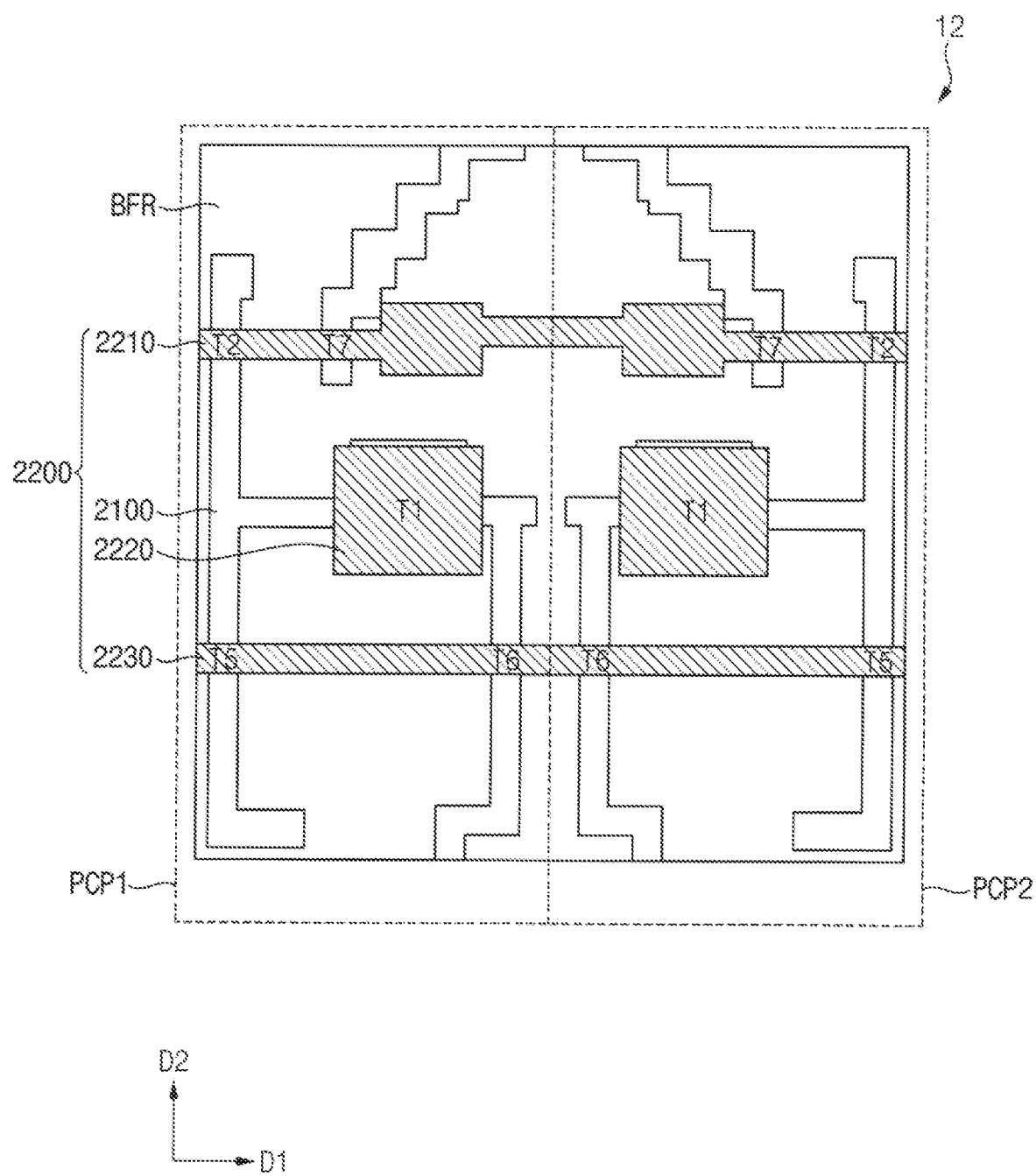
FIGS. 15, 16, 17, 18, 19, and 20 are layout diagrams illustrating another embodiment of the display device of FIG. 1.

Referring to FIGS. 15 and 21, a display device 12 according to another embodiment may include the first and second pixel circuit parts PCP1 and PCP2 arranged in the first direction D1. In an embodiment, the second pixel circuit part PCP2 may have a shape symmetrical to a shape of the first pixel circuit part PCP1. Hereinafter, the structure of the first pixel circuit part PCP1 will be described in detail. In addition, the display device 12 may be substantially equal to the display device 11 described with reference to FIGS. 7, 8, 9, 10, 11, 12, 13, and 14 except for the shape of a storage capacitor electrode 2340 and a second pattern 2530.

The substrate SUB may include glass, quartz, plastic, or the like, and the buffer layer BFR may be disposed on the substrate SUB.

The first active pattern 2100 may be disposed on the buffer layer BFR. In an embodiment, the first active pattern 2100 may include a silicon semiconductor. For example, the silicon semiconductor may include amorphous silicon, polycrystalline silicon, or the like. For example, the first active pattern 2100 may include the polycrystalline silicon formed by crystallizing the amorphous silicon.

In an embodiment, the first active pattern 2100 may be a first pattern receiving the driving voltage ELVDD. In other words, the driving voltage ELVDD may be provided to the first pattern.

The first gate insulating layer GI1 may cover the first active pattern 2100 and may be disposed on the substrate SUB.

The first conductive pattern 2200 may be disposed on the first gate insulating layer GI1. The first conductive pattern 2200 may include the first gate line 2210, the gate electrode 2220, and a second gate line 2230.

The first gate line 2210 may extend in the first direction D1. The first gate line 2210 may constitute the second transistor T2 together with the first active pattern 2100. In addition, the first gate line 2210 may constitute the seventh transistor T7 together with the first active pattern 2100.

The first gate electrode 2220 may be arranged in an island shape. The first gate electrode 2220 may form the first transistor T1 together with the first active pattern 2100.

The second gate line 2230 may extend in the first direction D1. The second gate line 2230 may constitute the fifth and sixth transistors T5 and T6 together with the first active pattern 2100.

For example, the first conductive pattern 2200 may include a metal, an alloy, a conductive metal oxide, a transparent conductive material, and the like.

The second gate insulating layer GI2 may cover the first conductive pattern 2200 and may be disposed on the first gate insulating layer GI1. The second gate insulating layer GI2 may include an inorganic insulating material.

Figure 16:
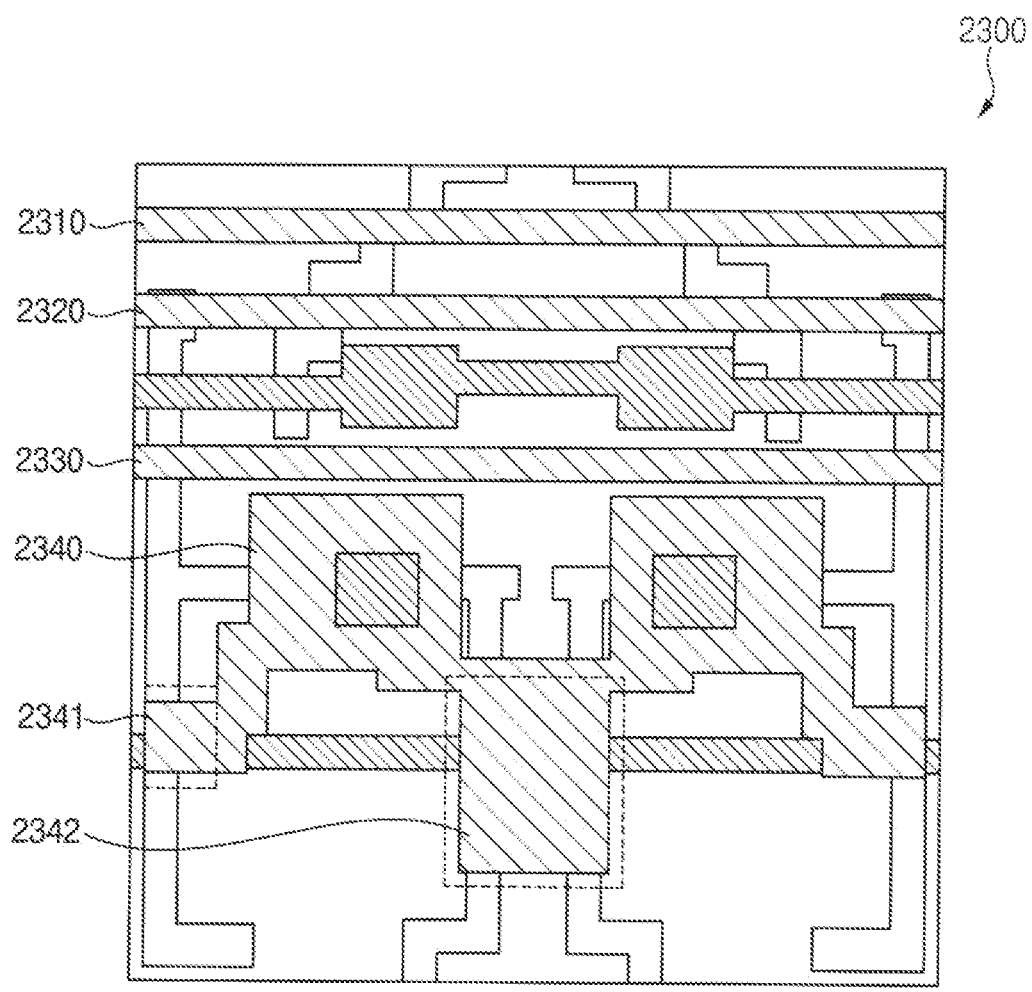
Figure 16:
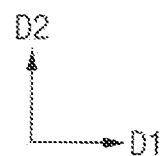

Referring to FIGS. 16 and 21, a second conductive pattern 2300 may be disposed on the second gate insulating layer GI2. The second conductive pattern 2300 may include the gate initialization voltage line 2310, the third gate line 2320, the fourth gate line 2330, and the storage capacitor electrode 2340.

The gate initialization voltage line 2310 may extend in the first direction D1. The gate initialization voltage VINT may be provided to the gate initialization voltage line 2310.

The third gate line 2320 may extend in the first direction D1. The third gate signal GI may be provided to the third gate line 2320.

The fourth gate line 2330 may extend in the first direction D1. The second gate signal GC may be provided to the fourth gate line 2330.

The storage capacitor electrode 2340 may overlap the first gate electrode 2220 and may extend in the first direction D1. For example, the storage capacitor electrode 2340 may constitute the storage capacitor CST together with the first gate electrode 2220. In addition, a hole through the storage capacitor electrode 2340 may be formed in the storage capacitor electrode 2340, and the first gate electrode 2220 may be exposed through the hole.

In an embodiment, the storage capacitor electrode 2340 may be an intermediate pattern receiving the driving voltage ELVDD. In other words, the driving voltage ELVDD may be provided to the intermediate pattern. For example, the intermediate pattern may include a first exposed portion 2341 exposed through a fourth contact hole CNT4 and a second exposed portion 2342 exposed through a second contact hole CNT2. The first exposed portion 2341 may overlap the second gate line 2230. The intermediate pattern may contact the first source pattern 2670 in the first exposed portion 2341. In addition, the second exposed portion 2342 may contact the second source pattern 2690. The intermediate pattern may contact the second source pattern 2690 in the second exposed portion 2342.

For example, the second conductive pattern 2300 may include a metal, an alloy, a conductive metal oxide, a transparent conductive material, and the like.

The first interlayer insulating layer ILD1 may cover the second conductive pattern 2300 and may be disposed on the second gate insulating layer GI2. The first interlayer insulating layer ILD1 may include an inorganic insulating material.

Figure 17:
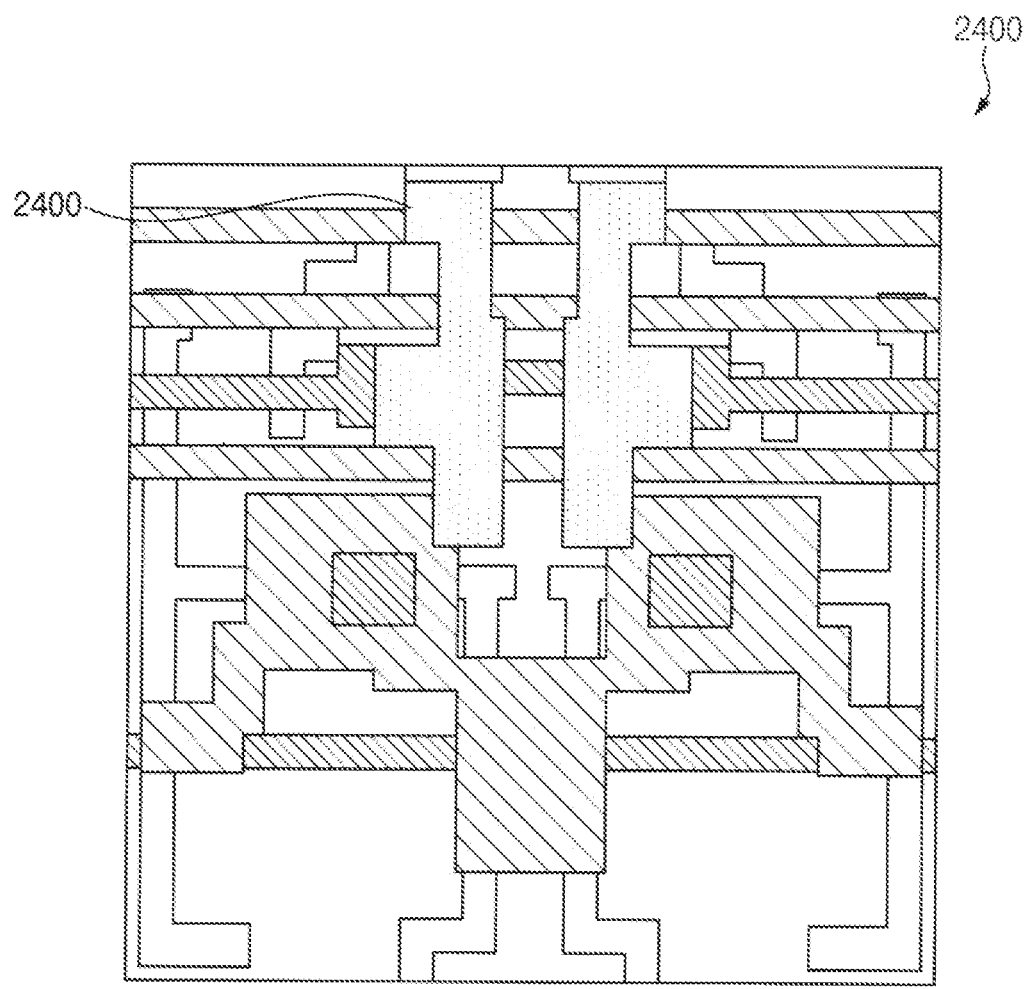

Referring to FIGS. 17 and 21, the second active pattern 2400 may be disposed on the first interlayer insulating layer ILD1. For example, the second active pattern 2400 may overlap the third gate line 2320 and the fourth gate line 2330. The second active pattern 1400 may include an oxide semiconductor.

The third gate insulating layer GI3 may cover the second active pattern 2400 and may be disposed on the first interlayer insulating layer ILD1. The third gate insulating layer GI3 may include an inorganic insulating material.

Figure 18:
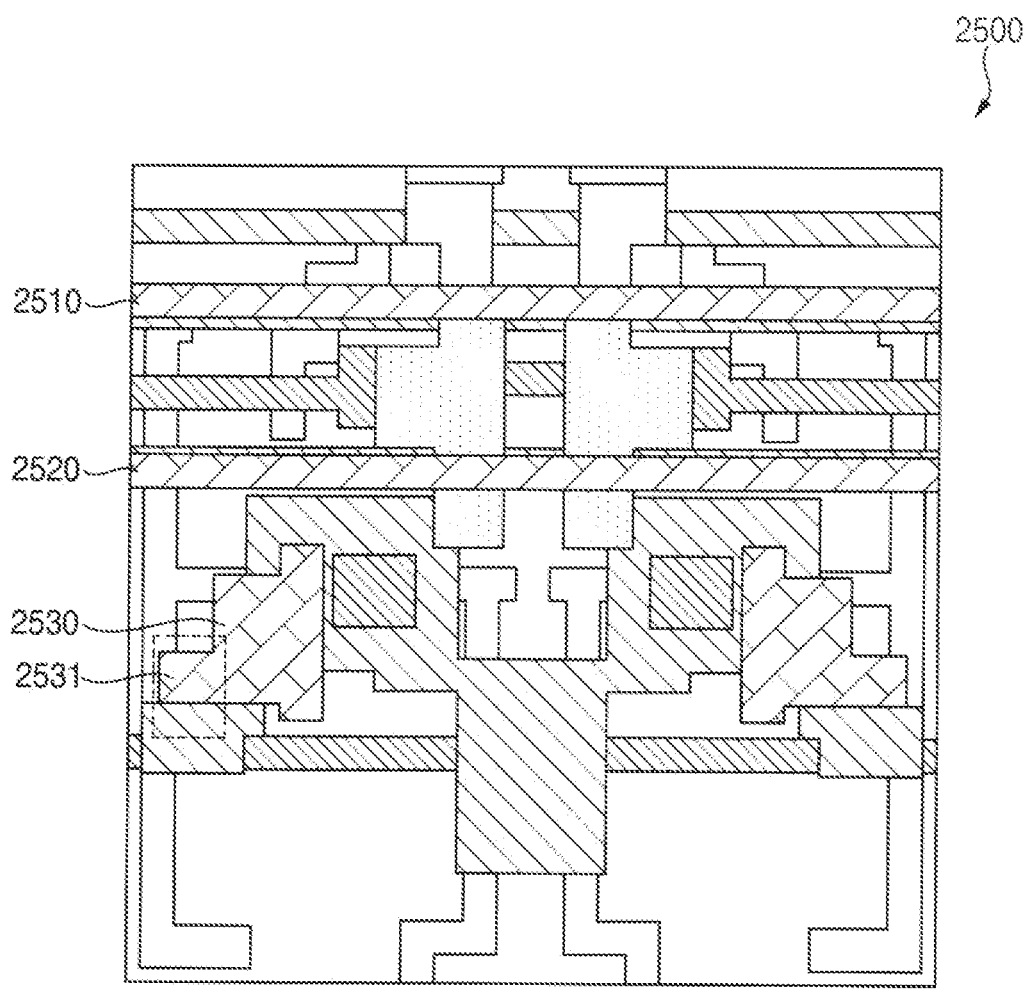

Referring to FIGS. 18 and 21, a third conductive pattern 2500 may be disposed on the third gate insulating layer GI3. The third conductive pattern 2500 may include the fifth gate line 2510, the sixth gate line 2520, and the second pattern 2530.

The fifth gate line 2510 may extend in the first direction D1. The fifth gate line 2510 may constitute the fourth transistor T4 together with the third gate line 2320 and the second active pattern 2400.

The sixth gate line 2520 may extend in the first direction D1. The sixth gate line 2520 may constitute the third transistor T3 together with the fourth gate line 2330 and the second active pattern 2400.

In an embodiment, the second pattern 2530 may be arranged in an island shape and may be provided with the driving voltage ELVDD. In other words, the driving voltage EVLDD may be provided to the second pattern 2530. For example, the second pattern 2530 may include a third exposed portion 2531 exposed through a third contact hole CNT3. The third exposed portion 2531 may be adjacent to the first exposed portion 2341, and may be spaced apart from the first exposed portion 2341 on a plane. The second pattern 2530 may contact the first source pattern 1670 in the third exposed portion 2531.

For example, the third conductive pattern 2500 may include a metal, an alloy, a conductive metal oxide, a transparent conductive material, and the like.

The second interlayer insulating layer ILD2 may cover the third conductive pattern 2500 and may be disposed on the third gate insulating layer GI3. The second interlayer insulating layer ILD2 may include an inorganic insulating material.

Figure 19:
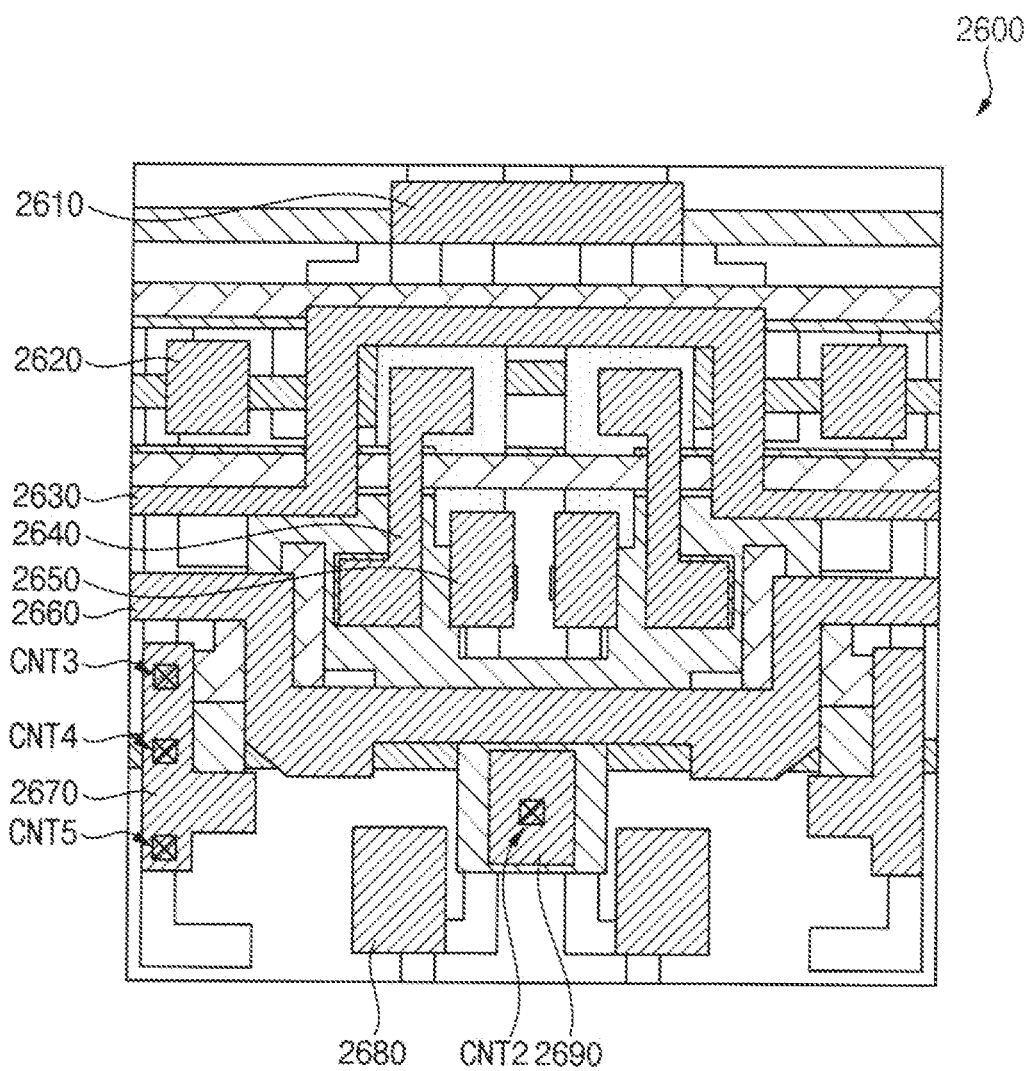

Referring to FIGS. 19 and 21, the fourth conductive pattern 2600 may be disposed on the second interlayer insulating layer ILD2. The fourth conductive pattern 2600 may include the first transfer pattern 2610, the second transfer pattern 2620, the anode initialization voltage line 2630, the node pattern 2640, the third transfer pattern 2650, the first horizontal line 2660, the first source pattern 2670, the fourth transfer pattern 2680, and the second source pattern 2690. However, since the first transfer pattern 2610, the second transfer pattern 2620, the anode initialization voltage line 2630, the node pattern 2640, the third transfer pattern 2650, and the first horizontal line 2660, and the fourth transfer pattern 2680 are substantially equal as described above, the first source pattern 2670 and the second source pattern 2690 will be described below.

In an embodiment, the second pattern 2530 may be disposed to surround at least a portion of the node pattern 2640 on a plane.

The first source pattern 2670 may be arranged in an island shape. For example, the first source pattern 2670 may receive the driving voltage ELVDD from the storage capacitor electrode 2340, and may transfer the driving voltage ELVDD to the first active pattern 2100 and the second pattern 2530.

In an embodiment, the first source pattern 2670 may contact the first active pattern 2100, the storage capacitor electrode 2340, and the second pattern 2530. For example, the first source pattern 2670 may contact the first active pattern 2100 through a fifth contact hole CNT5, may contact the storage capacitor electrode 2340 through the fourth contact hole CNT4, and may contact the second pattern 2530 through the third contact hole CNT3. In an embodiment, the third, fourth, and fifth contact holes CNT3, CNT4, and CNT5 may be spaced apart from each other.

The second source pattern 2690 may be arranged in an island shape. For example, the second source pattern 2690 may receive the driving voltage ELVDD from the third source pattern 2730 and may transfer the driving voltage ELVDD to the storage capacitor electrode 2340.

In an embodiment, the second source pattern 2690 may contact the storage capacitor electrode 2340 and the third source pattern 2730. For example, the second source pattern 2690 may contact the third source pattern 2730 through a first contact hole CNT1, and may contact the storage capacitor electrode 2340 through the second contact hole CNT2. The first contact hole CNT1 may be formed through the first via insulating layer VIA1, the second contact hole CNT2 may be formed through the second interlayer insulating layer ILD2, the third gate insulating layer GI3, and the first interlayer insulating layer ILD1, the third contact hole CNT3 may be formed through the second interlayer insulating layer ILD2, the fourth contact hole CNT4 may be formed through the second interlayer insulating layer ILD2, the third gate insulating layer GI3, and the first interlayer insulating layer ILD1, and the fifth contact hole CNT5 may be formed through the second interlayer insulating layer ILD2, the third gate insulating layer GI3, the first interlayer insulating layer ILD1, the second gate insulating layer GI2, and the first gate insulating layer GI1.

The first via insulating layer VIA1 may cover the fourth conductive pattern 2600 and may be disposed on the second interlayer insulating layer ILD2. The first via insulating layer VIA1 may include an organic insulating material.

Figure 20:
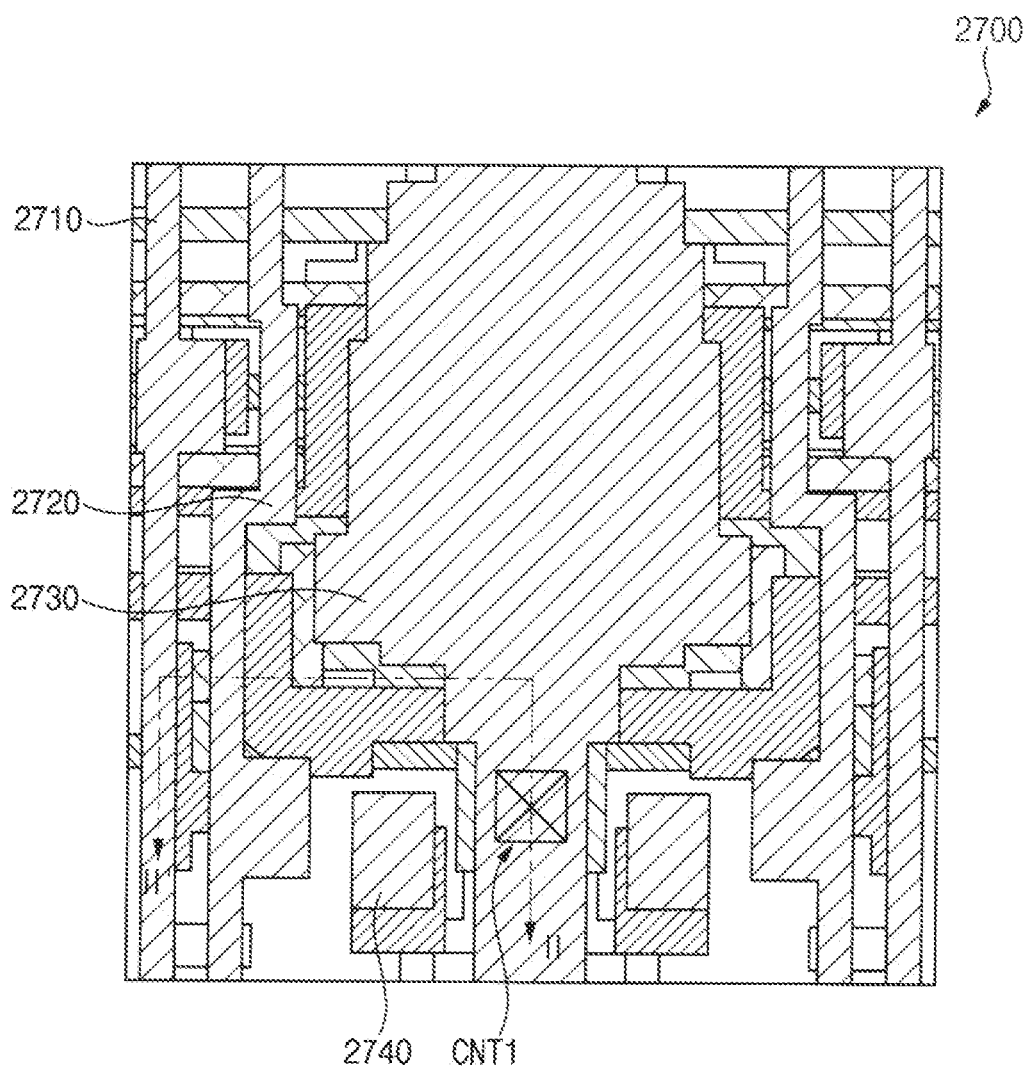
Figure 21:
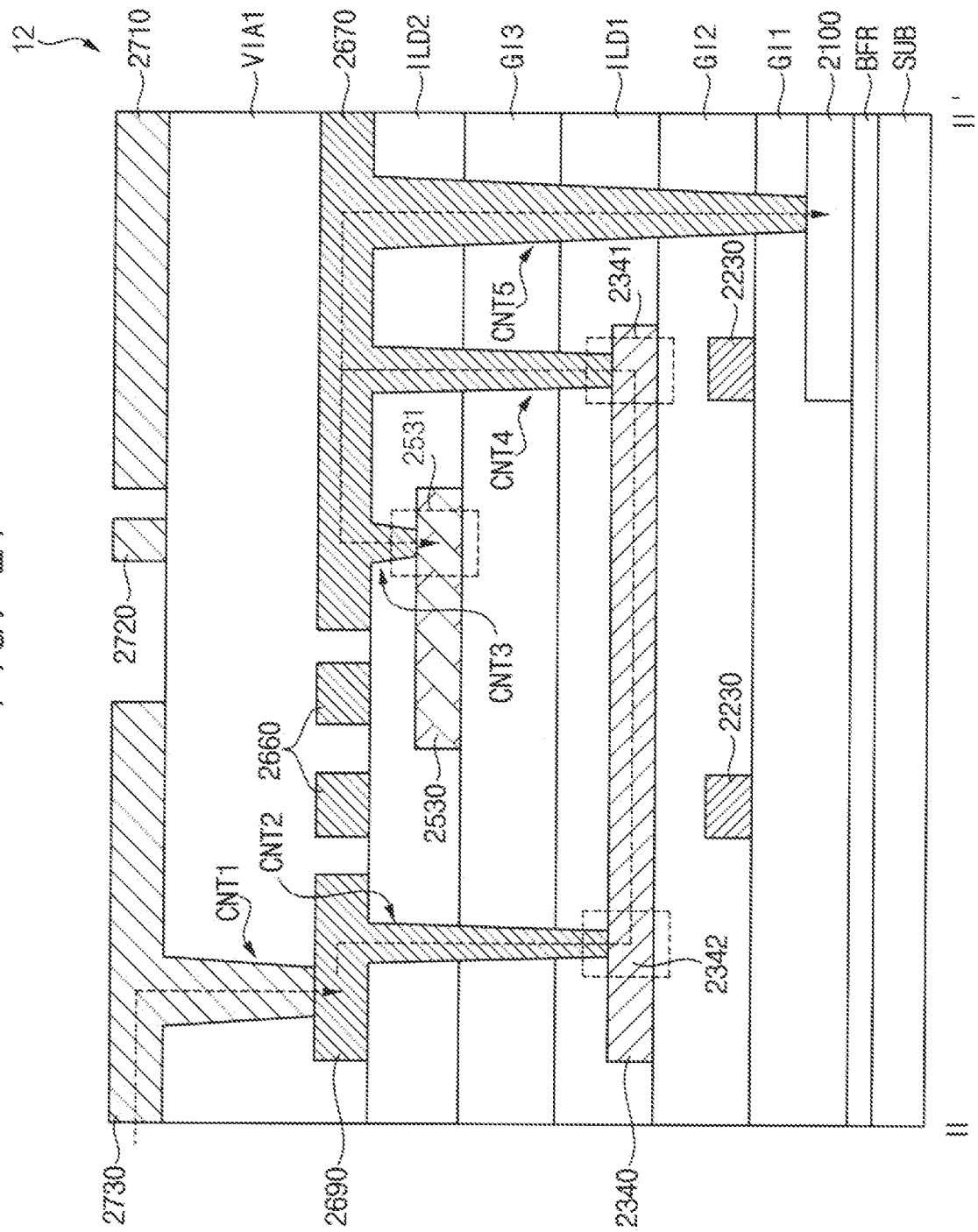
FIG. 21 is a cross-sectional view taken along line II-II' of FIG. 20.

Referring to FIGS. 20 and 21, a fifth conductive pattern 2700 may be disposed on the first via insulating layer VIA1. The fifth conductive pattern 2700 may include the data line 2710, the first vertical line 2720, the third source pattern 2730, and the fifth transfer pattern 2740. However, the fifth conductive pattern 2700 may be substantially equal to the fifth conductive pattern 1700 described with reference to FIG. 13.

FIGS. 22, 23, 24, 25, and FIG. 26 are layout diagrams illustrating still another embodiment of the display device of FIG. 1. FIG. 27 is a cross-sectional view taken along line III-III' of FIG. 26.

Figure 22:
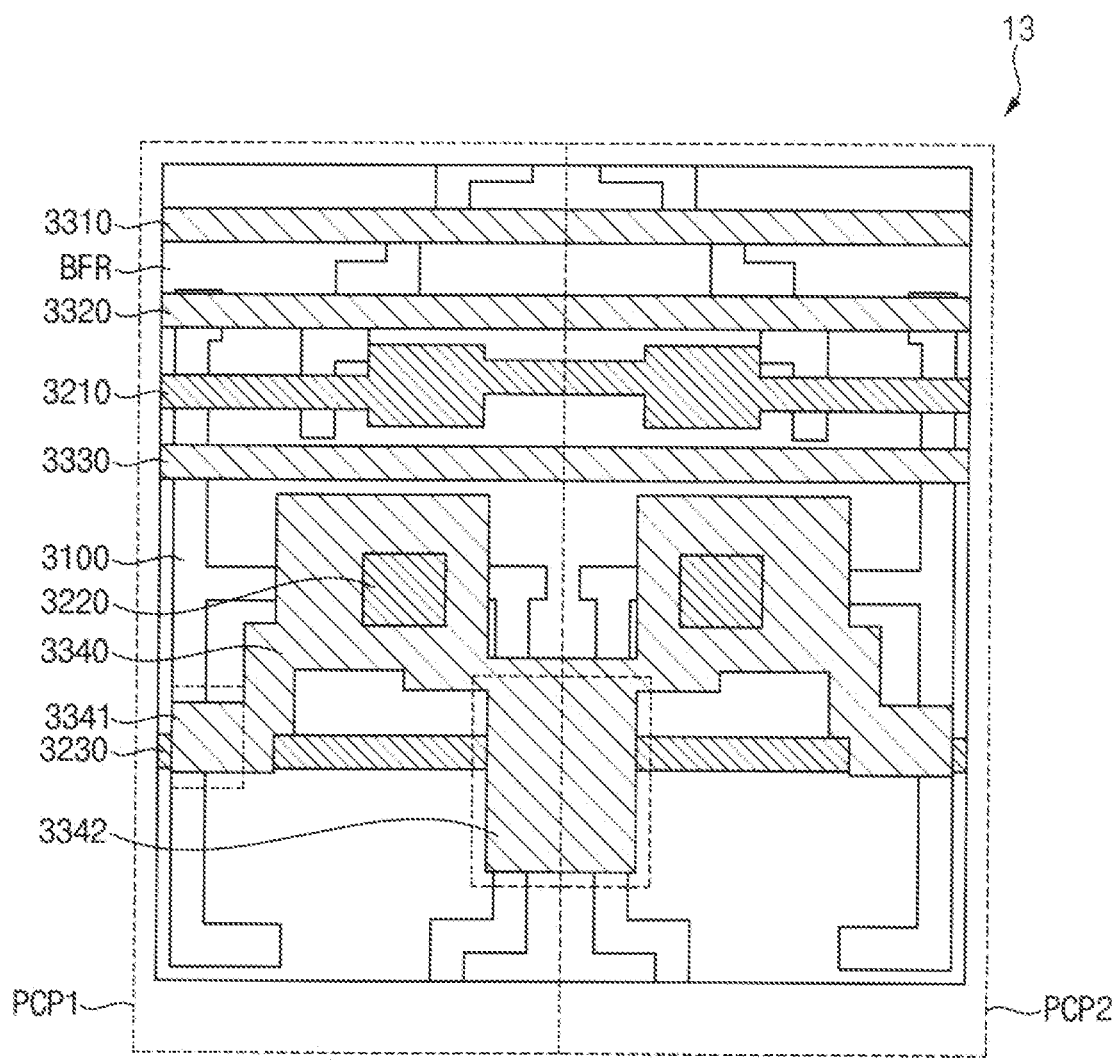
FIGS. 22, 23, 24, 25, and 26 are layout diagrams illustrating still another embodiment of the display device of FIG. 1.

Referring to FIGS. 22 and 27, a display device 13 according to still another embodiment may include the first and second pixel circuit parts PCP1 and PCP2 arranged in the first direction D1. In an embodiment, the second pixel circuit part PCP2 may have a shape symmetrical to a shape of the first pixel circuit part PCP1. Hereinafter, the structure of the first pixel circuit unit PCP1 will be described in detail.

In addition, the display device 13 may be substantially the same as the display device 12 described with reference to FIGS. 15, 16, 17, 18, 19, 20, and 21 except for a second pattern 3420.

The substrate SUB may include glass, quartz, plastic, or the like, and the buffer layer BFR may be disposed on the substrate SUB.

The first active pattern 3100 may be disposed on the buffer layer BFR. In one embodiment, the first active pattern 3100 may include a silicon semiconductor.

In an embodiment, the first active pattern 3100 may be a first pattern receiving the driving voltage ELVDD. In other words, the driving voltage ELVDD may be provided to the first pattern.

The first gate insulating layer GI1 may cover the first active pattern 3100 and may be disposed on the substrate SUB.

The first conductive pattern may be disposed on the first gate insulating layer GI1. The first conductive pattern may include the first gate line 3210, the gate electrode 3220, and the second gate line 3230. However, the first gate line 3210, the gate electrode 3220, and the second gate line 3230 may be substantially equal to the first gate line 2210, the gate electrode 2220, and the second gate line 2230 described with reference to FIG. 15.

The second gate insulating layer GI2 may cover the first conductive pattern and may be disposed on the first gate insulating layer GI1. The second gate insulating layer GI2 may include an inorganic insulating material.

A second conductive pattern may be disposed on the second gate insulating layer GI2. The second conductive pattern may include the gate initialization voltage line 3310, the third gate line 3320, the fourth gate line 3330, and the storage capacitor electrode 3340. However, the gate initialization voltage line 3310, the third gate line 3320, the fourth gate line 3330, and the storage capacitor electrode 3340 may substantially equal to the gate initialization voltage line 2310, the third gate line 2320, the fourth gate line 2330, and the storage capacitor electrode 2340 described with reference to FIG. 16. For example, the storage capacitor electrode 2340 may include a first exposed portion 3241 and a second exposed portion 3342, and may be an intermediate pattern receiving the driving voltage.

The first interlayer insulating layer ILD1 may cover the second conductive pattern and may be disposed on the second gate insulating layer GI2. The first interlayer insulating layer ILD1 may include an inorganic insulating material.

Figure 23:
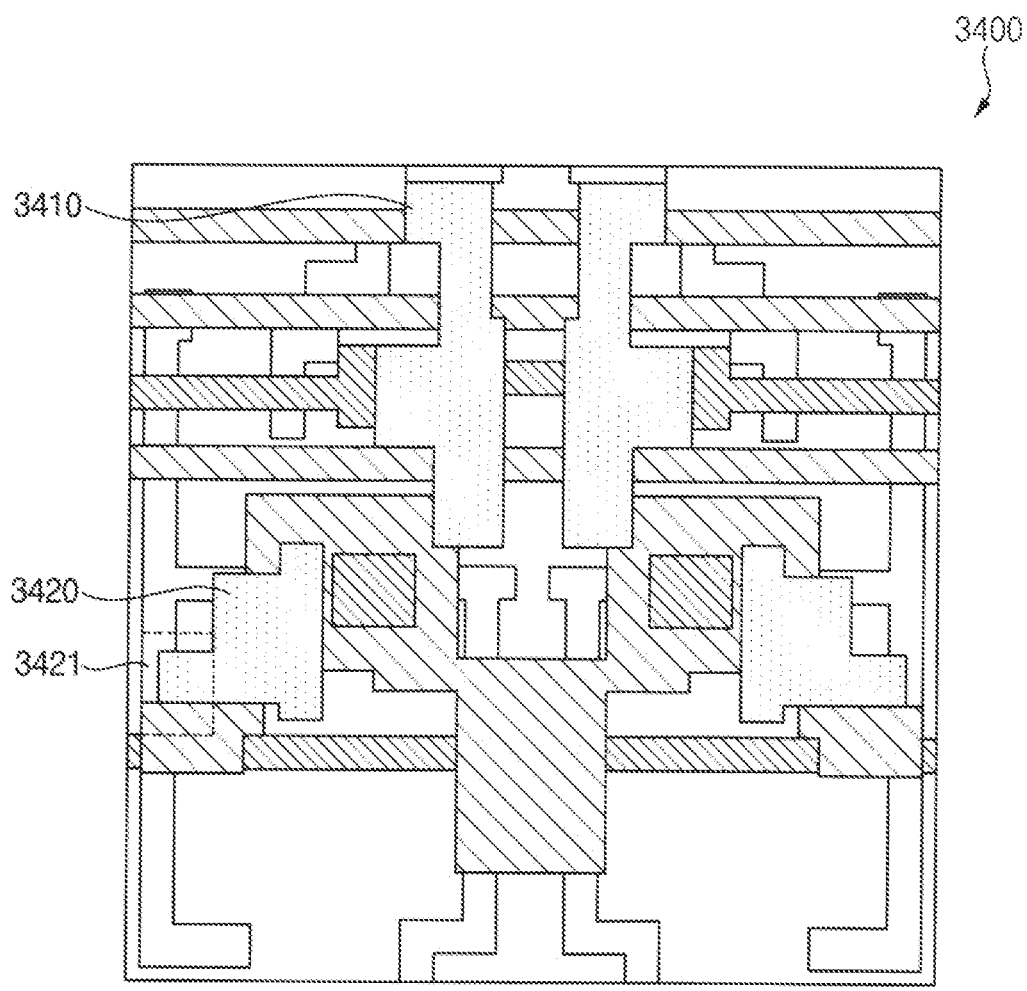

Referring to FIGS. 23 and 27, the second active pattern 3410 and the second pattern 3420 may be disposed on the first interlayer insulating layer ILD1.

The second active pattern 3410 may include an oxide semiconductor. For example, the second active pattern 3410 may overlap the third gate line 3320 and the fourth gate line 3330. In an embodiment, the second active pattern 3410 may be disposed on a different layer from the first active pattern 3100 and may not overlap the first active pattern 3100. In other words, the second active pattern 3410 may be formed separately from the first active pattern 3100.

The second pattern 3420 may be formed together with the second active pattern 3410. For example, the second pattern 3420 may include an oxide semiconductor.

In an embodiment, the second pattern 3420 may be arranged in an island shape and may be provided with the driving voltage ELVDD. In other words, the driving voltage ELVDD may be provided to the second pattern 3420. For example, the second pattern 3420 may include a third exposed portion 3421 exposed by a third contact hole CNT3. The third exposed part 3421 may be adjacent to the first exposed portion 3241 and may be spaced apart from the first exposed portion 3241 on a plane. The second pattern 3420 may contact the first source pattern 3670 in the third exposed portion 3421.

The third gate insulating layer GI3 may cover the second active pattern 2400 and may be disposed on the first interlayer insulating layer ILD1. The third gate insulating layer GI3 may include an inorganic insulating material.

Figure 24:
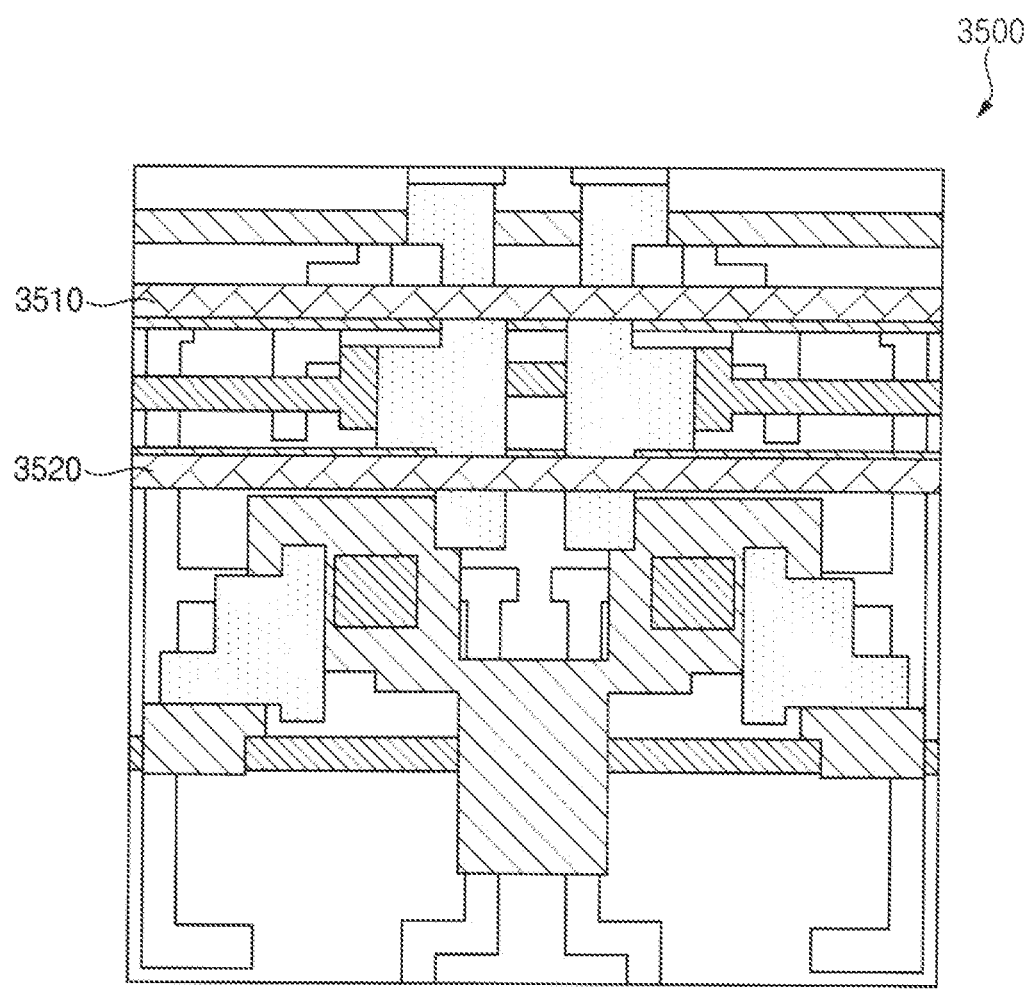

Referring to FIGS. 24 and 27, a third conductive pattern 3500 may be disposed on the third gate insulating layer GI3. The third conductive pattern 3500 may include the fifth gate line 3510 and the sixth gate line 3520. However, the fifth gate line 3510 and the sixth gate line 3520 may be substantially equal to the fifth gate line 2510 and the sixth gate line 2520 described with reference to FIG. 18.

The second interlayer insulating layer ILD2 may cover the third conductive pattern 3500 and may be disposed on the third gate insulating layer GI3. The second interlayer insulating layer ILD2 may include an inorganic insulating material.

Figure 25:
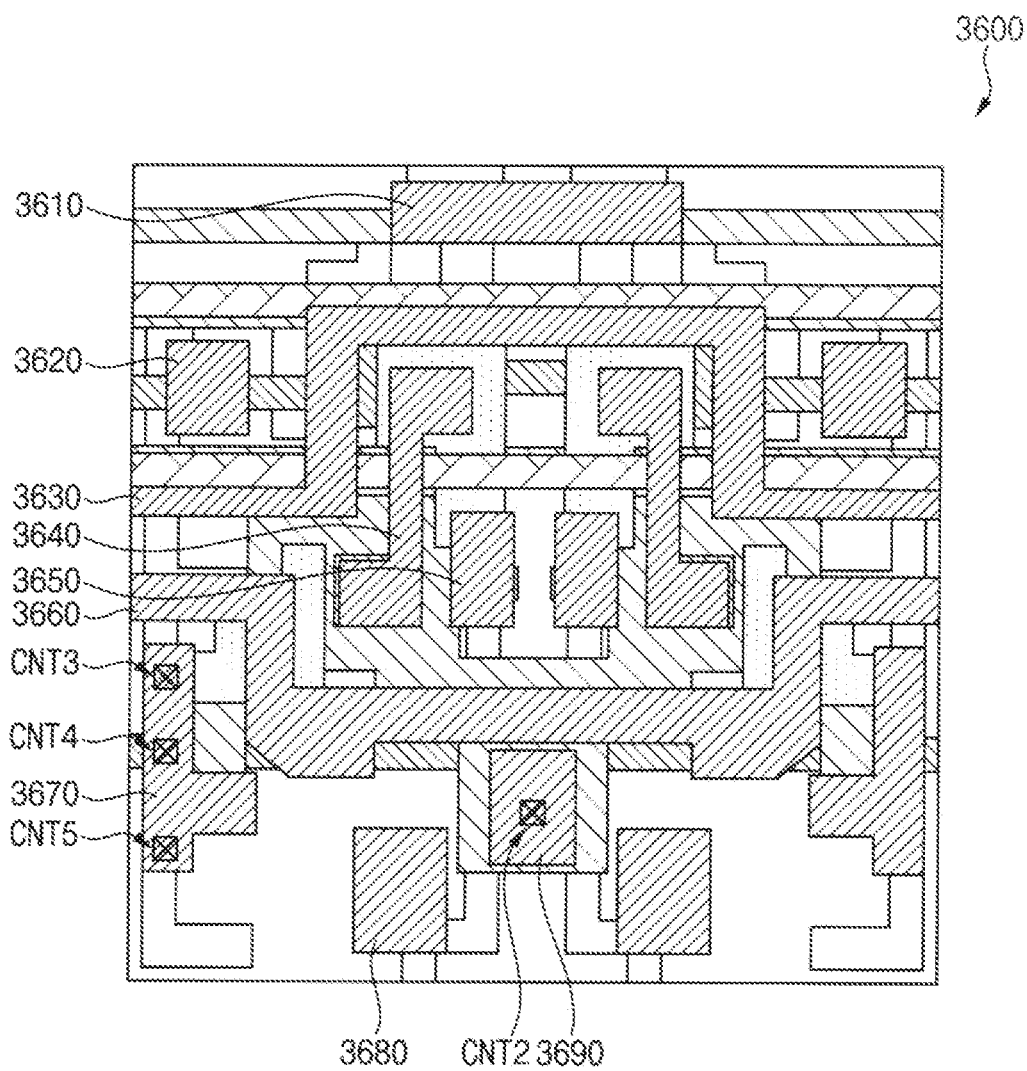

Referring to FIGS. 25 and 27, the fourth conductive pattern 3600 may be disposed on the second interlayer insulating layer ILD2. The fourth conductive pattern 3600 may include the first transfer pattern 3610, the second transfer pattern 3620, the anode initialization voltage line 3630, the node pattern 3640, the third transfer pattern 3650, the first horizontal line 3660, the first source pattern 3670, the fourth transfer pattern 3680, and the second source pattern 3690. However, except for the first source pattern 3670, the fourth conductive pattern 3600 may be substantially equal to the fourth conductive pattern 2600 described with reference to FIG. 19.

The first source pattern 3670 may be arranged in an island shape. For example, the first source pattern 3670 may receive the driving voltage ELVDD from the storage capacitor electrode 3340, and may transfer the driving voltage ELVDD to the first active pattern 3100 and the second pattern 3420.

In an embodiment, the first source pattern 3670 may contact the first active pattern 3100, the storage capacitor electrode 3340, and the second pattern 3420. For example, the first source pattern 3670 may contact the first active pattern 3100 through a fifth contact hole CNT5, may contact the storage capacitor electrode 3340 through a fourth contact hole CNT4, and may contact the second pattern 3420 through the third contact hole CNT3. In an embodiment, the third, fourth, and fifth contact holes CNT3, CNT4, and CNT5 may be spaced apart from each other. The third contact hole CNT3 may be formed through the second interlayer insulating layer ILD2 and the third gate insulating layer GI3, the fourth contact hole CNT4 may be formed through the second interlayer insulating layer ILD2, the third gate insulating layer GI3, and the first interlayer insulating layer ILD1, and the fifth contact hole CNT5 may be formed through the second interlayer insulating layer ILD2, the third gate insulating layer GI3, the first interlayer insulating layer ILD1, the second gate insulating layer GI2, and the first gate insulating layer GI1.

The first via insulating layer VIA1 may cover the fourth conductive pattern 2600 and may be disposed on the second interlayer insulating layer ILD2. The first via insulating layer VIA1 may include an organic insulating material.

Figure 26:
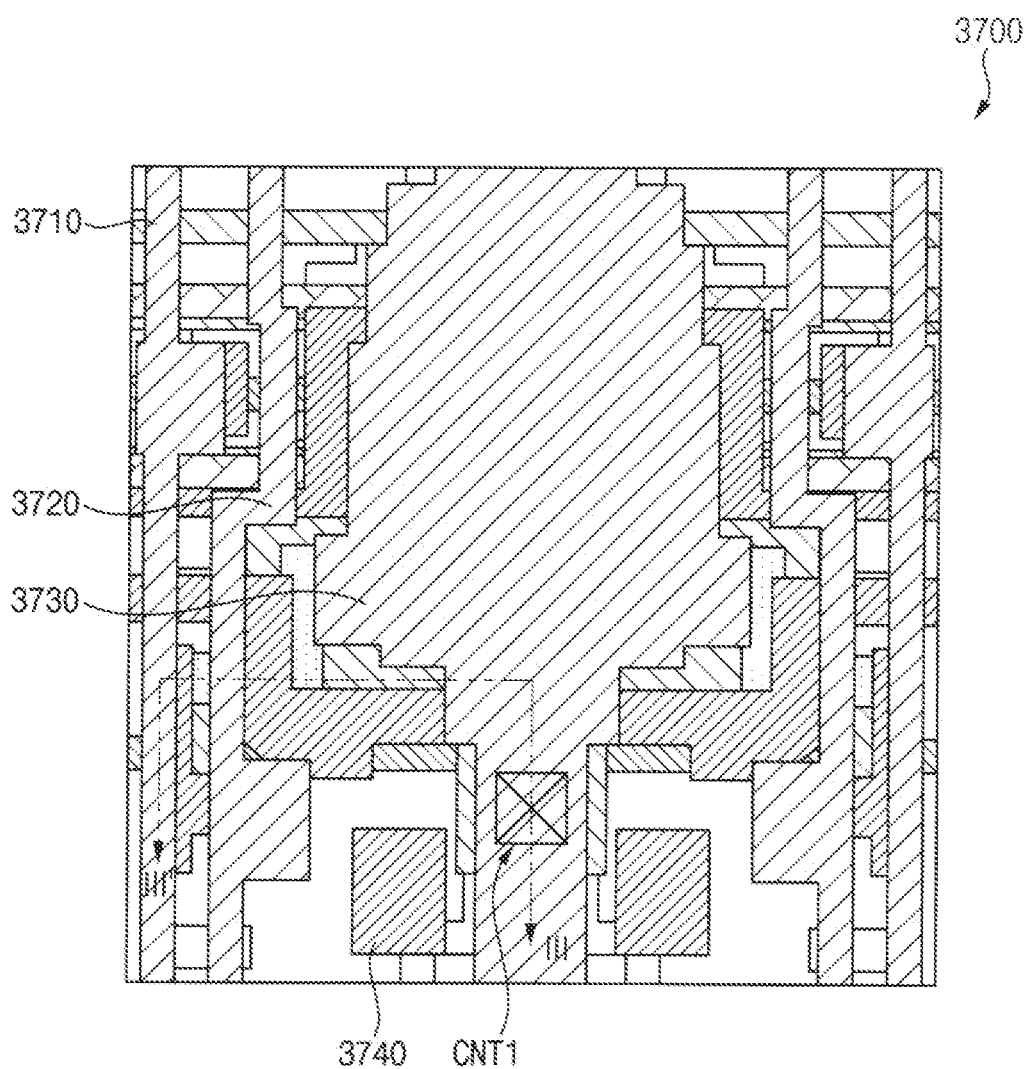
Figure 27:
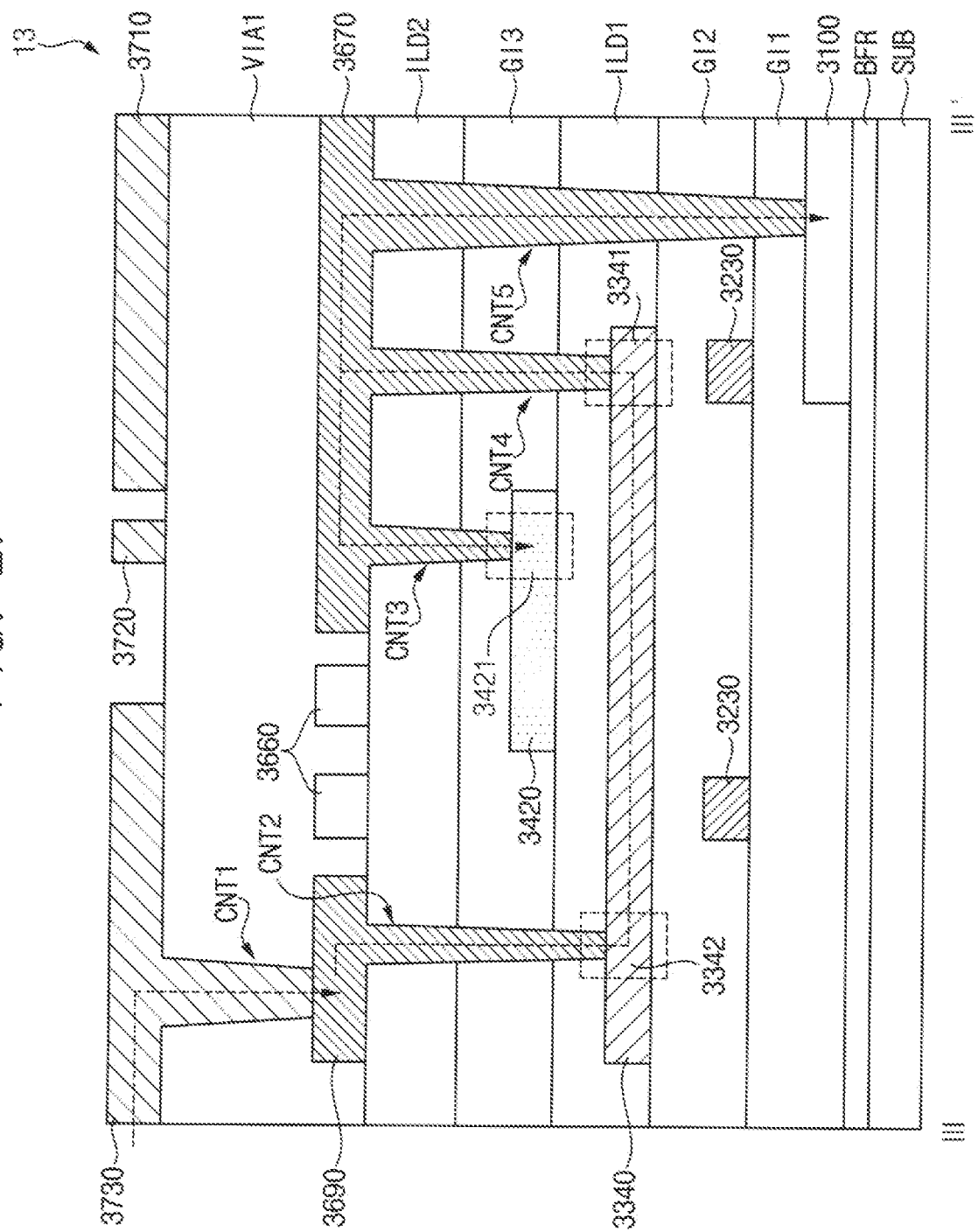
FIG. 27 is a cross-sectional view taken along line III-III' of FIG. 26.

Referring to FIGS. 26 and 27, a fifth conductive pattern 3700 may be disposed on the first via insulating layer VIA1. The fifth conductive pattern 3700 may include the data line 3710, the first vertical line 3720, the third source pattern 3730, and the fifth transfer pattern 3740. However, the fifth conductive pattern 3700 may be substantially equal to the fifth conductive pattern 3700 described with reference to FIG. 20.

Figure 33:
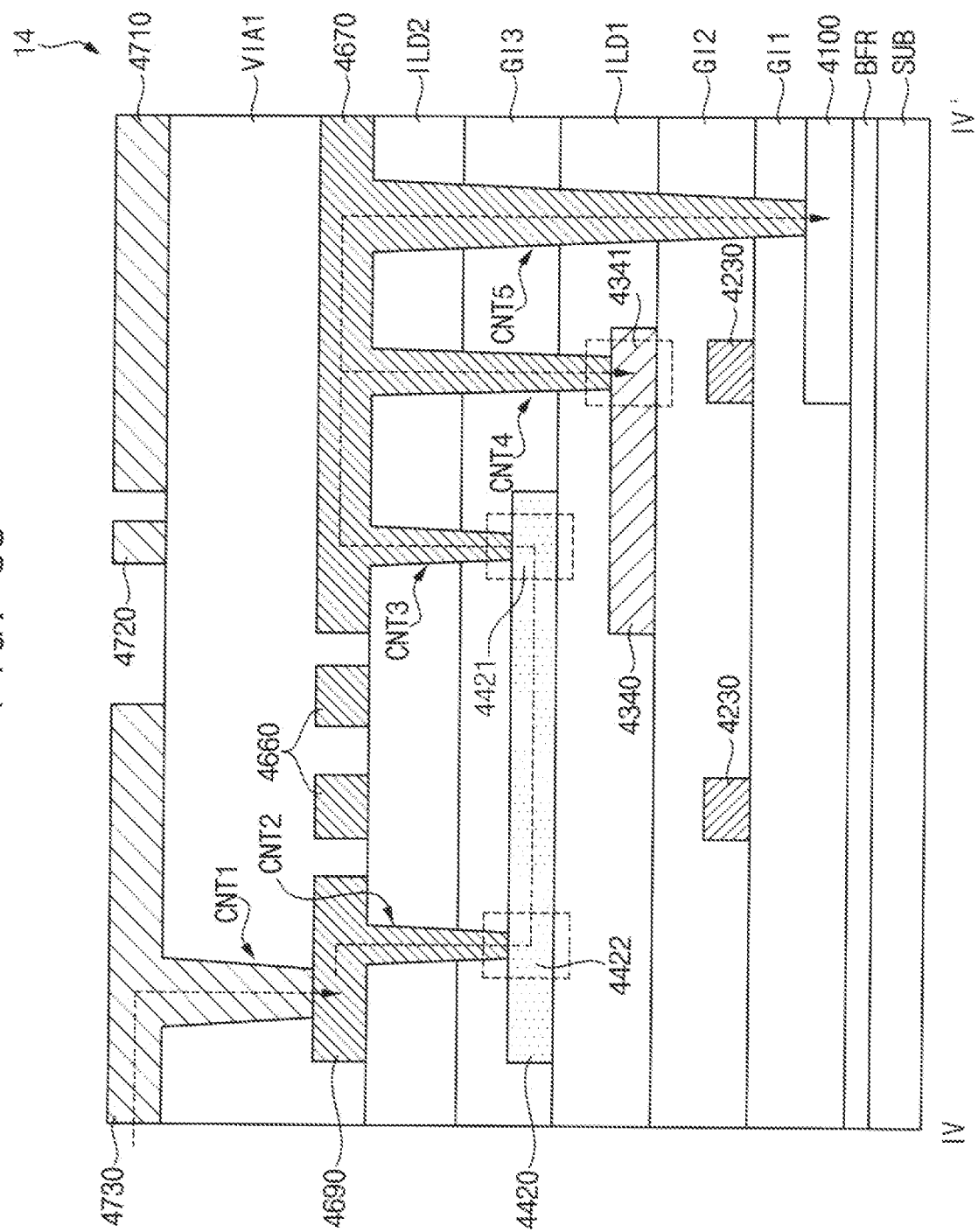
FIG. 33 is a cross-sectional view taken along line IV-IV' of FIG. 32.

FIGS. 28, 29, 30, 31, and 32 are layout diagrams illustrating still another embodiment of the display device of FIG. 1. FIG. 33 is a cross-sectional view taken along line IV-IV' of FIG. 32.

Figure 28:
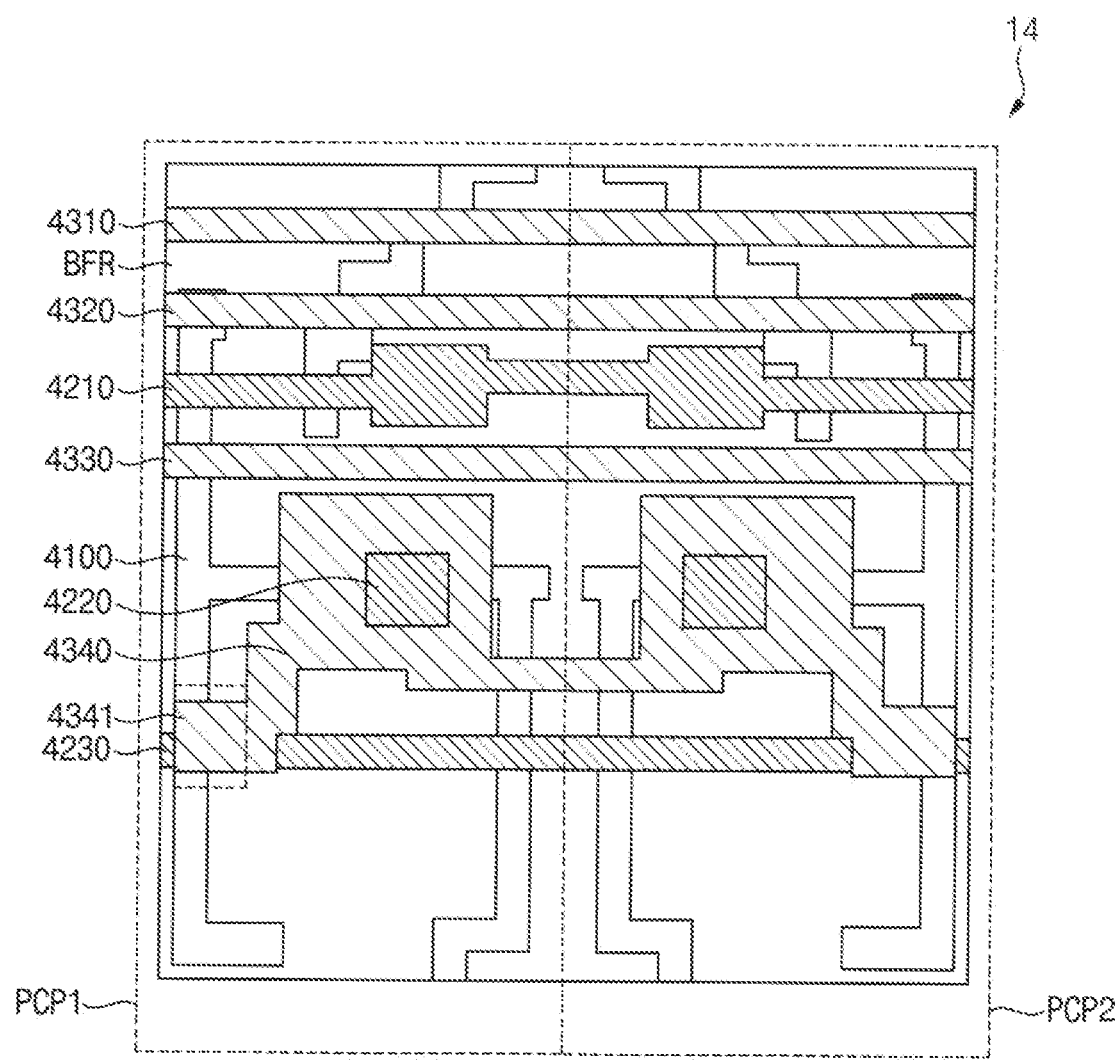
FIGS. 28, 29, 30, 31, and 32 are layout diagrams illustrating still another embodiment of the display device of FIG. 1.

Referring to FIGS. 28 and 33, a display device 14 according to still another embodiment may include the first and second pixel circuit parts PCP1 and PCP2 arranged in the first direction D1. In an embodiment, the second pixel circuit part PCP2 may have a shape symmetrical to a shape of the first pixel circuit part PCP1. Hereinafter, the structure of the first pixel circuit part PCP1 will be described in detail. In addition, the display device 14 may be substantially equal to the display device 13 described with reference to FIGS. 22, 23, 24, 25, 26, and 27 except for a storage capacitor electrode 4340 and an intermediate pattern 4420.

The substrate SUB may include glass, quartz, plastic, or the like, and the buffer layer BFR may be disposed on the substrate SUB.

The first active pattern 4100 may be disposed on the buffer layer BFR. In an embodiment, the first active pattern 4100 may include a silicon semiconductor.

The first active pattern 4100 may be disposed on the buffer layer BFR. In an embodiment, the first active pattern 4100 may include a silicon semiconductor.

The first gate insulating layer GI1 may cover the first active pattern 4100 and may be disposed on the substrate SUB.

The first conductive pattern may be disposed on the first gate insulating layer GI1. The first conductive pattern may include the first gate line 4210, the gate electrode 4220, and the second gate line 4230. However, the first gate line 4210, the gate electrode 4220, and the second gate line 4230 may be substantially equal to the second gate line 1210, the gate electrode 1220, and the first gate line 1230 described with reference to FIG. 8.

The second gate insulating layer GI2 may cover the first conductive pattern and may be disposed on the first gate insulating layer GI1. The second gate insulating layer GI2 may include an inorganic insulating material.

The second conductive pattern may be disposed on the second gate insulating layer GI2. The second conductive pattern may include the gate initialization voltage line 4310, the third gate line 4320, the fourth gate line 4330, and the storage capacitor electrode 4340. However, the gate initialization voltage line 4310, the third gate line 4320, the fourth gate line 4330, and the storage capacitor electrode 4340 may be substantially equal to the gate initialization voltage line 1310, the third gate line 1320, the fourth gate line 1330, and the storage capacitor electrode 1340 described with reference to FIG. 9. For example, the storage capacitor electrode 4340 may include a first exposed portion 441 and may be a second pattern receiving the driving voltage.

The first interlayer insulating layer ILD1 may cover the second conductive pattern and may be disposed on the second gate insulating layer GI2. The first interlayer insulating layer ILD1 may include an inorganic insulating material.

Figure 29:
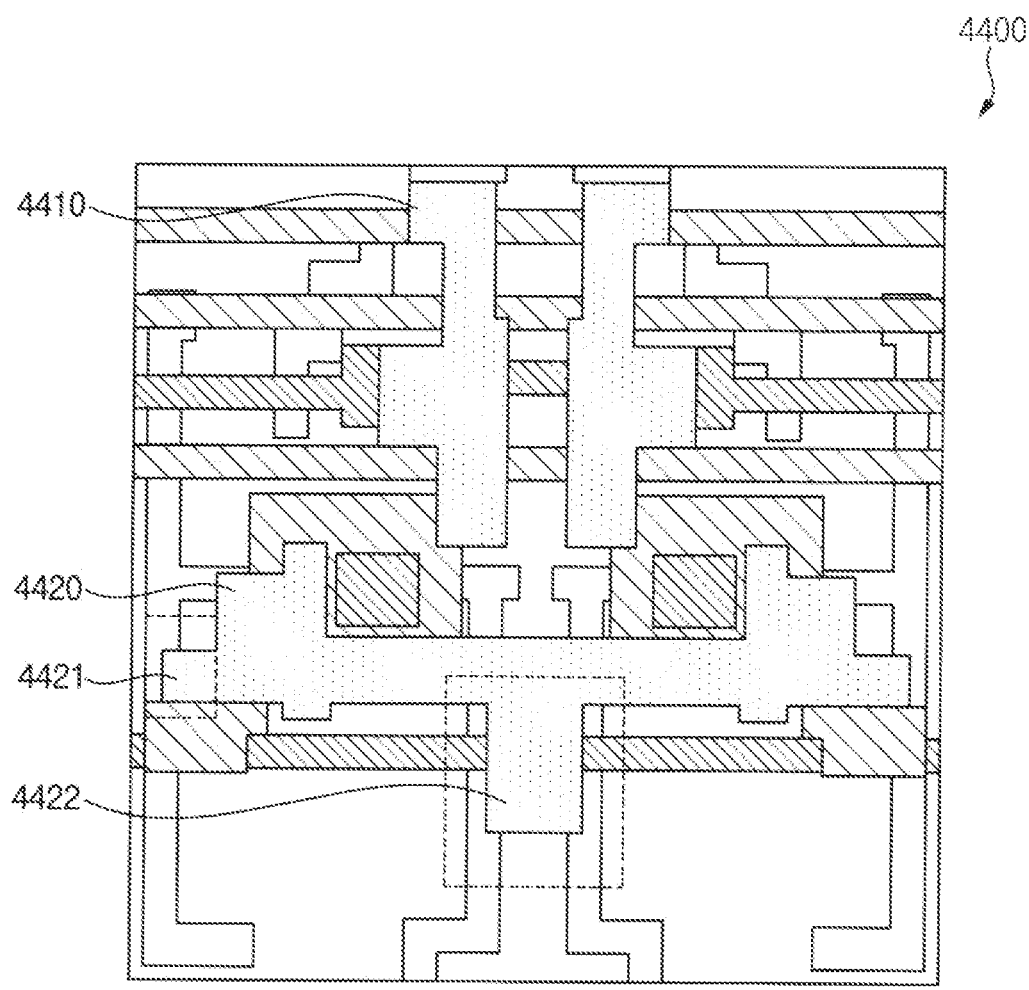

Referring to FIGS. 29 and 33, the second active pattern 4410 and the intermediate pattern 4420 may be disposed on the first interlayer insulating layer ILD1.

The second active pattern 4410 may include an oxide semiconductor. For example, the second active pattern 4410 may overlap the third gate line 4320 and the fourth gate line 4330. In an embodiment, the second active pattern 4410 may be disposed on a different layer from the first active pattern 4100 and may not overlap the first active pattern 4100. In other words, the second active pattern 4410 may be formed separately from the first active pattern 4100.

The intermediate pattern 4420 may be formed together with the second active pattern 4410. For example, the intermediate pattern 4420 may include an oxide semiconductor.

In an embodiment, the intermediate pattern 4420 may be arranged in an island shape and may be provided with the driving voltage ELVDD. In other words, the driving voltage EVLDD may be provided to the intermediate pattern 4420. For example, the intermediate pattern 4420 may include a second exposed portion 4421 exposed by a third contact hole CNT3 and a third exposed portion 4422 exposed through a second contact hole CNT2. The second exposed part 4421 may be adjacent to the first exposed portion 4341 and may be spaced apart from the first exposed portion 4341 on a plane. The intermediate pattern 4420 may contact a first source pattern 4670 in the second exposure portion 4421 and may contact a second source pattern 4690 in the third exposure portion 4422.

The third gate insulating layer GI3 may cover the second active pattern 4400 and may be disposed on the first interlayer insulating layer ILD1. The third gate insulating layer GI3 may include an inorganic insulating material.

Figure 30:
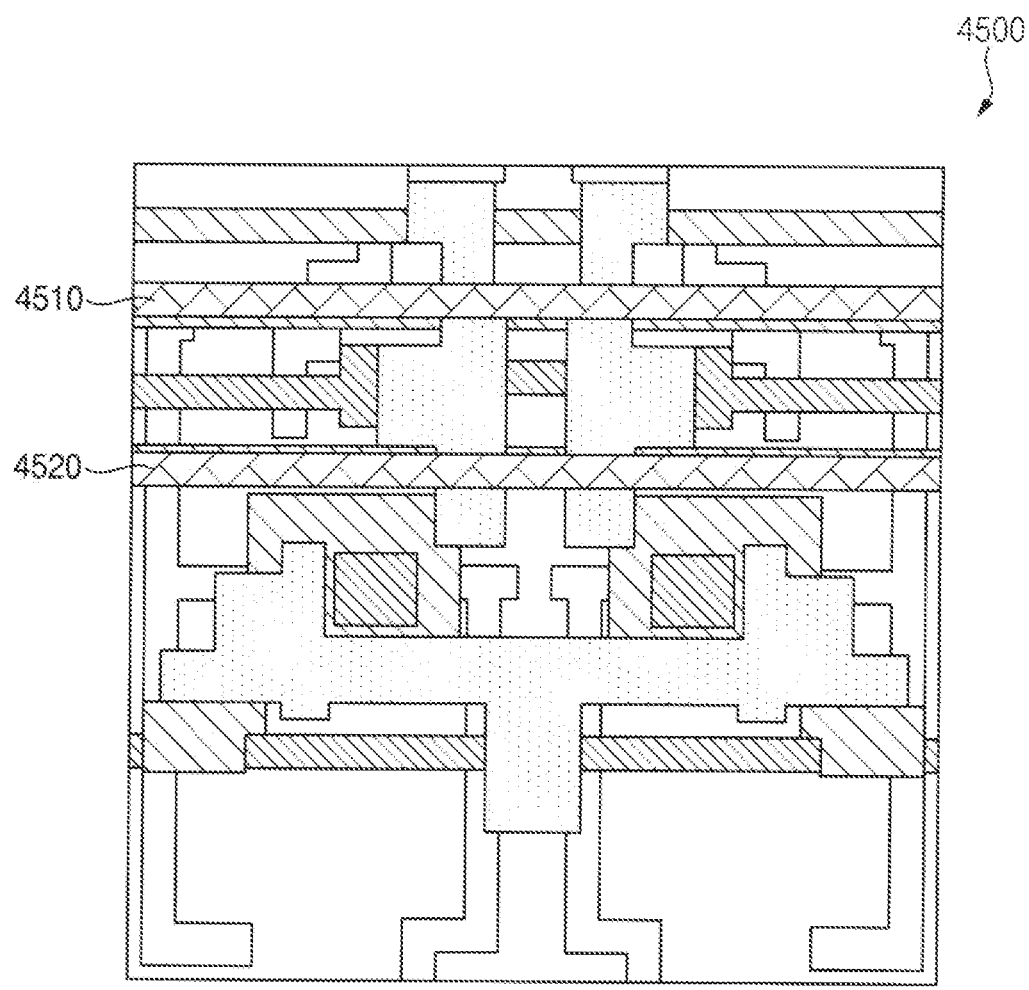

Referring to FIGS. 30 and 33, a third conductive pattern 4500 may be disposed on the third gate insulating layer GI3. The third conductive pattern 4500 may include the fifth gate line 4510 and the sixth gate line 4520. However, the fifth gate line 4510 and the sixth gate line 4520 may be substantially the same as the fifth gate line 3510 and the sixth gate line 3520 described with reference to FIG. 24.

The second interlayer insulating layer ILD2 may cover the third conductive pattern 4500 and may be disposed on the third gate insulating layer GI3. The second interlayer insulating layer ILD2 may include an inorganic insulating material.

Figure 31:
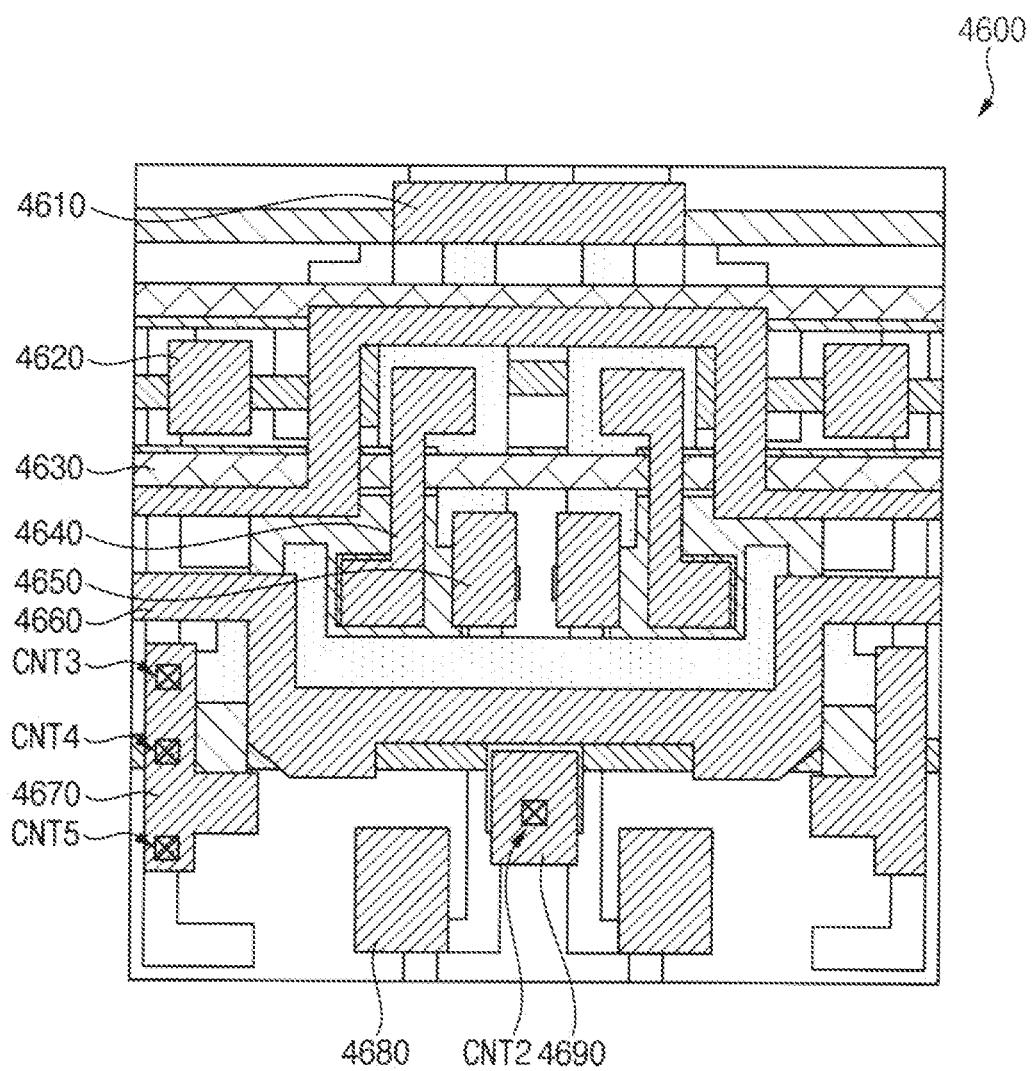
Figure 32:
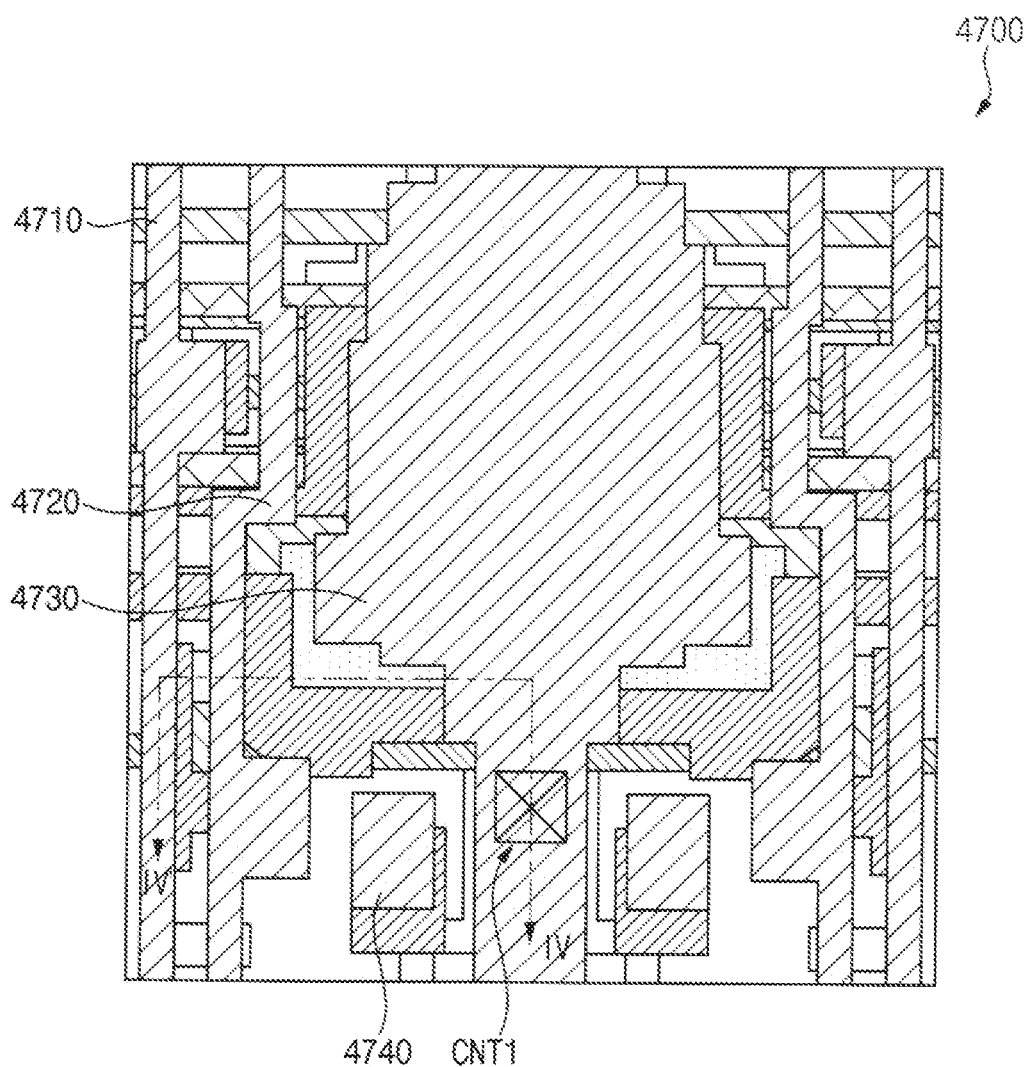

Referring to FIGS. 31 and 33, the fourth conductive pattern 4600 may be disposed on the second interlayer insulating layer ILD2. The fourth conductive pattern 4600 may include the first transfer pattern 4610, the second transfer pattern 4620, the anode initialization voltage line 4630, the node pattern 4640, the third transfer pattern 4650, the first horizontal line 4660, the first source pattern 4670, the fourth transfer pattern 4680, and the second source pattern 4690. However, except for the first source pattern 4670 and the second source pattern 4690, the fourth conductive pattern 4600 may be substantially equal to the fourth conductive pattern 3600.

The first source pattern 4670 may be arranged in an island shape. For example, the first source pattern 4670 may receive the driving voltage ELVDD from the intermediate pattern 4420, and may transfer the driving voltage ELVDD to the first active pattern 4100 and the storage capacitor electrode 4340.

In an embodiment, the first source pattern 4670 may contact the first active pattern 4100, the storage capacitor electrode 4340, and the intermediate pattern 4420. For example, the first source pattern 3670 may contact the first active pattern 4100 through a fifth contact hole CNT5, may contact the storage capacitor electrode 4340 through the fourth contact hole CNT4, and may contact the intermediate pattern 4420 through the third contact hole CNT3. In an embodiment, the third to fifth contact holes CNT3, CNT4, and CNT5 may be spaced apart from each other.

The second source pattern 4690 may be arranged in an island shape. For example, the second source pattern 4690 may receive the driving voltage ELVDD from the third source pattern 4730 and may transfer the driving voltage ELVDD to the intermediate pattern 4420.

In an embodiment, the second source pattern 4690 may contact the intermediate pattern 4420 and the third source pattern 2730. For example, the second source pattern 4690 may contact the third source pattern 4730 through a first contact hole CNT1, and may contact the intermediate pattern 4420 through the second contact hole CNT2.

The first via insulating layer VIA1 may cover the fourth conductive pattern 4600 and may be disposed on the second interlayer insulating layer ILD2. The first via insulating layer VIA1 may include an organic insulating material. The first contact hole CNT1 may be formed through the first via insulating layer VIA1, the second contact hole CNT2 may be formed through the second interlayer insulating layer ILD2 and the third gate insulating layer GI3, the third contact hole CNT3 may be formed through the second interlayer insulating layer ILD2 and the third gate insulating layer GI3, the fourth contact hole CNT4 may be formed through the second interlayer insulating layer ILD2, the third gate insulating layer GI3, and the first interlayer insulating layer ILD1, and the fifth contact hole CNT5 may be formed through the second interlayer insulating layer ILD2, the third gate insulating layer GI3, the first interlayer insulating layer ILD1, the second gate insulating layer GI2, and the first gate insulating layer GI1.

Figure 34:
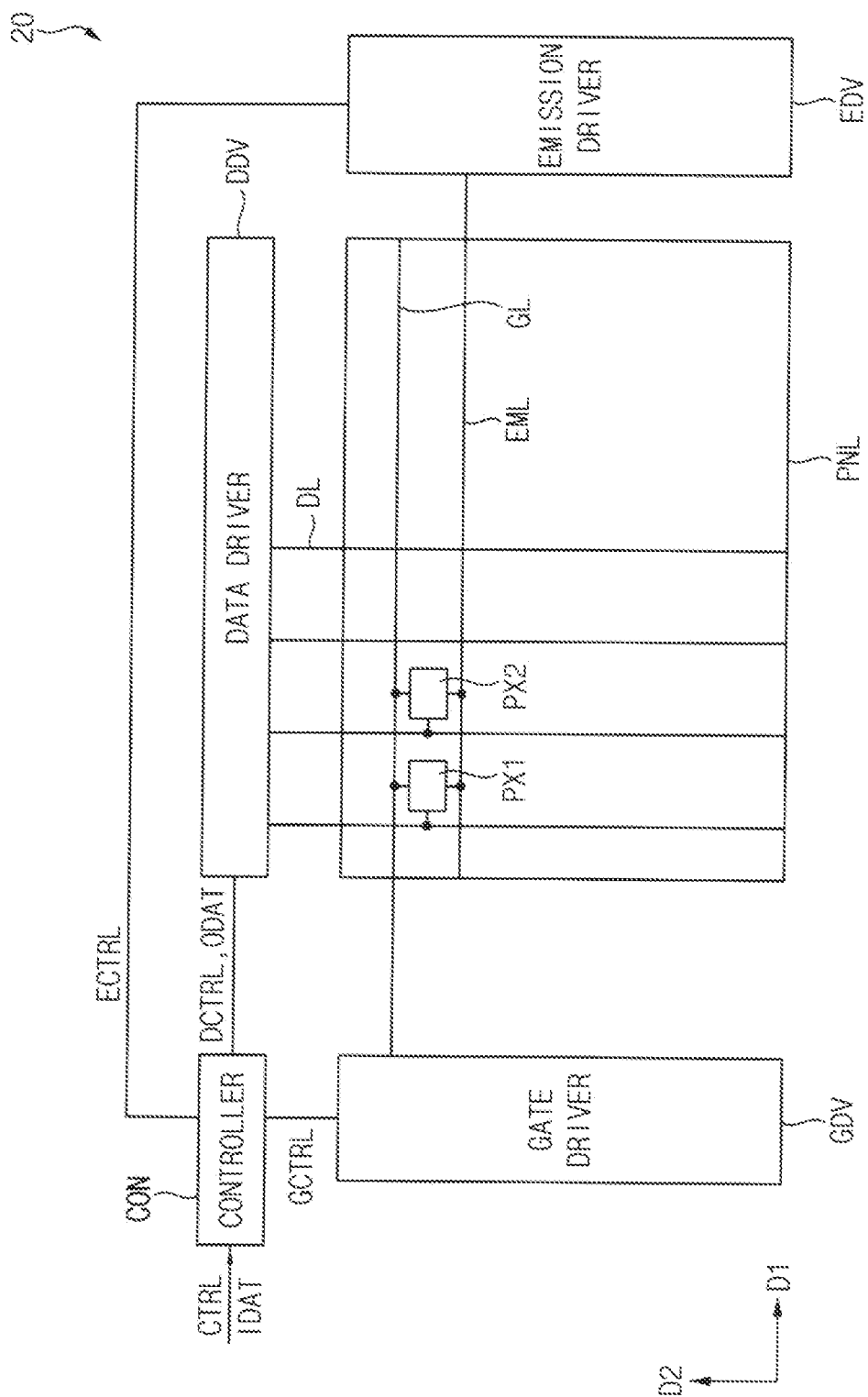
FIG. 34 is a block diagram illustrating a display device according to other embodiments.
Figure 35:
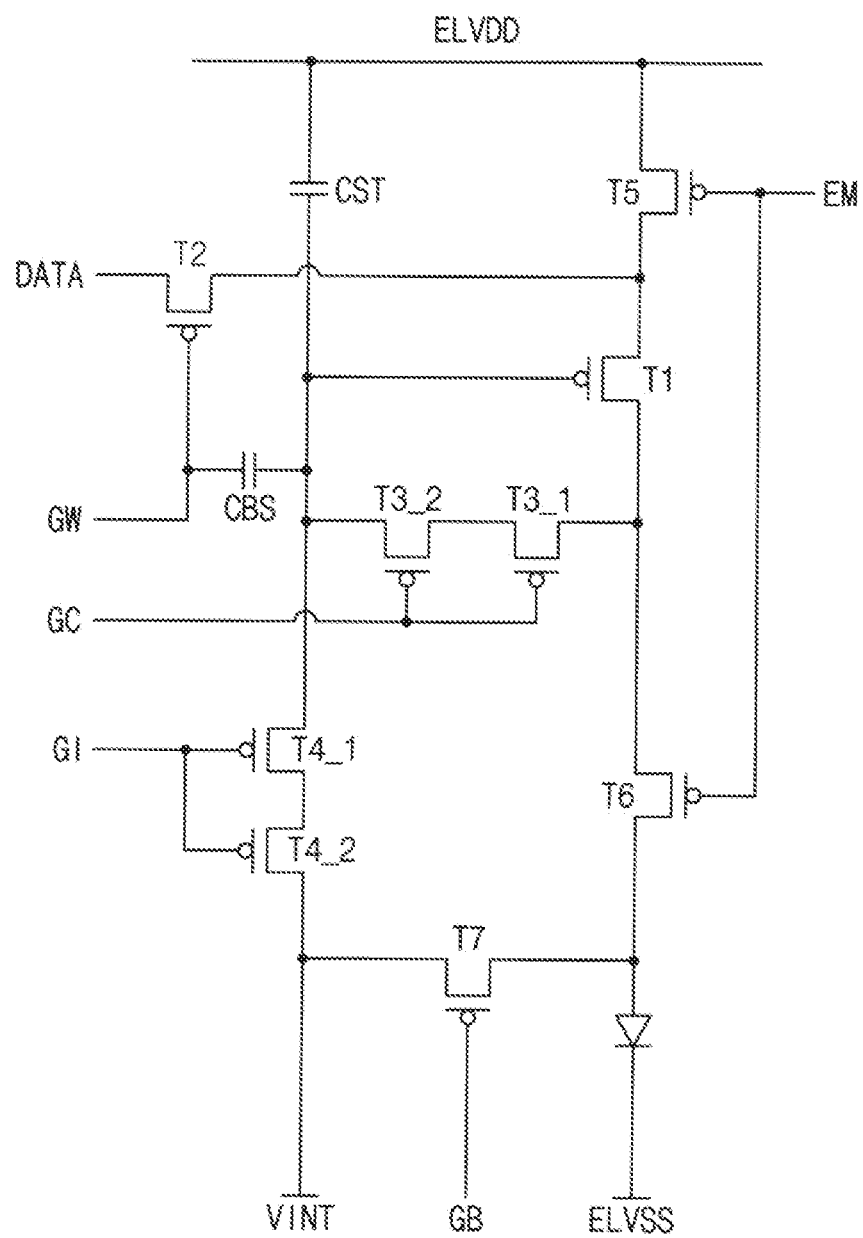
FIG. 35 is an equivalent circuit diagram illustrating of a first pixel included in the display device of FIG. 34.

Referring to FIGS. 34 and 35, a fifth conductive pattern 4700 may be disposed on the first via insulating layer VIA1. The fifth conductive pattern 4700 may include the data line 4710, the first vertical line 4720, the third source pattern 4730, and the fifth transfer pattern 4740. However, the fifth conductive pattern 4700 may be substantially equal to the fifth conductive pattern 3700 described with reference to FIG. 26.

Figure 36:
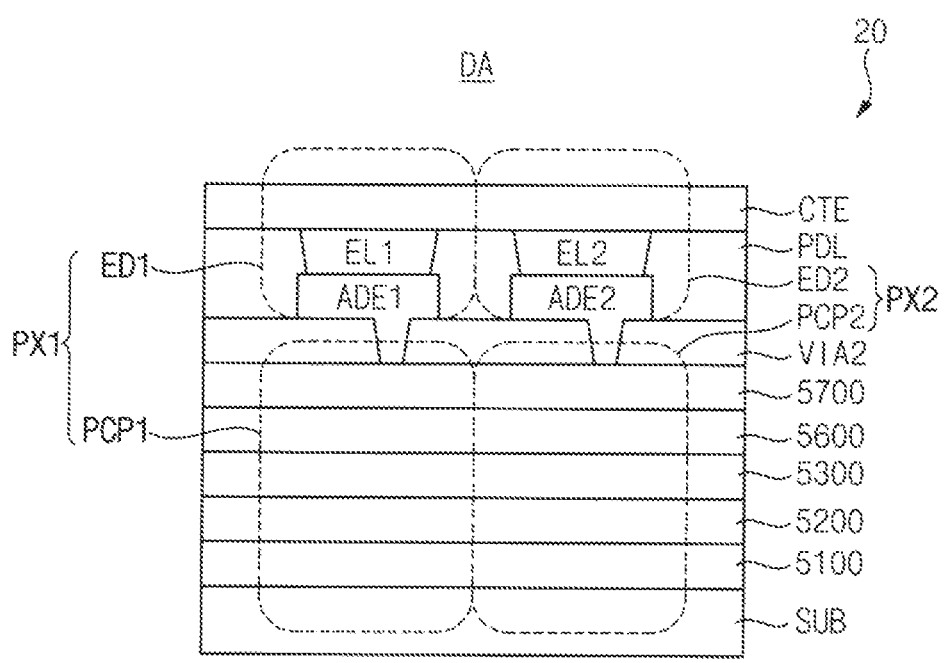
FIG. 36 is a cross-sectional view illustrating the display device of FIG. 34.

FIG. 34 is a block diagram illustrating a display device according to other embodiments. FIG. 35 is an equivalent circuit diagram illustrating of a first pixel included in the display device of FIG. 34. FIG. 36 is a cross-sectional view illustrating the display device of FIG. 34.

Referring to FIGS. 34 and 35, a display device 20 according to other embodiments may include a display panel PNL, a data driver DDV, a gate driver GDV, an emission driver EDV, and a controller CON. However, the display device 20 may be substantially equal to the display device 10 described with reference to FIG. 1 except for the structure of the display panel PNL.

The display panel PNL may include a plurality of pixels. For example, the display panel PNL may include a first pixel PX1 and a second pixel PX2. Each of the first and second pixels PX1 and PX2 may be provided with a data voltage DATA, a gate signal GS, an emission control signal EM, a driving voltage ELVDD, a common voltage ELVSS, and a gate initialization voltage VINT.

The first pixel circuit PC1 may include a first transistor T1, a second transistor T2, a third dual transistor T3-1 and T3-2, a fourth dual transistor T4-1 and T4-2, a fifth transistor T5, a sixth transistor T6, a seventh transistor T7, a storage capacitor CST, and a boosting capacitor CBS. Compared with the first pixel circuit PC1 described with reference to FIG. 2, the first pixel circuit PC1 illustrated in FIG. 35 may include the third dual transistors T3-1 and T3-2 and the fourth dual transistors T4-1 and T4-2, and a second terminal of the seventh transistor T7 may receive a gate initialization voltage VINT.

Referring to FIG. 36, the first pixel circuit part PCP1 and the first display element ED1 may constitute the first pixel PX1. In addition, the second pixel circuit part PCP2 and the second display element ED2 may constitute the second pixel PX2.

The first display element ED1 may include a first pixel electrode ADE1, a first emission layer ELL and a common electrode CTE.

The first pixel circuit part PCP1 may include a substrate SUB, an active pattern 5100, a first conductive pattern 5200, a second conductive pattern 5300, a third conductive pattern 5600, and a fourth conductive pattern 5700. Compared with the first pixel circuit part PCP1 described with reference to FIG. 5, the first pixel circuit part PCP1 illustrated in FIG. 36 may not include the second active pattern 1400 and the third conductive pattern 1500.

FIGS. 37, 38, 39, 40, and 41 are layout diagrams illustrating an embodiment of the display device of FIG. 34. FIG. 42 is a cross-sectional view taken along line V-V' of FIG. 41.

Figure 37:
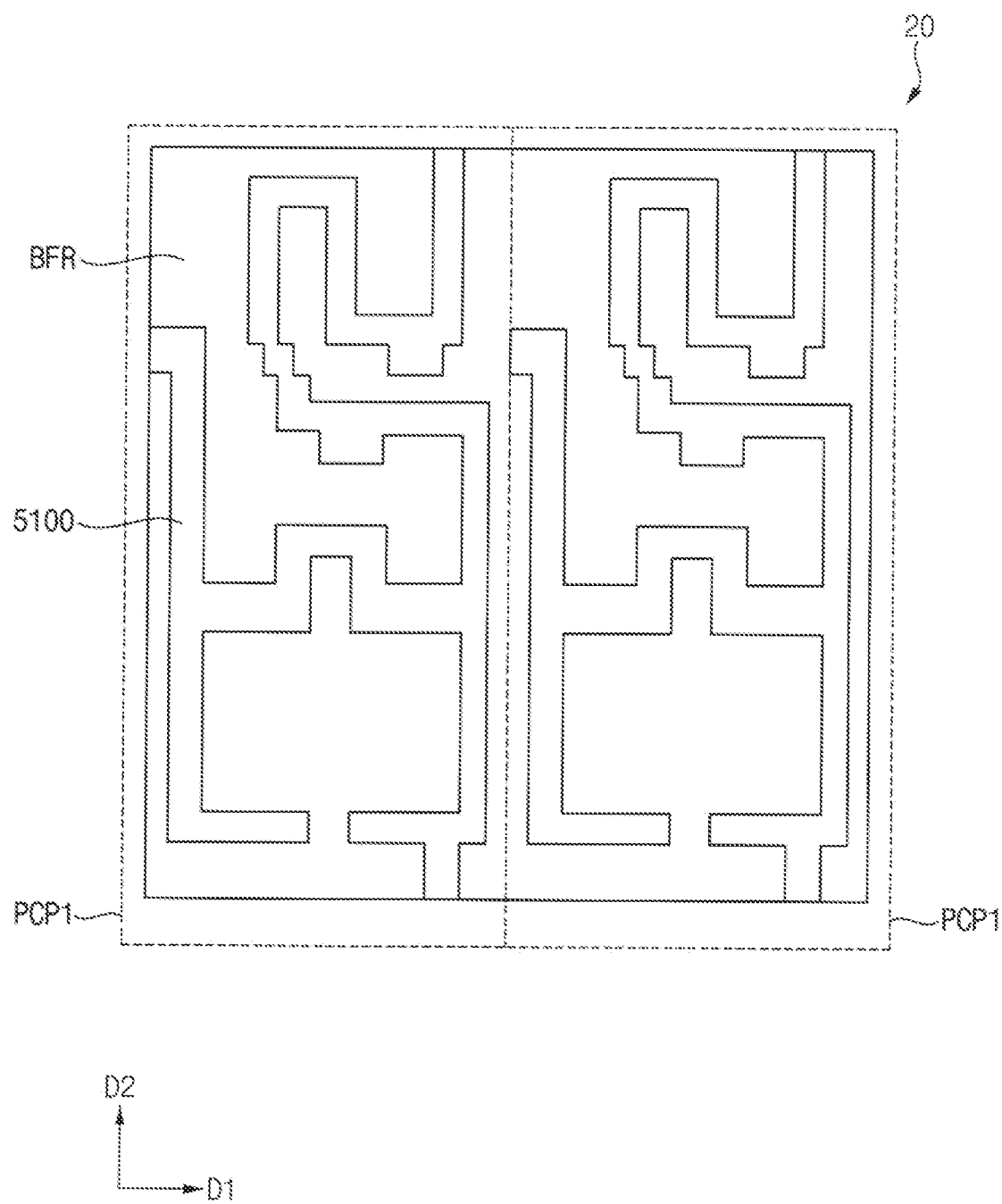
FIGS. 37, 38, 39, 40, and 41 are layout diagrams illustrating an embodiment of the display device of FIG. 34.

Referring to FIGS. 37 and 42, the display device 20 may include the first and second pixel circuit parts PCP1 and PCP2 arranged in the first direction D1. In an embodiment, the second pixel circuit part PCP2 may have the same shape as the first pixel circuit part PCP1. Hereinafter, the structure of the first pixel circuit part PCP1 will be described in detail.

The substrate SUB may include glass, quartz, plastic, or the like, and the buffer layer BFR may be disposed on the substrate SUB.

The active pattern 5100 may be disposed on the buffer layer BFR. In an embodiment, the active pattern 5100 may include a silicon semiconductor. For example, the silicon semiconductor may include amorphous silicon, polycrystalline silicon, or the like. For example, the active pattern 5100 may include the polycrystalline silicon formed by crystallizing the amorphous silicon.

In an embodiment, the active pattern 5100 may be a first pattern receiving the driving voltage ELVDD. In other words, the driving voltage ELVDD may be provided to the first pattern.

The first gate insulating layer GI1 may cover the active pattern 5100 and may be disposed on the substrate SUB. The first gate insulating layer GI1 may include an inorganic insulating material. For example, the first gate insulating layer GI1 may include silicon oxide, silicon nitride, silicon oxynitride, or the like.

Figure 38:
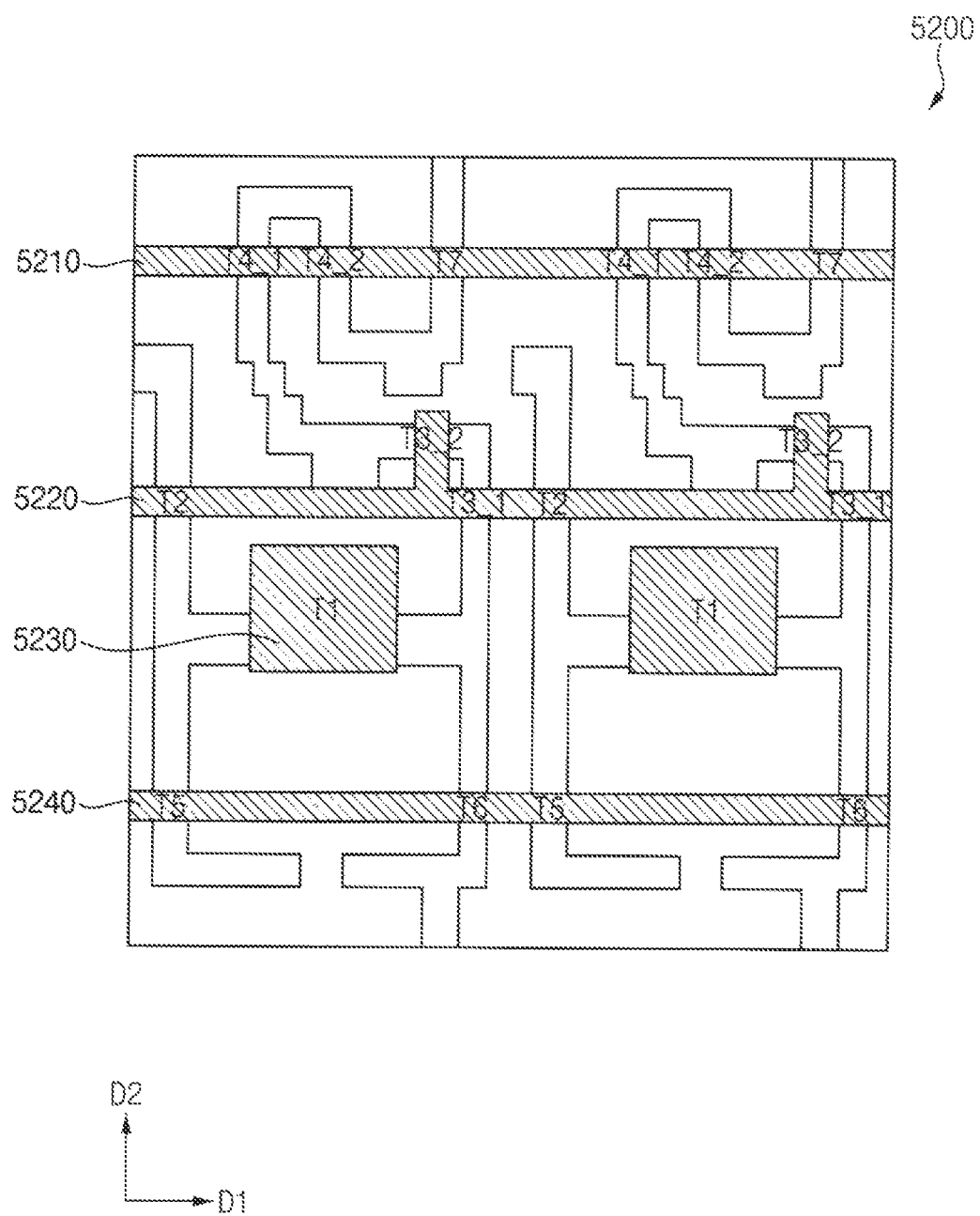

Referring to FIGS. 38 and 42, the first conductive pattern 5200 may be disposed on the first gate insulating layer GI1. The first conductive pattern 5200 may include a first gate line 5210, a second gate line 5220, a gate electrode 5230, and a third gate line 5240.

The first gate line 5210 may extend in the first direction D1. The first gate line 5210 may constitute the fourth dual transistors T4-1 and T4-2 and the seventh transistor T7 together with the first active pattern 5100.

The second gate line 5220 may extend in the first direction D1. The second gate line 5220 may constitute the third dual transistors T3-1 and T3-2 and the second transistor T2 together with the first active pattern 5100.

The gate electrode 5230 may be arranged in an island shape. The gate electrode 5230 may form the first transistor T1 together with the active pattern 5100.

The third gate line 5240 may extend in the first direction D1. The third gate line 1240 may constitute the fifth and sixth transistors T5 and T6 together with the active pattern

5100. For example, the emission control signal EM may be provided to the third gate line 5240. The third gate line 5240 may be referred to as an emission control line.

For example, the first conductive pattern 5200 may include a metal, an alloy, a conductive metal oxide, a transparent conductive material, and the like.

The second gate insulating layer GI2 may cover the first conductive pattern 5200 and may be disposed on the first gate insulating layer GI1. The second gate insulating layer GI2 may include an inorganic insulating material.

Figure 39:
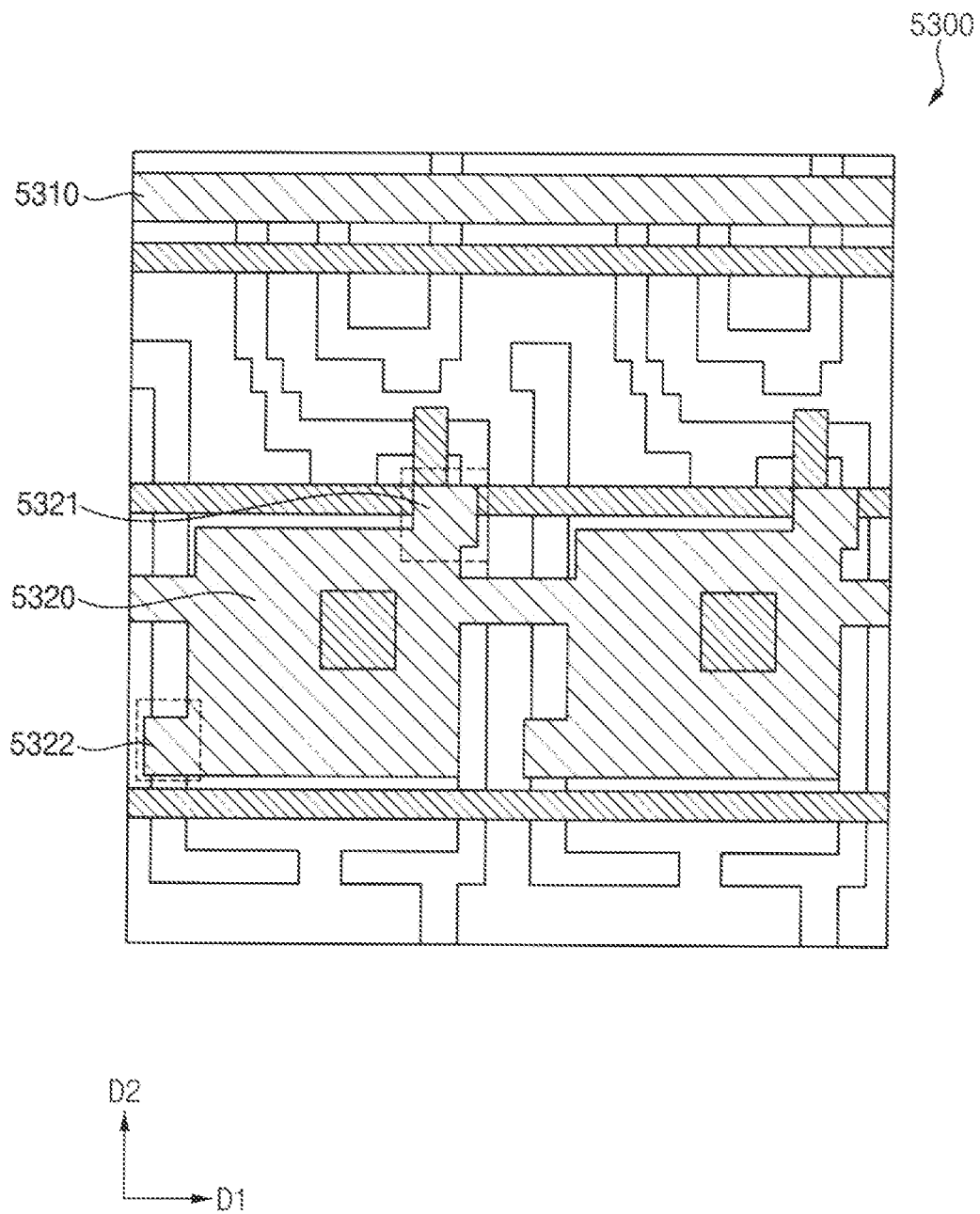

Referring to FIGS. 39 and 42, the second conductive pattern 5300 may be disposed on the second gate insulating layer GI2. The second conductive pattern 5300 may include a gate initialization voltage line 5310 and a storage capacitor electrode 5320.

The gate initialization voltage line 5310 may extend in the first direction D1. For example, the gate initialization voltage line 5310 may be spaced apart from the first gate line 5210 on a plane. The gate initialization voltage VINT may be provided to the gate initialization voltage line 5310.

The storage capacitor electrode 5320 may overlap the first gate electrode 5230 and may extend in the first direction D1. For example, the storage capacitor electrode 5320 may constitute the storage capacitor CST together with the first gate electrode 5230. In addition, a hole through the storage capacitor electrode 5320 may be formed in the storage capacitor electrode 5320, and the first gate electrode 5230 may be exposed through the hole.

In an embodiment, the storage capacitor electrode 5320 may be a second pattern receiving the driving voltage ELVDD. In other words, the driving voltage ELVDD may be provided to the second pattern. For example, the second pattern may include a first exposed portion 5321 exposed by a second contact hole CNT2 and a second exposed portion 5322 exposed by a third contact hole CNT3.

For example, the second conductive pattern 5300 may include a metal, an alloy, a conductive metal oxide, a transparent conductive material, or the like.

The first interlayer insulating layer ILD1 may cover the second conductive pattern 5300 and may be disposed on the second gate insulating layer GI2. The first interlayer insulating layer ILD1 may include an inorganic insulating material.

Figure 40:
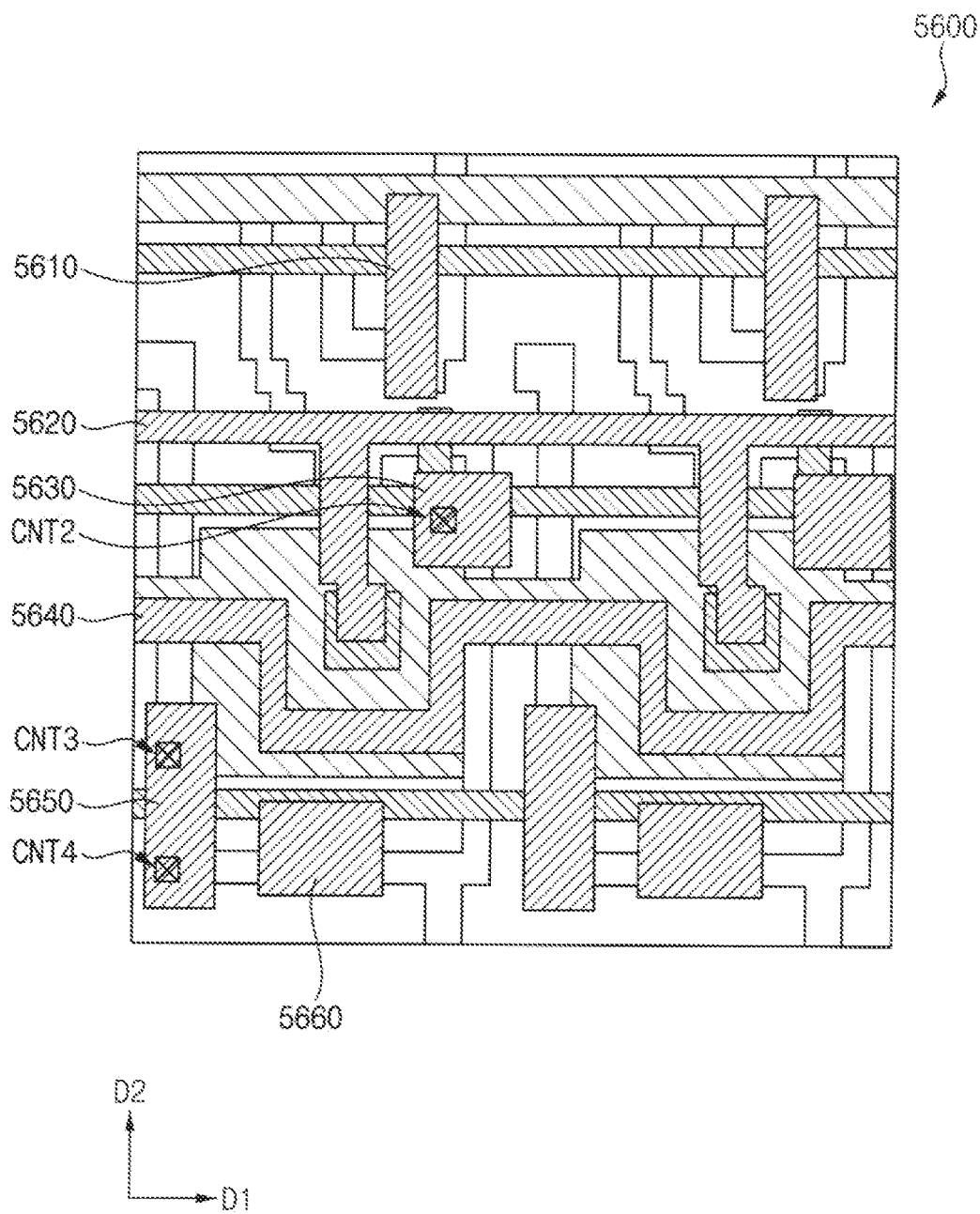

Referring to FIGS. 40 and 42, the third conductive pattern 5600 may be disposed on the first interlayer insulating layer ILD1. The third conductive pattern 5600 may include a first transfer pattern 5610, a node pattern 5620, a second source pattern 5630, a first horizontal line 5640, a first source pattern 5650, and a second transfer pattern 5660.

The first transfer pattern 5610 may be arranged in an island shape. The first transfer pattern 5610 may contact the gate initialization voltage line 5310 and the active pattern 5100, and may transfer the gate initialization voltage VINT to the active pattern 5100.

The node pattern 5620 may extend in the first direction D1. The node pattern 5620 may contact the gate electrode 5230 and the active pattern 5100. For example, the node pattern 5230 may electrically connect the gate terminal of the first transistor T1 and the drain terminal of the third transistor T3.

The second source pattern 5630 may be arranged in an island shape. For example, the second source pattern 5630 may receive the driving voltage ELVDD from the third source pattern 5730 and may transmit the driving voltage ELVDD to the storage capacitor electrode 5320.

In an embodiment, the second source pattern 5630 may contact the storage capacitor electrode 5320 and the third source pattern 5730. For example, the second source pattern 5630 may contact the third source pattern 5730 through a first contact hole CNT1, and may contact the storage capacitor electrode 5320 through the second contact hole CNT2.

The first horizontal line 5640 may extend in the first direction D1. In an embodiment, the data voltage DATA may be transmitted through the first horizontal line 5640. For example, the first horizontal line 5640 may correspond to any one of the first horizontal line HFL1 and the second horizontal line HFL2 described with reference to FIG. 6.

The first source pattern 5650 may be arranged in an island shape. For example, the first source pattern 5650 may receive the driving voltage ELVDD from the storage capacitor electrode 5320 and may transmit the driving voltage ELVDD to the active pattern 5100.

In an embodiment, the first source pattern 5650 may contact the active pattern 5100 and the storage capacitor electrode 5320. For example, the first source pattern 5650 may contact the active pattern 5100 through a fourth contact hole CNT4, and may contact the storage capacitor electrode 5320 through the third contact hole CNT3. In an embodiment, the third and fourth contact holes CNT3 and CNT4 may be spaced apart from each other.

The second transfer pattern 5660 may be arranged in an island shape. The second transfer pattern 5660 may contact the active pattern 5100. The second transfer pattern 5660 may receive the driving current and/or the gate initialization voltage VINT from the active pattern 5100.

The first via insulating layer VIA1 may cover the third conductive pattern 5600 and may be disposed on the first interlayer insulating layer ILD1. The first via insulating layer VIA1 may include an organic insulating material.

Figure 41:
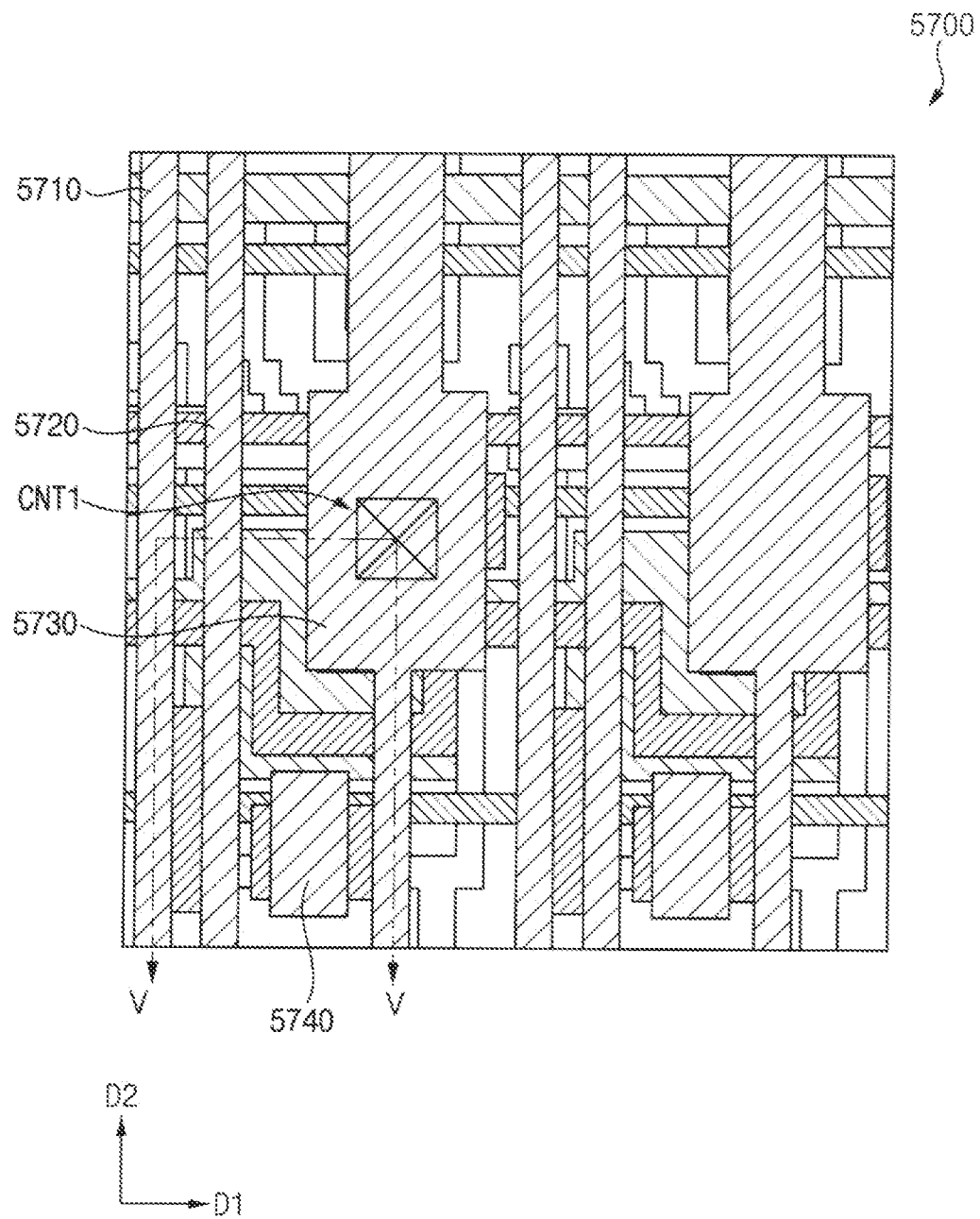
Figure 42:
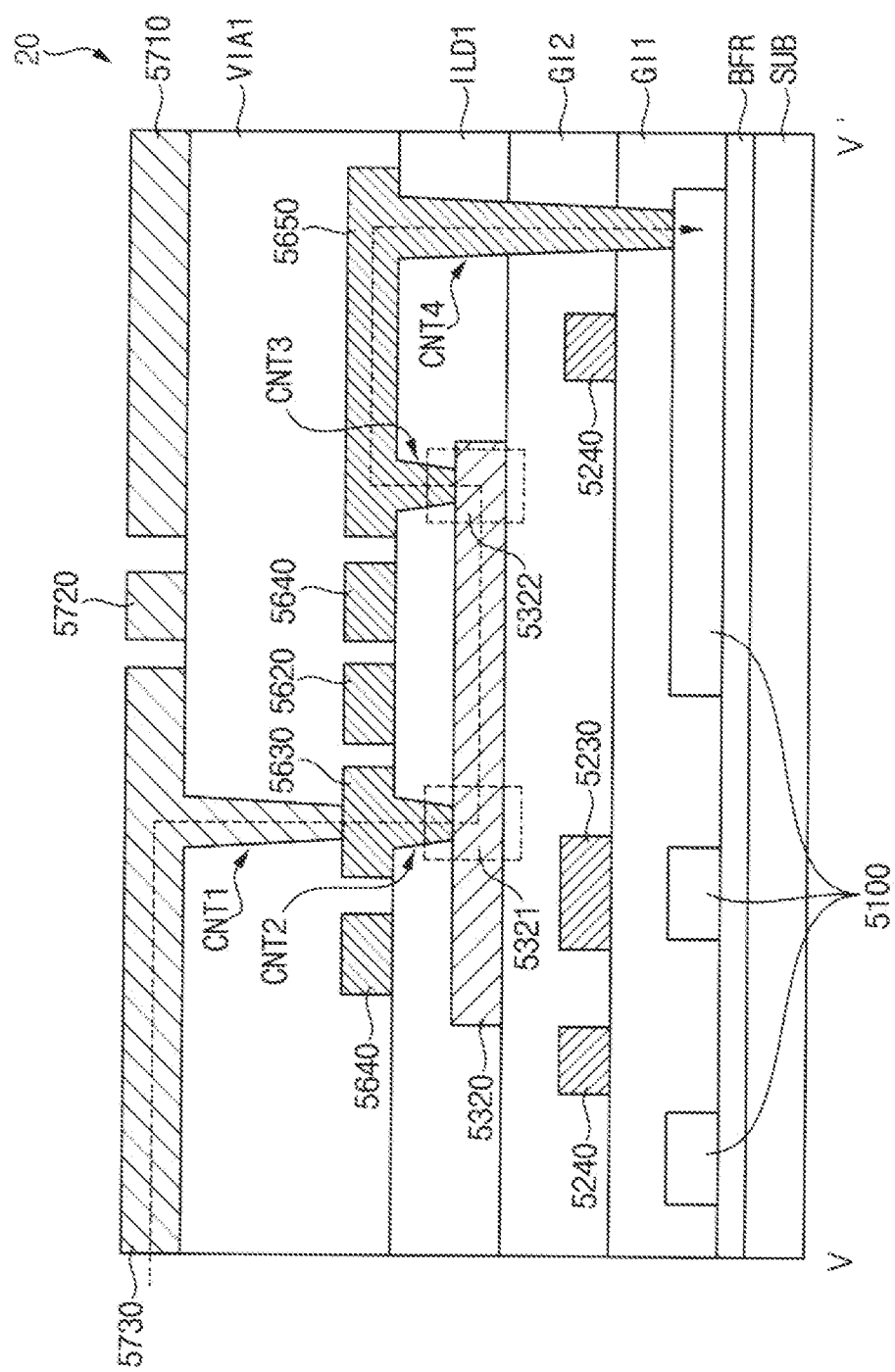
FIG. 42 is a cross-sectional view taken along line V-V' of FIG. 41.

Referring to FIGS. 41 and 42, a fourth conductive pattern 5700 may be disposed on the first via insulating layer VIA1. The fourth conductive pattern 5700 may include a data line 5710, a first vertical line 5720, a third source pattern 5730, and a third transfer pattern 5740.

The data line 5710 may extend in the second direction D2. The data line 5710 may contact the active pattern 5100. In an embodiment, the data voltage DATA may be provided to the active pattern 5100 through the data line 5710. For example, the data line 5710 may correspond to any one of the first to fourth data lines DL1, DL2, DL3, and DL4 described with reference to FIG. 6.

The first vertical line 5720 may extend in the second direction D2. In an embodiment, the data voltage DATA may be transmitted through the first vertical line 5720. For example, the first vertical line 5720 may correspond to one of the first vertical line VFL1 and the second vertical line VFL2 described with reference to FIG. 6.

The third source pattern 5730 may extend in the second direction D2. In an embodiment, the driving voltage ELVDD may be transmitted through the third source pattern 5730.

In an embodiment, the third source pattern 5730 may contact the second source pattern 5630 through a first contact hole CNT1.

In an embodiment, the first contact hole CNT1 may pass through the first via insulating layer VIA1, a second contact hole CNT2 and the third contact hole CNT3 may pass through the first interlayer insulation ILD1, and the fourth contact hole CNT4 may pass through the first interlayer insulating layer ILD1, the second gate insulating layer GI2, and the first gate insulating layer GI1. In other words, the first contact hole CNT1 may pass through a layer made of an organic insulating material, and the second, third, and fourth contact holes CNT2, CNT3, and CNT4 may pass through a layer made of an inorganic insulating material. Accordingly, each of the planar areas of the second, third, and fourth contact holes CNT2, CNT3, and CNT4 may be smaller than the planar area of the first contact hole CNT1. The first contact hole CNT1 may be formed through the first via insulating layer VIA1, the second contact hole CNT2 may be formed through the first interlayer insulating layer ILD1, the third contact hole CNT3 may be formed through the first interlayer insulating layer ILD1, and the fourth contact hole CNT4 may be formed through the first interlayer insulating layer ILD1, the second gate insulating layer GI2, and the first gate insulating layer GI1.

The third transfer pattern 5740 may be arranged in an island shape. The third transfer pattern 5740 may contact the second transfer pattern 5660. The third transfer pattern 5740 may receive the driving current and/or the gate initialization voltage VINT from the second transfer pattern 5660, and may transfer the driving current and/or the gate initialization voltage VINT to the first pixel electrode ADE1.

In an embodiment, as shown in FIG. 41, the third source pattern 5730 may contact the second source pattern 5630 through the first contact hole CNT1, the second source pattern 5630 may contact the storage capacitor electrode 5320 through the second contact hole CNT2, and the storage capacitor electrode 5320 may provide the first source pattern 5650 through the third contact hole CNT3. Accordingly, the driving voltage ELVDD may be transmitted to the third source pattern 5730, the second source pattern 5630, the storage capacitor electrode 5320, and the first source pattern 5650. In addition, the first source pattern 5650 may contact the active pattern 5100 through the fourth contact hole CNT4. Accordingly, the first source pattern 5650 may transfer the driving voltage ELVDD to the active pattern 5100.

The display device 20 may include the first source pattern 5650 and the storage capacitor electrode 5320 for transmitting the driving voltage ELVDD. Accordingly, additional contact holes for electrically connecting the third source pattern 5730 to the first active pattern 5100 and the storage capacitor electrode 5320 may not be added in the first via insulating layer VIA1. In other words, the driving voltage ELVDD may be transferred to the first active pattern 5100 and the storage capacitor electrode 5320 through the first contact hole CNT1 formed in the first via insulating layer VIA1. Accordingly, the number of contact holes passing through the layer made of the organic insulating material may be relatively small. Therefore, the shape of the third source pattern 5730 may be designed relatively freely.

Although certain embodiments and implementations have been described herein, other embodiments and modifications will be apparent from this description. Accordingly, the present disclosure are not limited to such embodiments, but rather to the broader scope of the appended claims and various obvious modifications and equivalent arrangements as would be apparent to a person of ordinary skill in the art.

What is claimed is:

1. A display device comprising:
    a first pattern disposed on a substrate and configured to receive a driving voltage;
    a second pattern disposed on the first pattern and configured to receive the driving voltage;
    an intermediate pattern disposed on the first pattern and configured to receive the driving voltage;
    a first source pattern disposed on the intermediate pattern and in direct contact with the first pattern, the second pattern, and the intermediate pattern;
    a second source pattern disposed in a same layer as the first source pattern and in direct contact with the intermediate pattern; and
    a third source pattern disposed on the second source pattern and in direct contact with the second source pattern.

2. The display device of claim 1, further comprising:
    an insulating layer disposed between the second source pattern and the third source pattern and formed of an organic insulating material.

3. The display device of claim 1, wherein each of the first source pattern and the second source pattern is arranged in an island shape.

4. The display device of claim 1, wherein the intermediate pattern is arranged in an island shape.

5. The display device of claim 1, further comprising:
    a second active pattern disposed on the second pattern and including an oxide semiconductor,
    wherein the first pattern is a first active pattern including a silicon semiconductor, and
    the intermediate pattern is disposed between the second active pattern and the first source pattern.

6. The display device of claim 5, wherein the third source pattern contacts the second source pattern through a first contact hole,
    the second source pattern contacts the intermediate pattern through a second contact hole,
    the first source pattern contacts the intermediate pattern through a third contact hole, contacts the second pattern through a fourth contact hole, and contacts the first pattern through a fifth contact hole, and
    the third, fourth, and fifth contact holes are spaced apart from each other.

7. The display device of claim 6, wherein each of plane areas of the second, third, fourth, and fifth contact holes is smaller than a plane area of the first contact hole.

8. The display device of claim 5, further comprising:
    a gate electrode disposed between the first pattern and the second pattern and arranged in an island shape; and
    a node pattern disposed in a same layer as the second source pattern and in direct contact with the gate electrode and the second active pattern,
    wherein the intermediate pattern is disposed to surround at least a portion of the node pattern on a plane.

9. The display device of claim 1, further comprising:
    a first gate line disposed between the first pattern and the intermediate pattern; and
    a second active pattern disposed on the intermediate pattern and including an oxide semiconductor,
    wherein the first pattern is a first active pattern including a silicon semiconductor, and
    the second pattern is disposed on the second active pattern.

10. The display device of claim 9, wherein the third source pattern contacts the second source pattern through a first contact hole,
    so the second source pattern contacts the intermediate pattern through a second contact hole,
    the first source pattern contacts the second pattern through a third contact hole, contacts the intermediate pattern through a fourth contact hole, and contacts the first pattern through a fifth contact hole, and
    the third, fourth, and fifth contact holes are spaced apart from each other.

11. The display device of claim 10, wherein each of plane areas of the second, third, fourth, and fifth contact holes is smaller than a plane area of the first contact hole.

12. The display device of claim 9, further comprising:
    a gate electrode disposed in a same layer as the first gate line and arranged in an island shape; and a node pattern disposed in a same layer as the second source pattern and in direct contact with the gate electrode and the second active pattern, wherein the second pattern is disposed to be adjacent to the node pattern.

13. The display device of claim 1, further comprising:
a first gate line disposed between the first pattern and the intermediate pattern; and
a second active pattern disposed on the intermediate pattern and including an oxide semiconductor,
wherein the first pattern is a first active pattern including a silicon semiconductor, and
the second pattern is disposed in a same layer as the second active pattern.

14. The display device of claim 13, wherein the third source pattern contacts the second source pattern through a first contact hole,
the second source pattern contacts the intermediate pattern through a second contact hole,
the first source pattern contacts the second pattern through a third contact hole, contacts the intermediate pattern through a fourth contact hole, and contacts the first pattern through a fifth contact hole, and
the third, fourth, and fifth contact holes are spaced apart from each other.

15. The display device of claim 13, further comprising:
a gate electrode disposed in a same layer as the first gate line and arranged in an island shape; and
a node pattern disposed in a same layer as the second source pattern and contacting the so gate electrode and the second active pattern,
wherein the second pattern is disposed to be adjacent to the node pattern.

16. The display device of claim 1, further comprising:
a first gate line disposed between the first pattern and the second pattern; and
a second active pattern disposed on the second pattern and including an oxide semiconductor, wherein the first pattern is a first active pattern including a silicon semiconductor, and
the intermediate pattern is disposed in a same layer as the second active pattern.

17. The display device of claim 16, wherein the third source pattern contacts the second source pattern through a first contact hole,
the second source pattern contacts the intermediate pattern through a second contact hole,
the first source pattern contacts the intermediate pattern through a third contact hole, contacts the second pattern through a fourth contact hole, and contacts the first pattern through a fifth contact hole, and
the third, fourth, and fifth contact holes are spaced apart from each other.

18. The display device of claim 1, wherein the driving voltage is transferred in an order of the third source pattern, the second source pattern, the intermediate pattern, and the first source pattern, and
the first source pattern transfers the driving voltage to the first pattern and the second pattern.

19. A display device comprising: an active pattern disposed on a substrate and configured to receive a driving voltage; a storage capacitor electrode disposed on the active pattern and configured to receive the driving voltage; a first source pattern disposed on the storage capacitor electrode and in direct contact with the active pattern and the storage capacitor electrode; a second source pattern disposed in a same layer as the first source pattern and in direct contact with the storage capacitor electrode; and a third source pattern disposed on the second source pattern and in direct contact with the second source pattern.

20. The display device of claim 19, wherein the driving voltage is transferred in an order of the third source pattern, the second source pattern, the storage capacitor electrode, and the first source pattern, and
the first source pattern transfers the driving voltage to the active pattern.

* * * * *